United States Patent
Fujimura et al.

(10) Patent No.: US 12,004,347 B2
(45) Date of Patent: Jun. 4, 2024

(54) THREE-DIMENSIONAL MEMORY DEVICE INCLUDING SELF-ALIGNED DRAIN-SELECT-LEVEL ISOLATION STRUCTURES AND METHOD OF MAKING THEREOF

(71) Applicant: SANDISK TECHNOLOGIES LLC, Addison, TX (US)

(72) Inventors: Nobuyuki Fujimura, Yokkaichi (JP); Satoshi Shimizu, Yokkaichi (JP); Takumi Moriyama, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 267 days.

(21) Appl. No.: 17/237,476

(22) Filed: Apr. 22, 2021

(65) Prior Publication Data

US 2022/0344365 A1    Oct. 27, 2022

(51) Int. Cl.
*H10B 43/27*  (2023.01)
*H10B 41/10*  (2023.01)
*H10B 41/27*  (2023.01)
*H10B 41/35*  (2023.01)
*H10B 43/10*  (2023.01)
*H10B 43/35*  (2023.01)

(52) U.S. Cl.
CPC ............ *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ................................ H10B 43/27; H10B 43/20
See application file for complete search history.

(56) References Cited

U.S. PATENT DOCUMENTS

| | | | |
|---|---|---|---|
| 9,922,987 B1 | 3/2018 | Mizutani et al. |
| 9,972,641 B1 | 5/2018 | Zhang et al. |
| 10,050,054 B2 | 8/2018 | Zhang et al. |
| 10,083,982 B2 | 9/2018 | Shigemura et al. |
| 10,192,878 B1 | 1/2019 | Tsutsumi et al. |
| 10,236,300 B2 | 3/2019 | Zhang et al. |
| 10,290,643 B1 | 5/2019 | Kai et al. |

(Continued)

OTHER PUBLICATIONS

ISR—Notification of Transmittal of the International Search Report and Written Opinion of the International Searching Authority for International Patent Application No. PCT/US2022/012826, dated Apr. 12, 2022, 12 pages.

(Continued)

*Primary Examiner* — Christopher A Johnson
(74) *Attorney, Agent, or Firm* — THE MARBURY LAW GROUP PLLC

(57) ABSTRACT

An alternating stack of insulating layers and spacer material layers is formed over a substrate. A plurality of arrays of memory opening fill structures is formed through the alternating stack. A plurality of dielectric plates is formed, which laterally surrounds a respective array of memory opening fill structures. Self-aligned drain-select-level isolation structures are formed between a respective neighboring pair of arrays of memory opening fill structures through gaps between neighboring pairs of the dielectric plates into a subset of layers within the alternating stack. Drain side select gate electrodes are provided from a divided subset of the spacer material layers.

9 Claims, 49 Drawing Sheets

(56) References Cited

U.S. PATENT DOCUMENTS

| | | |
|---|---|---|
| 10,290,650 B1 | 5/2019 | Iwai |
| 10,297,610 B2 | 5/2019 | Kai et al. |
| 10,347,647 B1 | 7/2019 | Hosoda et al. |
| 10,373,969 B2 | 8/2019 | Zhang et al. |
| 10,381,450 B1 | 8/2019 | Yada et al. |
| 10,403,639 B2 | 9/2019 | Orimoto et al. |
| 10,475,804 B1 | 11/2019 | Nishikawa et al. |
| 10,490,564 B2 | 11/2019 | Mushiga et al. |
| 10,553,599 B1 | 2/2020 | Chen et al. |
| 10,586,803 B2 | 3/2020 | Mushiga et al. |
| 10,600,800 B2 | 3/2020 | Nishikawa et al. |
| 10,685,979 B1 | 6/2020 | Lu et al. |
| 10,707,233 B1 | 7/2020 | Cui et al. |
| 10,741,576 B2 | 8/2020 | Nishikawa et al. |
| 10,748,927 B1 | 8/2020 | Tsutsumi et al. |
| 10,756,110 B1 | 8/2020 | Sharangpani et al. |
| 10,777,575 B1 | 9/2020 | Cui et al. |
| 10,818,542 B2 | 10/2020 | Cui et al. |
| 10,937,800 B2 | 3/2021 | Kim et al. |
| 2018/0097009 A1 | 4/2018 | Zhang et al. |
| 2018/0138194 A1 | 5/2018 | Shigemura et al. |
| 2019/0027488 A1 | 1/2019 | Kai et al. |
| 2019/0027489 A1 | 1/2019 | Orimoto et al. |
| 2019/0035803 A1 | 1/2019 | Zhang et al. |
| 2019/0198515 A1 | 6/2019 | Hosoda et al. |
| 2019/0214395 A1 | 7/2019 | Zhang et al. |
| 2019/0267391 A1 | 8/2019 | Imai et al. |
| 2019/0267461 A1 | 8/2019 | Yada et al. |
| 2019/0326306 A1 | 10/2019 | Mushiga et al. |
| 2019/0326307 A1 | 10/2019 | Mushiga et al. |
| 2020/0006358 A1 | 1/2020 | Nishikawa et al. |
| 2020/0051995 A1 | 2/2020 | Tanaka et al. |
| 2020/0058673 A1 | 2/2020 | Nishikawa et al. |
| 2020/0303397 A1 | 9/2020 | Cui et al. |
| 2020/0312875 A1* | 10/2020 | Cui .................. H01L 21/76877 |

OTHER PUBLICATIONS

Endoh et al., "Novel Ultra High Density Memory with a Stacked-Surrounding Gate Transistor (S-SGT) Structured Cell," IEDM Proc. (2001) pp. 33-36.

U.S. Appl. No. 16/828,129, filed Mar. 24, 2020, SanDisk Technologies LLC.

U.S. Appl. No. 16/868,821, filed May 7, 2020, SanDisk Technologies LLC.

U.S. Appl. No. 17/031,080, filed Sep. 24, 2020, SanDisk Technologies LLC.

U.S. Appl. No. 17/126,504, filed Dec. 18, 2020, SanDisk Technologies LLC.

U.S. Appl. No. 17/158,395, filed Jan. 26, 2021, SanDisk Technologies LLC.

* cited by examiner

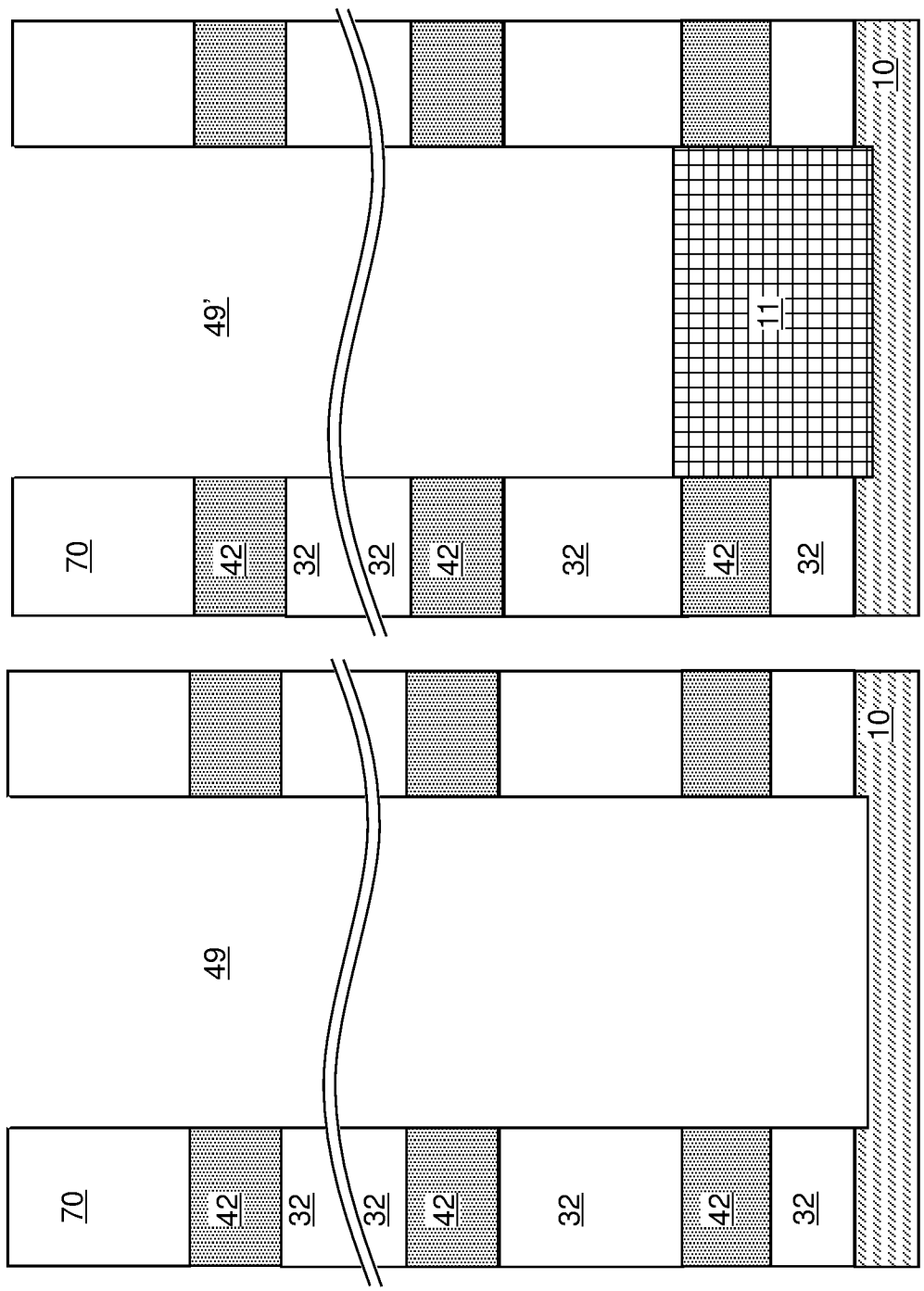

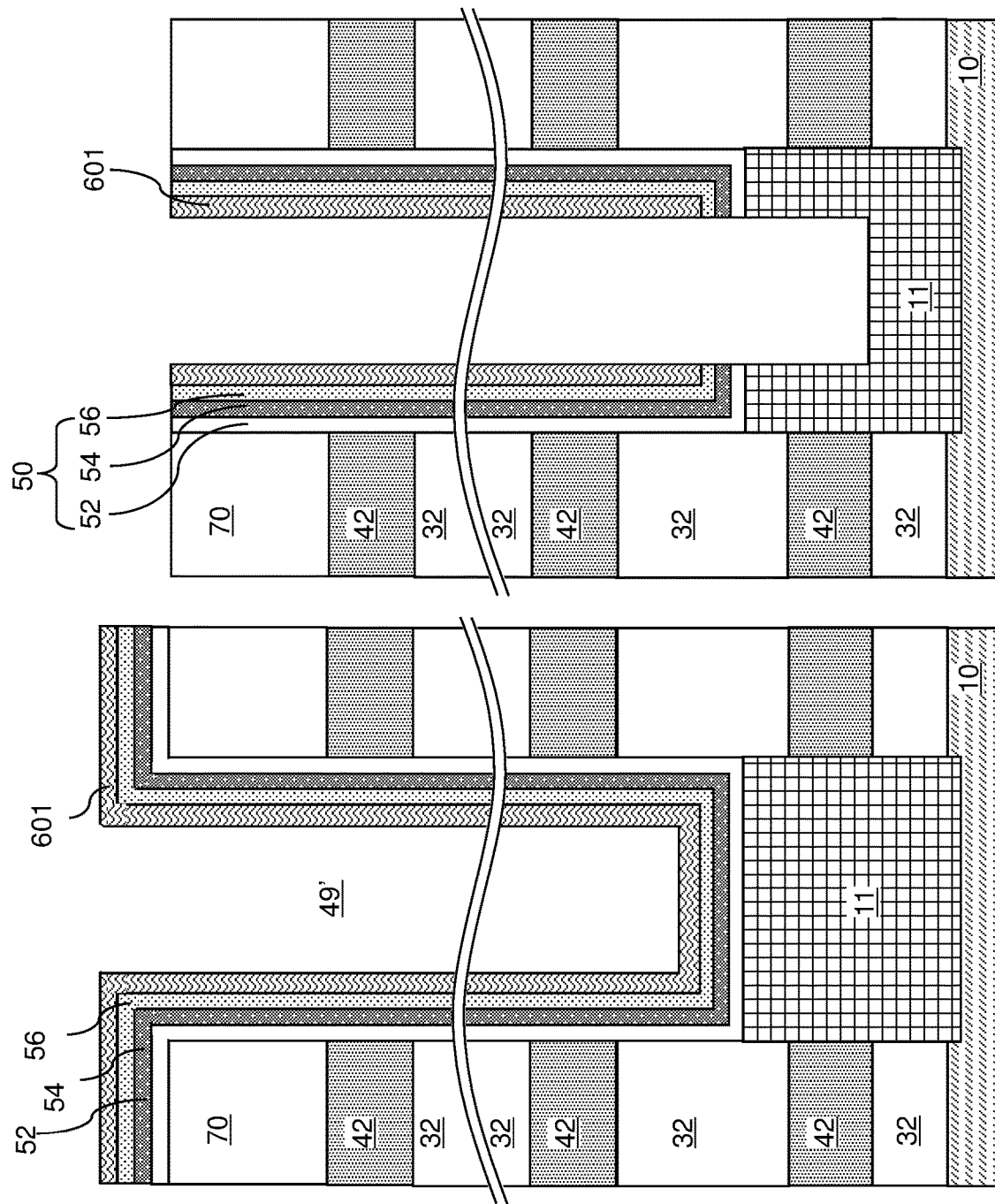

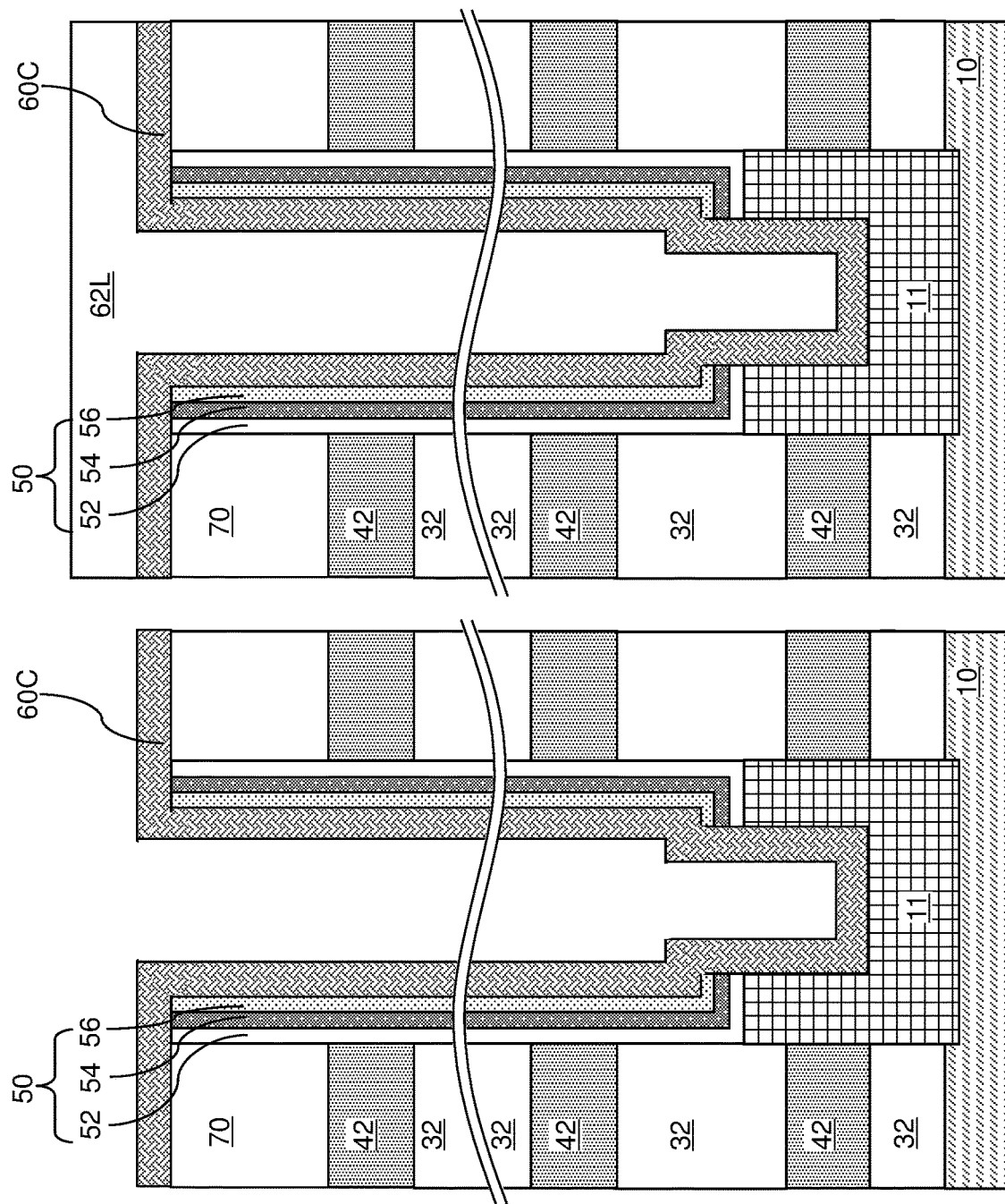

THREE-DIMENSIONAL MEMORY DEVICE INCLUDING SELF-ALIGNED DRAIN-SELECT-LEVEL ISOLATION STRUCTURES AND METHOD OF MAKING THEREOF

FIELD

The present disclosure relates generally to the field of semiconductor devices, and particularly to a three-dimensional memory device including self-aligned drain-select-level isolation structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers; a plurality of arrays of memory openings vertically extending through the alternating stack; a plurality of arrays of memory opening fill structures located in the plurality of arrays of memory openings, wherein each of the memory opening fill structures comprises a respective vertical stack of memory elements, and each array of memory opening fill structures comprises a respective set of rows of memory opening fill structures that are arranged along a first horizontal direction, and the plurality of arrays of memory opening fill structures are laterally spaced apart from each other along a second horizontal direction; a plurality of dielectric plates laterally surrounding a respective array of memory opening fill structures, wherein each of the plurality of dielectric plates has an outer sidewall that is laterally spaced from a most proximal memory opening fill structure within a respective array of memory opening fill structures by a lateral offset distance; and drain-select-level isolation structures located between a respective neighboring pair of arrays of memory opening fill structures.

According to another aspect of the present disclosure, a method of forming a three-dimensional memory device is provided, which comprises: forming an alternating stack of insulating layers and spacer material layers over a substrate, wherein the spacer material layers are formed as, or are subsequently replaced with, electrically conductive layers; forming a plurality of arrays of memory openings through the alternating stack; forming a plurality of arrays of memory opening fill structures in the plurality of arrays of memory openings, wherein each of the memory opening fill structures comprises a respective vertical stack of memory elements, and each array of memory opening fill structures comprises a respective set of rows of memory opening fill structures that are arranged along a first horizontal direction, and the plurality of arrays of memory opening fill structures is laterally spaced apart from each other along a second horizontal direction; forming a plurality of dielectric plates laterally surrounding a respective array of memory opening fill structures, wherein each of the plurality of dielectric plates has an outer sidewall that is laterally spaced from a most proximal memory opening fill structure within a respective array of memory opening fill structures by a uniform lateral offset distance; and forming drain-select-level isolation structures between a respective neighboring pair of arrays of memory opening fill structures through gaps between neighboring pairs of the dielectric plates into a subset of layers within the alternating stack, wherein each of the drain-select-level isolation structures comprises a respective pair of lengthwise sidewalls that are vertically coincident with a subset of sidewall segments of a respective neighboring pair of dielectric plates of the plurality of dielectric plates.

BRIEF DESCRIPTION OF THE DRAWINGS

FIGS. 5A-5K are sequential schematic vertical cross-sectional views of a memory opening within the first exemplary structure during formation of a memory opening fill structure therein according to the first embodiment of the present disclosure.

DETAILED DESCRIPTION

Figure 1:
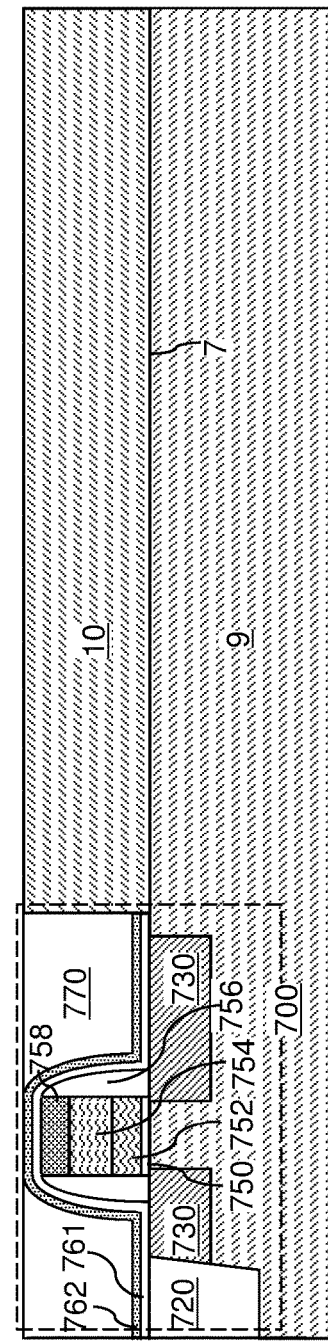
FIG. 1 is a schematic vertical cross-sectional view of a first exemplary structure after formation of at least one peripheral device, a semiconductor material layer, and a gate dielectric layer according to a first embodiment of the present disclosure.

As discussed above, the embodiments of the present disclosure are directed a three-dimensional memory device including self-aligned drain-select-level isolation structures and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to the first embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
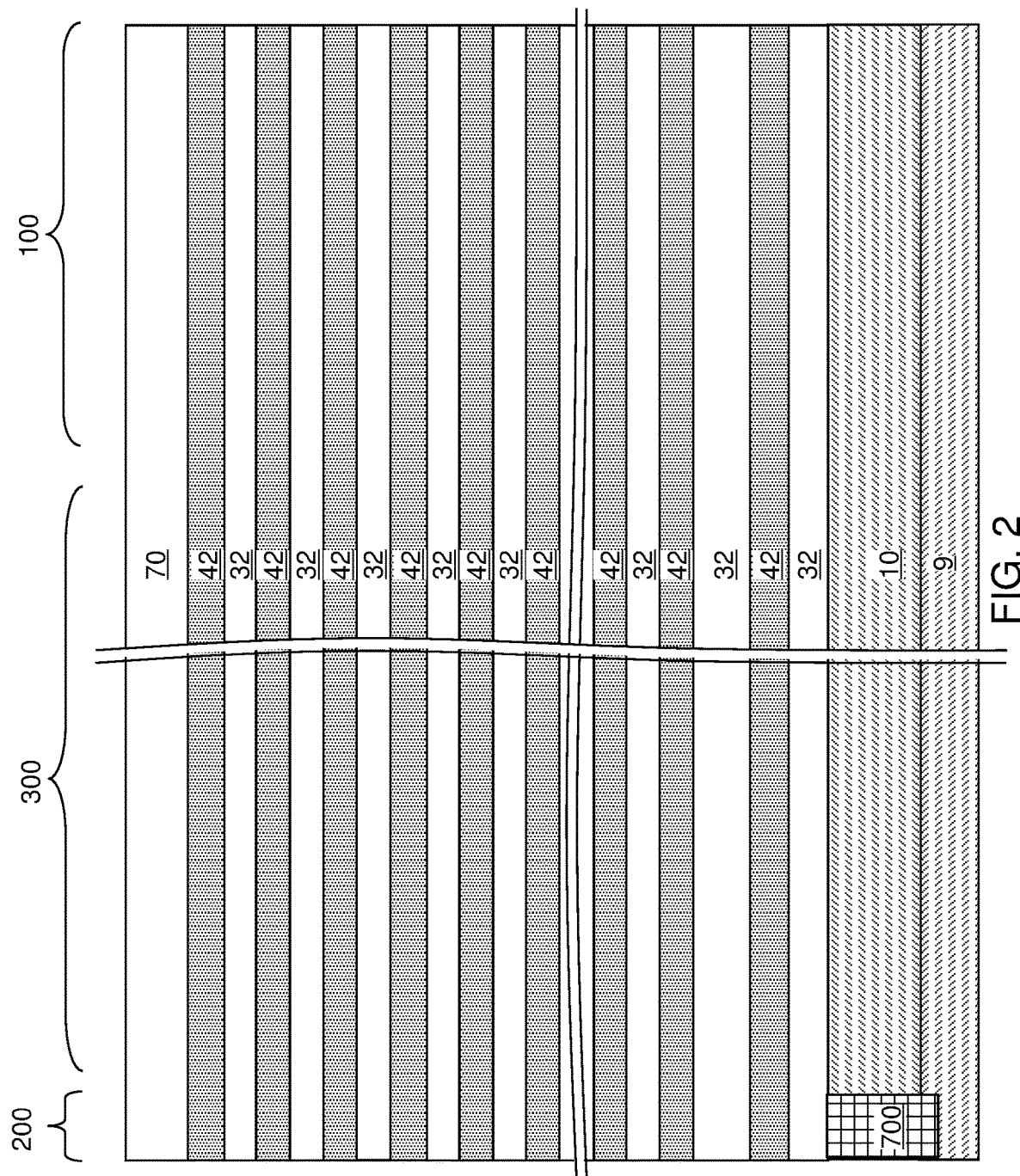
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
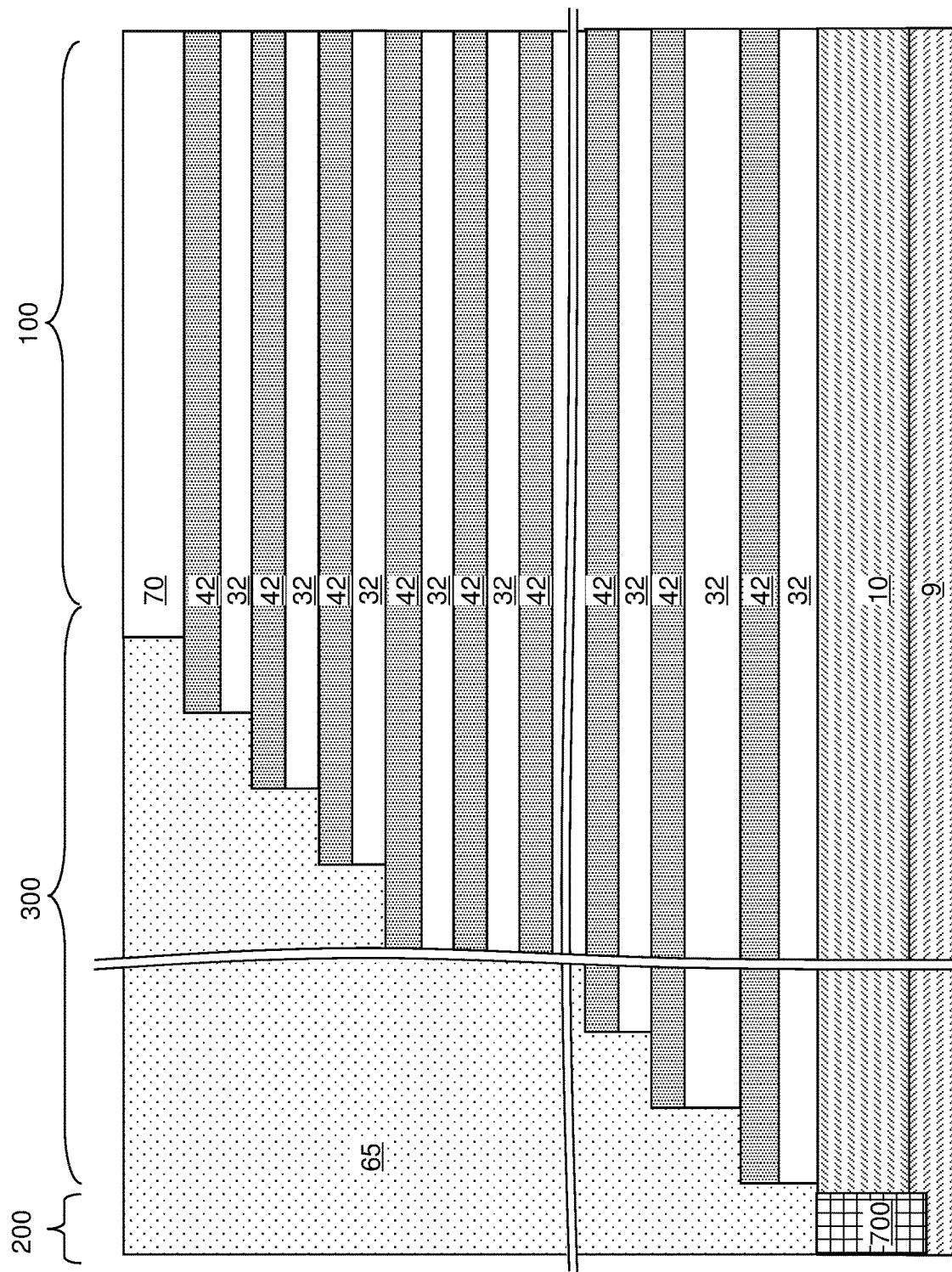
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4A:
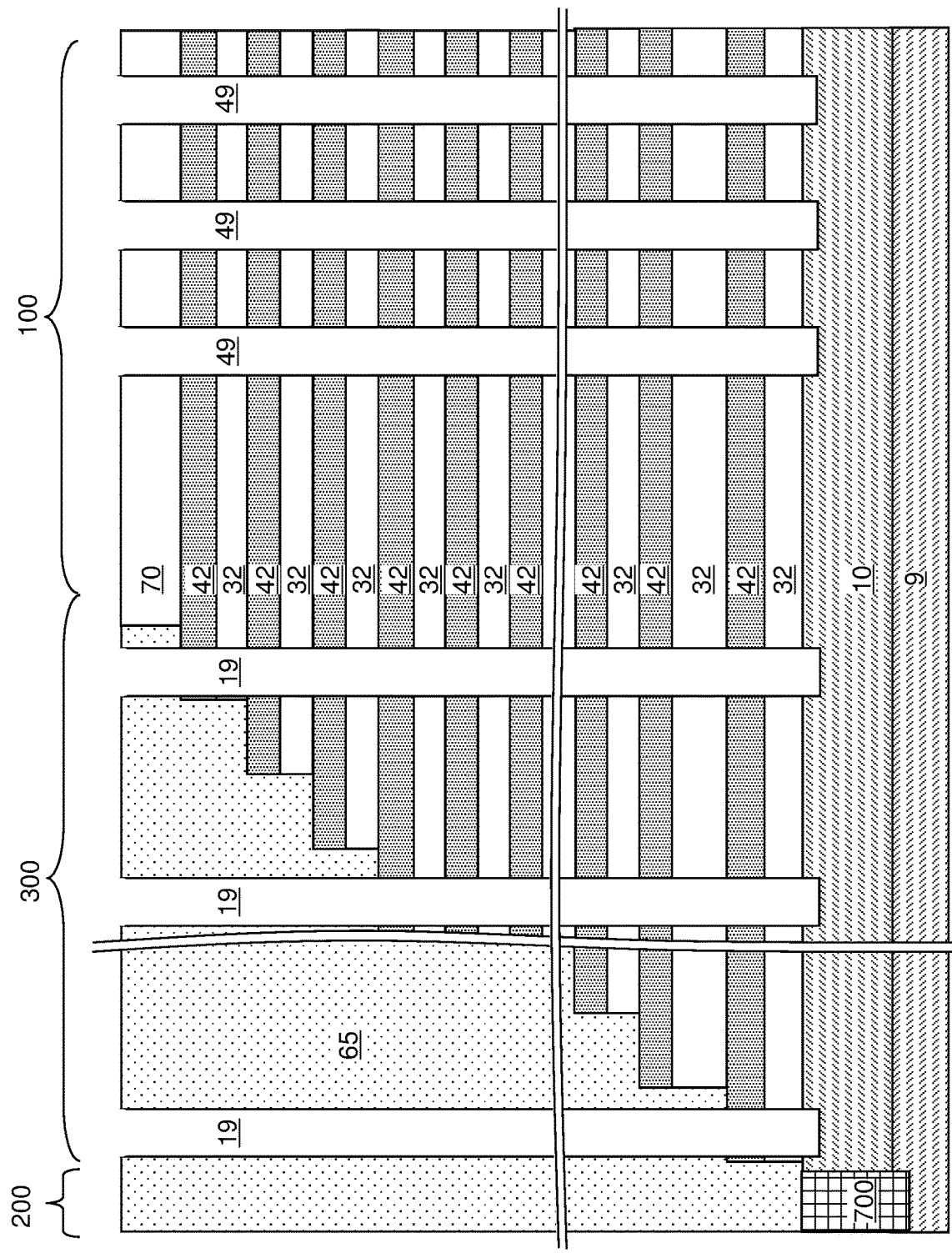
FIG. 4A is a schematic vertical cross-sectional view of the first exemplary structure after formation of memory openings and support openings according to the first embodiment of the present disclosure.
Figure 4B:
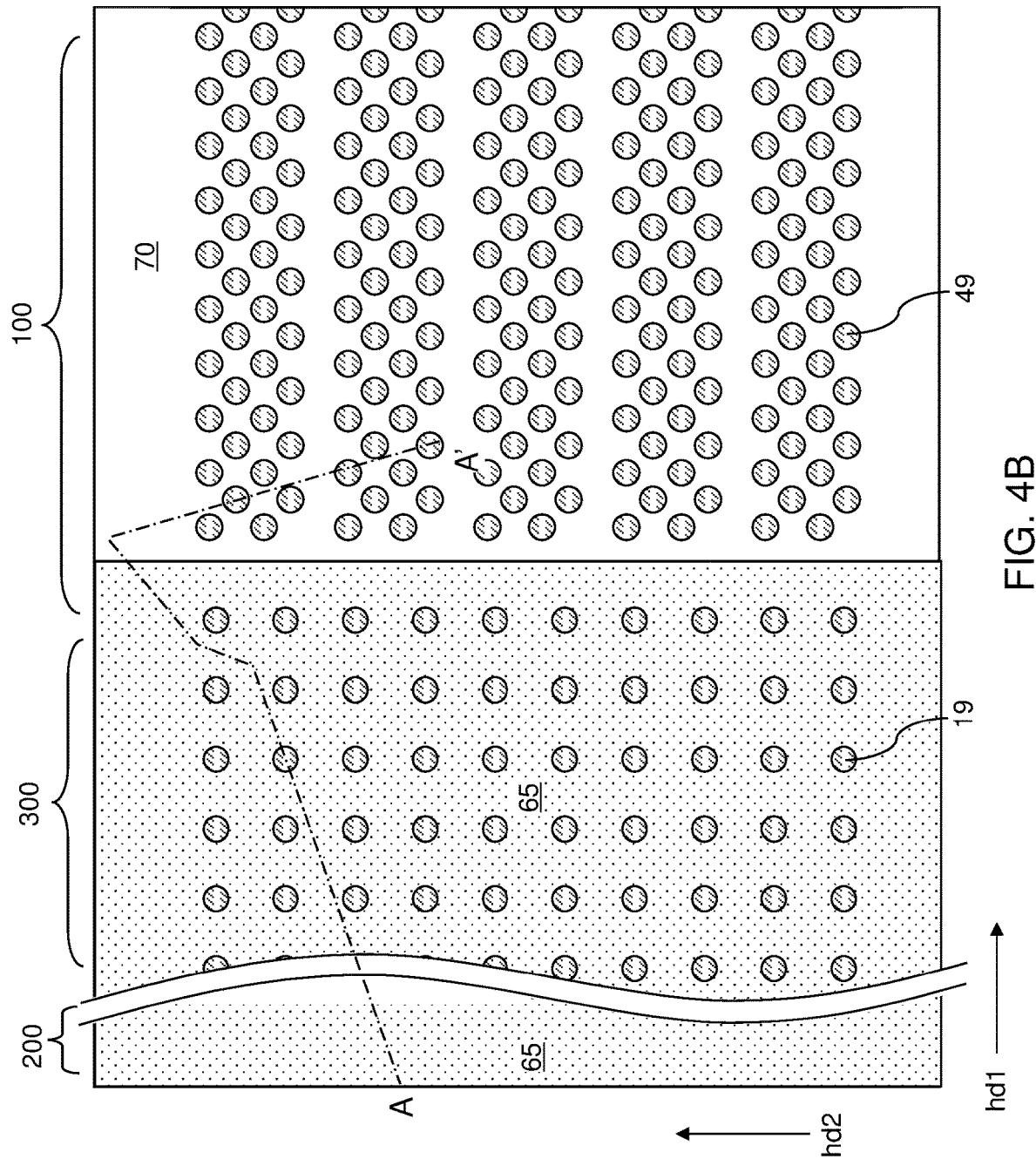
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5K are sequential schematic vertical cross-sectional views of a memory opening 49 within the first exemplary structure during formation of a memory opening fill structure 58 therein according to the first embodiment of the present disclosure.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a memory material layer 54, a dielectric liner 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be formed. In one embodiment, the memory material layer 54 can be a continuous layer or patterned discrete portions of a memory material. In one embodiment, the memory material includes a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. Yet alternatively, the memory material layer 54 may include a dielectric ferroelectric material, such as a continuous ferroelectric material layer or a plurality of discrete, vertically separated ferroelectric material portions. The ferroelectric material may comprise orthorhombic phase hafnium oxide doped with silicon, aluminum or zirconium for example. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping or ferroelectric material portions or electrically isolated conductive material portions) that are vertically spaced apart.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The dielectric liner 56 includes a dielectric material. In one embodiment in which the memory material layer 54 comprises a charge storage (i.e. charge trapping) material, the dielectric liner comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric liner 56 can include a stack of a first silicon oxide layer, a silicon oxynitride layer, and a second silicon oxide layer, which is commonly known as an ONO stack. In one embodiment, the dielectric liner 56 can include a silicon oxide layer that is substantially free of carbon or a silicon oxynitride layer that is substantially free of carbon. The thickness of the dielectric liner 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the dielectric liner 56, the memory material layer 54, the blocking dielectric layer 52 are sequentially anisotropically etched employing at least one anisotropic etch process. The portions of the first semiconductor channel layer 601, the dielectric liner 56, the memory material layer 54, and the blocking dielectric layer 52 located above the top surface of the insulating cap layer 70 can be removed by the at least one anisotropic etch process. Further, the horizontal portions of the first semiconductor channel layer 601, the dielectric liner 56, the memory material layer 54, and the blocking dielectric layer 52 at a bottom of each memory cavity 49' can be removed to form openings in remaining portions thereof. Each of the first semiconductor channel layer 601, the dielectric liner 56, the memory material layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The memory material layer 54 can comprise a charge trapping material or a floating gate material or a ferroelectric material. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the dielectric liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A dielectric liner 56 is located over the memory material layer 54. A set of a blocking dielectric layer 52, a memory material layer 54, and a dielectric liner 56 in a memory opening 49 constitutes a memory film 50, which includes a plurality of charge storage regions (comprising portions of the memory material layer 54) that are insulated from surrounding materials by the blocking dielectric layer 52 and the dielectric liner 56. In one embodiment, the first semiconductor channel layer 601, the dielectric liner 56, the memory material layer 54, and the blocking dielectric layer 52 can have vertically coincident sidewalls. The first semiconductor channel layer 601 may be a sacrificial material which is removed at this time or a permanent layer which is retained in the final device.

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601 (if present, or on the dielectric liner 56 if layer 601 is removed after the previous step). The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5H:
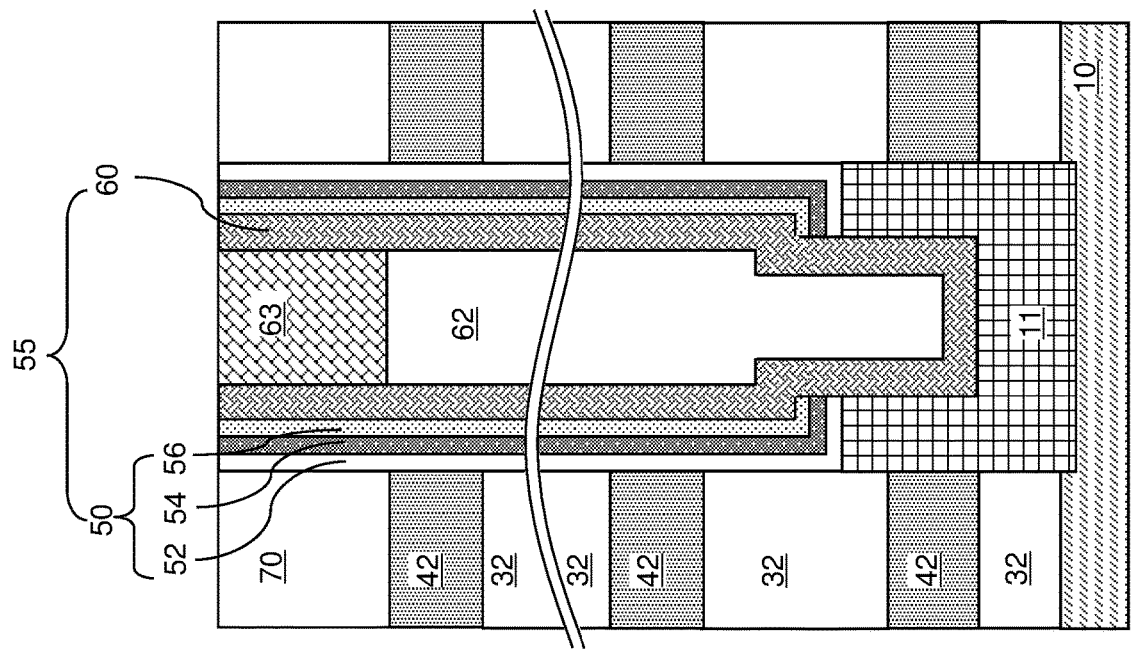
Figure 5G:
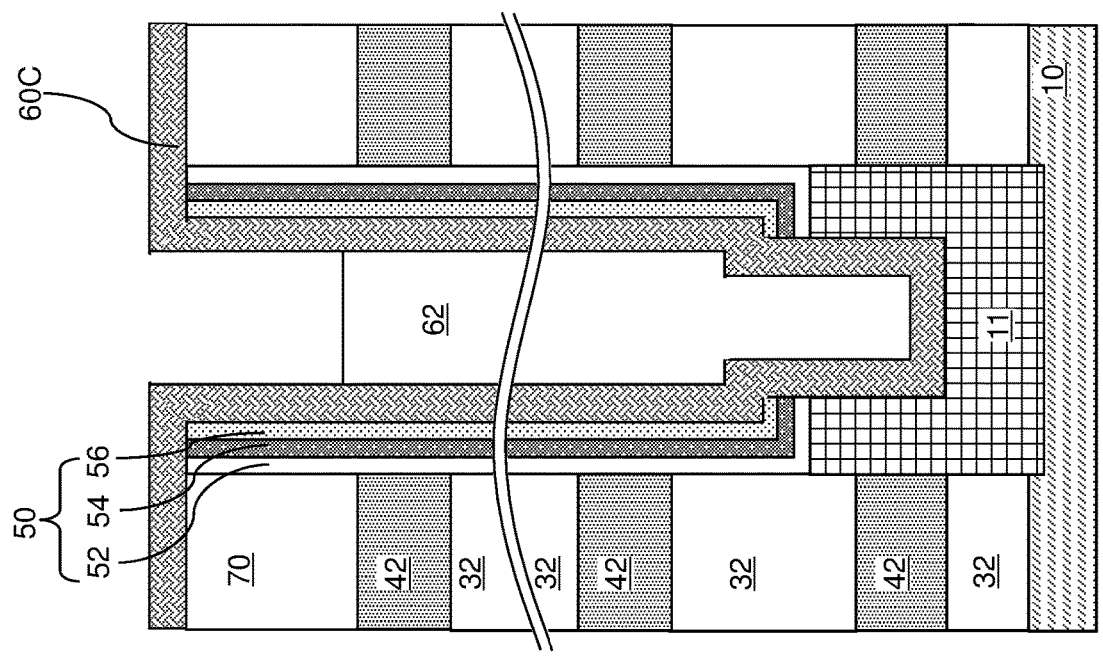

Referring to FIG. 5G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 5H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layers (which have a doping of the first conductivity type) constitutes a vertical semiconductor channel 60. The vertical semiconductor channel 60 is formed directly on the dielectric liner 56.

A dielectric liner 56 is surrounded by a memory material layer 54, and laterally surrounds a portion of the vertical semiconductor channel 60. Each adjoining set of a blocking dielectric layer 52, a memory material layer 54, and a dielectric liner 56 collectively constitute a memory film 50, which can store electrical charges or ferroelectric polarization with a macroscopic retention time. As used herein, a macroscopic retention time refers to a retention time suitable for operation of a memory device as a permanent memory device such as a retention time in excess of 24 hours. In some embodiments, a blocking dielectric layer 52 may not be present in the memory film 50 at this step, and a backside blocking dielectric layer may be subsequently formed after formation of backside recesses. Furthermore, if the ferroelectric memory material layer 54 is used, then the dielectric liner 56 may be omitted.

Each combination of a memory film 50 and a vertical semiconductor channel 60 within a memory opening 49 constitutes a memory stack structure 55. The memory stack structure 55 is a combination of a semiconductor channel 60 and a memory film 50 including an optional dielectric liner 56, a plurality of memory elements comprising portions of the memory material layer 54, and an optional blocking dielectric layer 52.

Figure 5I:
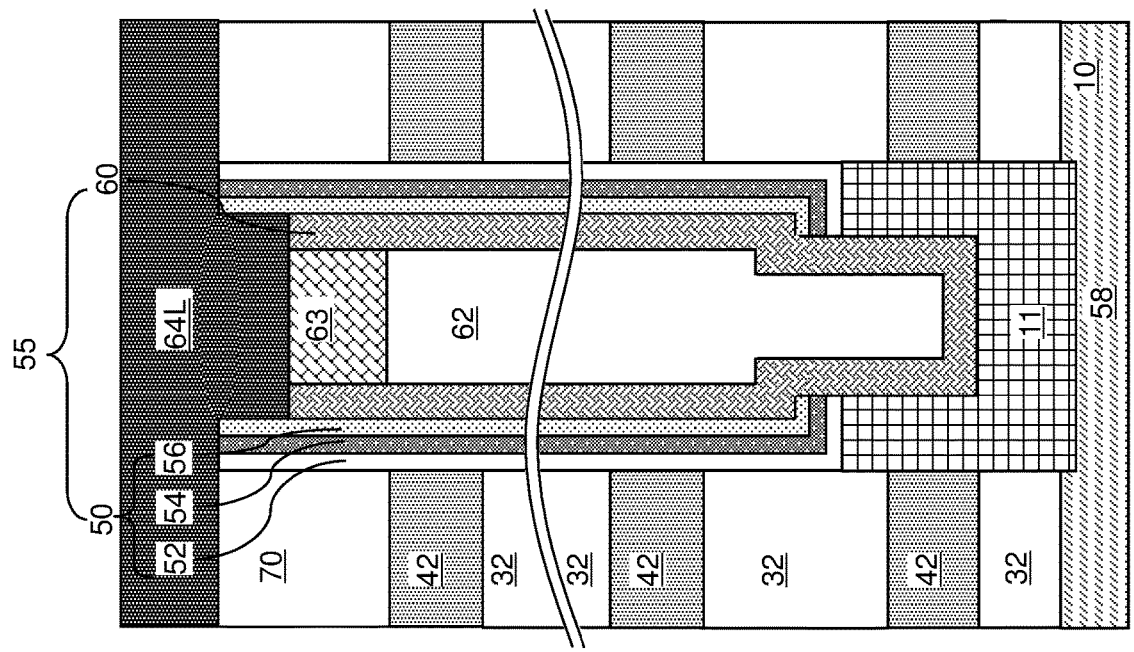

Referring to FIG. 5I, a recess etch process can be performed to vertically recess the semiconductor materials of the drain regions 63 and the vertical semiconductor channels 60 selective to the materials of the insulating cap layer 70, the dielectric liner 56, the memory material layer 54, and the blocking dielectric layer 52. A cylindrical recess cavity 67 can be formed in volumes from which the materials of the drain regions 63 and the vertical semiconductor channels 60 are removed. The depth of each cylindrical recess cavity 67 may be in a range from 3 nm to 40 nm, such as from 6 nm to 20 nm, although lesser and greater depths may also be employed. The depth of the cylindrical recess cavities 67 is less than the thickness of the insulating cap layer 70 and less than the thickness of the drain regions 63.

Figure 5J:
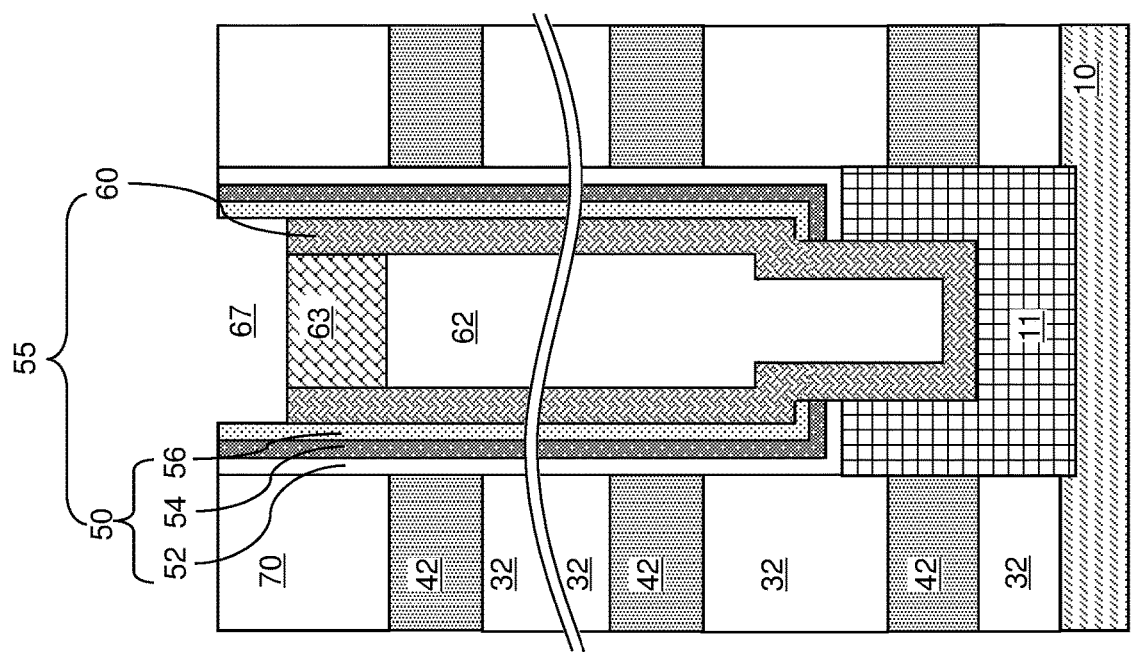

Referring to FIG. 5J, a dielectric fill material can be deposited in the cylindrical recess cavities 67 and over the insulating cap layer 70 to form a dielectric capping material layer 64L, The dielectric fill material of the dielectric capping material layer 64L comprises a different material than the insulating material of the insulating cap layer 70. For example, if the insulating cap layer 70 comprises silicon oxide, then the dielectric fill material of the dielectric capping material layer 64L may comprise silicon nitride or a dielectric metal oxide such as amorphous aluminum oxide.

Figure 5K:
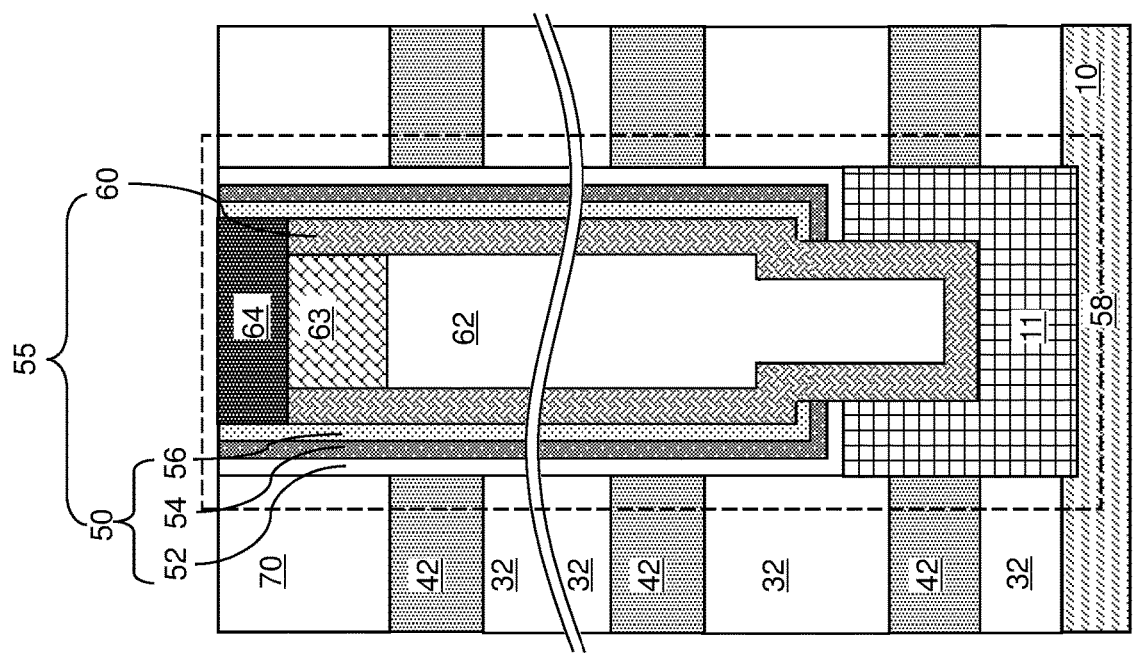
Figure 6A:
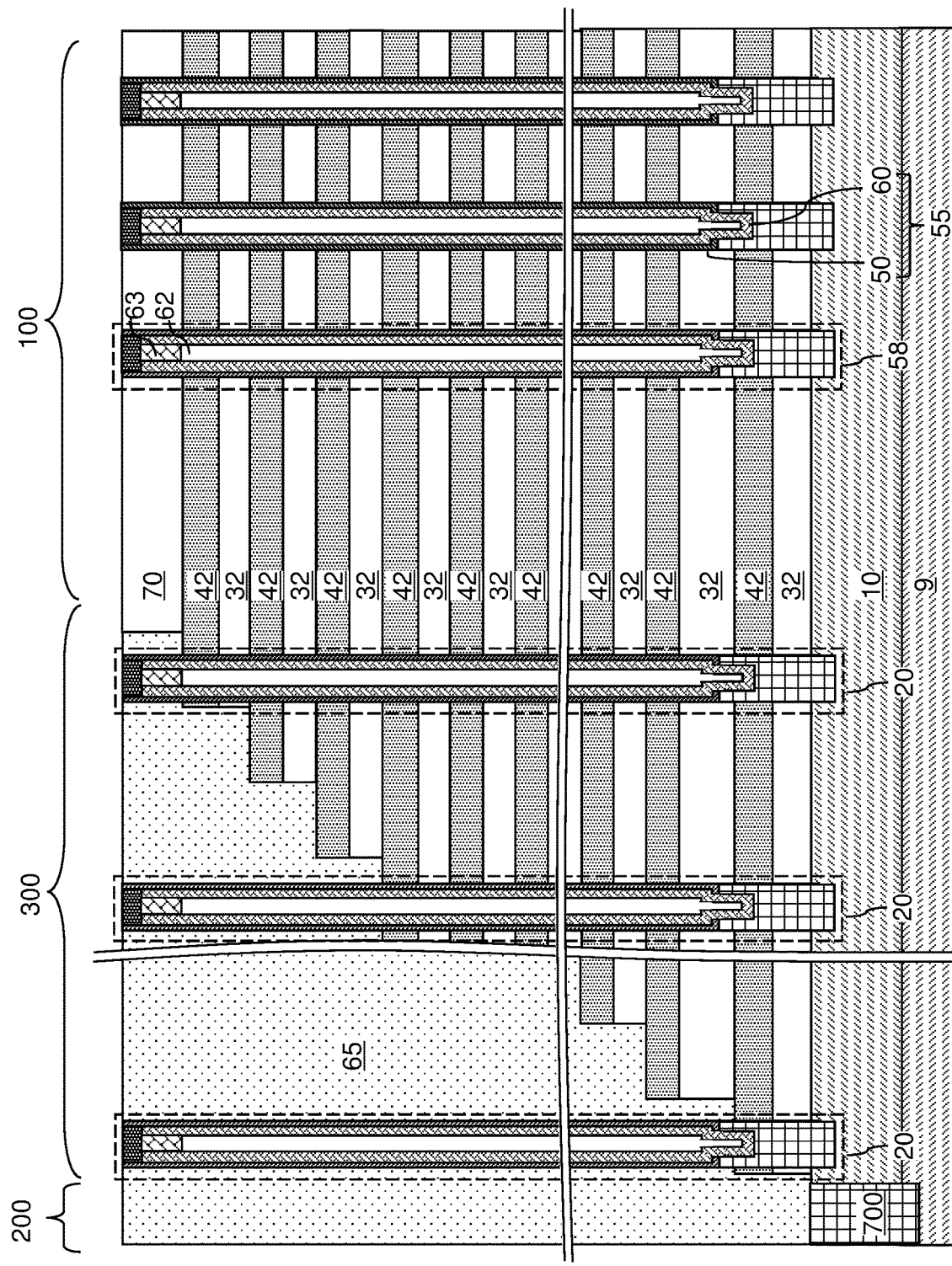
FIG. 6A is a schematic vertical cross-sectional view of the first exemplary structure after formation of memory stack structures and support pillar structures according to the first embodiment of the present disclosure.
Figure 6B:
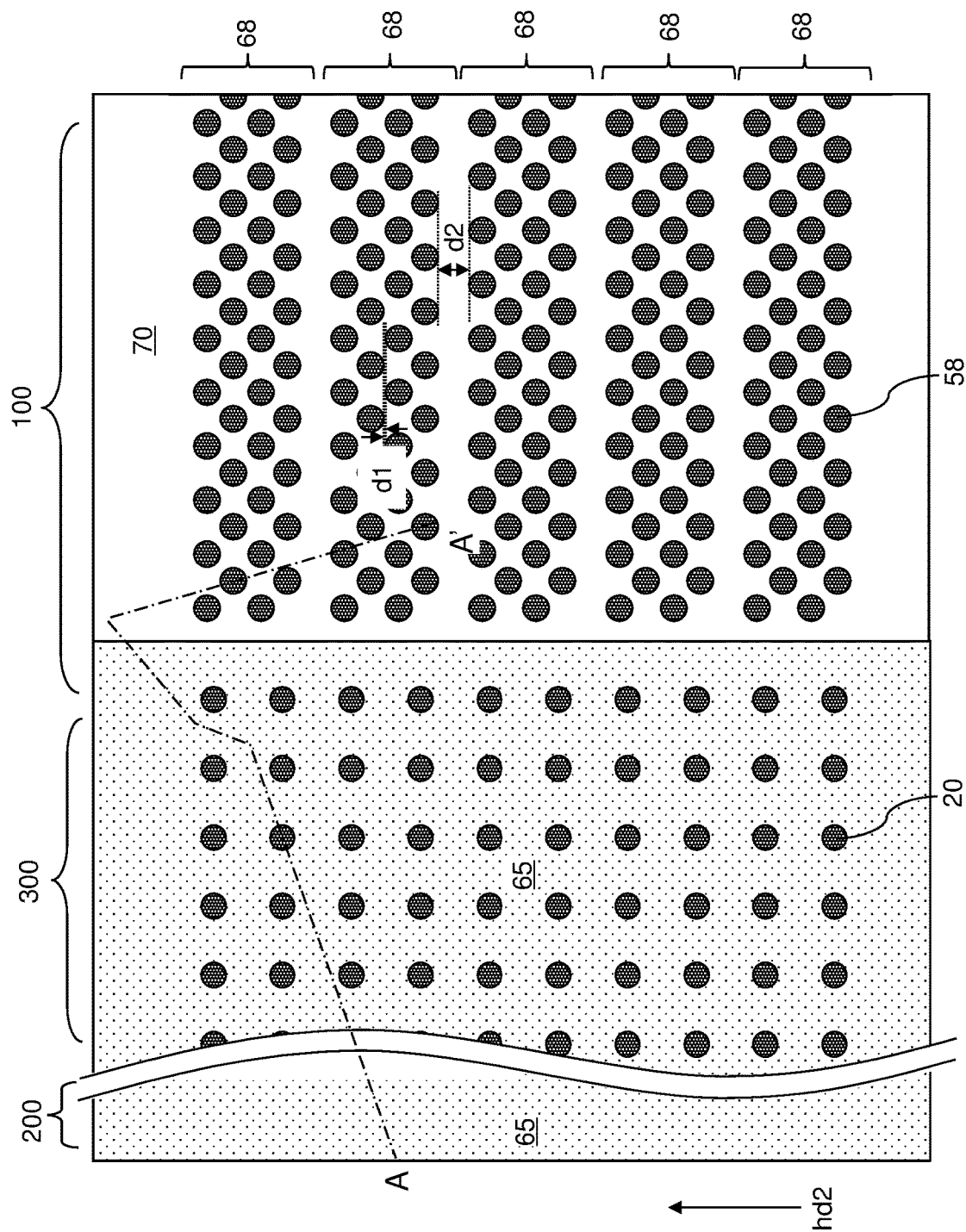
FIG. 6B is a top-down view of the first exemplary structure of FIG. 6A. The vertical plane A-A' is the plane of the cross-section for FIG. 6A.

Referring to FIGS. 5K, 6A, and 6B, a planarization process can be performed to remove portions of the dielectric capping material layer 64L from above the horizontal plane including the top surface of the insulating cap layer 70. For example, a chemical mechanical polishing (CMP) process and/or a recess etch process can be performed. Each remaining portion of the dielectric capping material layer 64L constitutes a dielectric cap structure 64. In one embodiment, top surfaces of the dielectric cap structure 64 may be located within, or below, the horizontal plane including the top surface of the insulating cap layer 70. In one embodiment, each dielectric cap structure 64 can contact an upper portion of an inner sidewall of a memory film 50.

An entire set of material portions that fills a memory opening 49 is herein referred to as a memory opening fill structure 58. An entire set of material portions that fills a support opening 19 constitutes a support pillar structure 20.

Generally, a plurality of arrays of memory openings 49 can be formed through the alternating stack of insulating layers 32 and sacrificial material layers 42. A plurality of arrays of memory opening fill structures 58 can be formed in the plurality of arrays of memory openings 49. Each of the memory opening fill structures 58 comprises a respective vertical stack of memory elements (such as portions of a memory material layer 54 located at levels of the sacrificial material layers 42), and each array of memory opening fill structures 58 comprises a respective set of rows of memory opening fill structures 58 that are arranged along a first horizontal direction hd1 (e.g., word line direction). The plurality of arrays of memory opening fill structures 58 can be laterally spaced apart from each other along a second horizontal direction hd2 (e.g., bit line direction) that is perpendicular to the first horizontal direction hd1.

According to an aspect of the present disclosure, each of the memory opening fill structures 58 comprises a respective dielectric cap structure 64 overlying the respective vertical stack of memory elements and drain region 63. In one embodiment, each of the memory opening fill structures 58 comprises a respective vertical semiconductor channel 60 and a respective dielectric liner 56 (which may be a tunneling dielectric layer in some embodiments) located between the respective vertical semiconductor channel 60 and a respective vertical stack of memory elements. The support pillar structures 20 can be formed within the support openings 19. Each of the support pillar structures 20 vertically extend through a subset of layers within the alternating stack (32, 42).

As shown in FIG. 6B, each array 68 of the memory opening fill structures 58 comprises the respective set of rows of memory opening fill structures that are spaced apart from each other along the second horizontal direction hd2 by a first distance d1, while the plurality of arrays 68 of memory opening fill structures 58 are laterally spaced apart from each other along the second horizontal direction hd2 by a second distance d2 greater than the first distance d1. In other words, the adjacent rows of memory opening fill structures 58 in each array 68 are located closer to each other along the bit line direction hd2 than the adjacent arrays 68.

Figure 7:
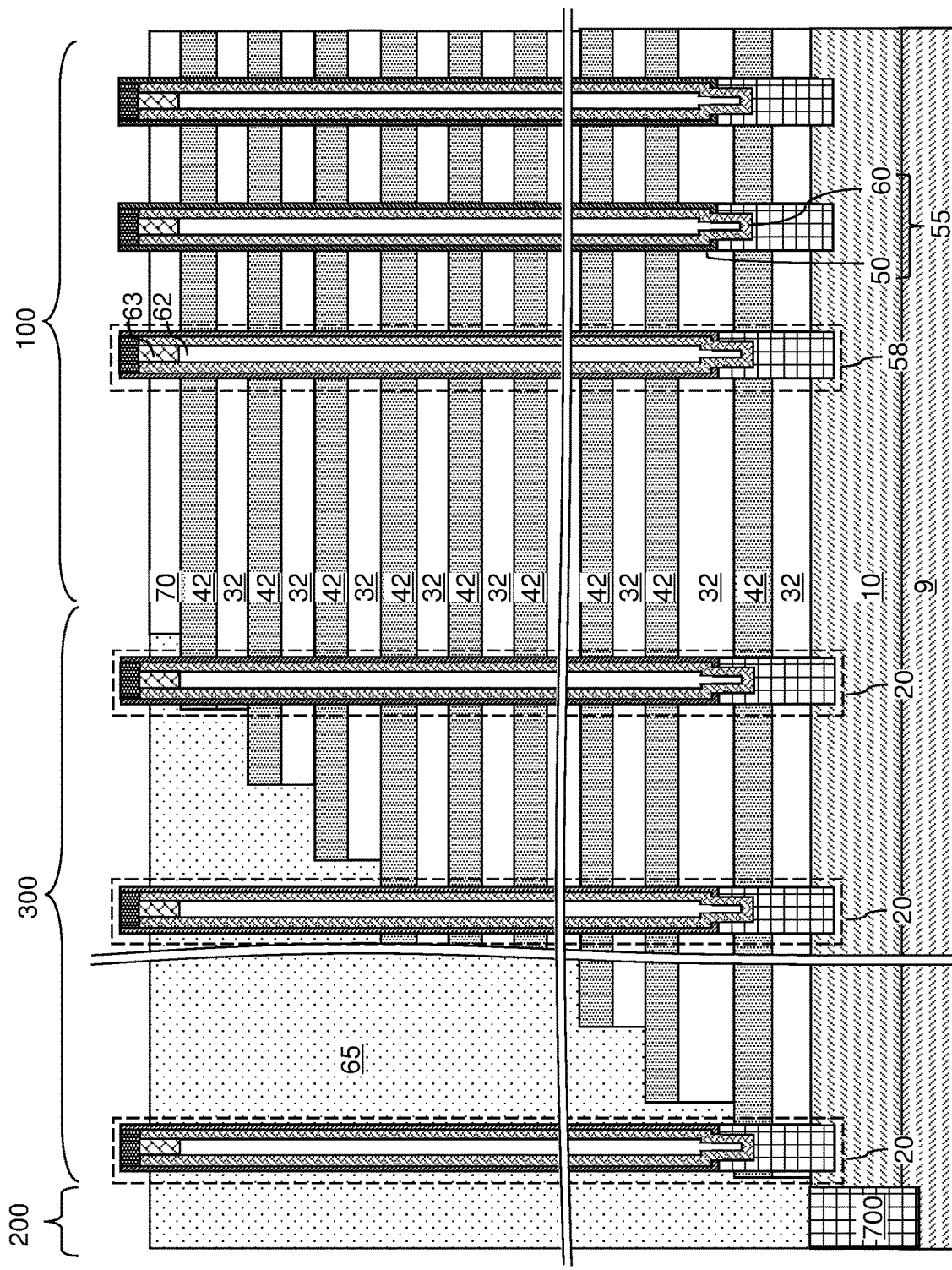
FIG. 7 is a schematic vertical cross-sectional view of the first exemplary structure after vertically recessing the insulating cap layer and the retro-stepped dielectric material portion according to the first embodiment of the present disclosure.

Referring to FIG. 7, a recess etch process can be performed to vertically recess the insulating cap layer 70 and the retro-stepped dielectric material portion 65 selective to the material of the dielectric cap structures 64. The recess etch process has an etch chemistry that etches the material of the insulating cap layer 70 selective to the material of the dielectric cap structures 64. For example, if the insulating cap layer 70 includes silicon oxide and if the dielectric cap structures 64 include silicon nitride or a dielectric metal oxide (such as aluminum oxide), a wet etch process employing hydrofluoric acid may be performed to vertically recess the top surface of the insulating cap layer 70. The dielectric cap structures 64 protect the drain regions 63 from being etched during this etching step. The top surface of the retro-stepped dielectric material portion 65 may be collaterally vertically recessed by the recess etch process. Materials of the dielectric liners 56, the memory material layers 54, and the blocking dielectric layers 52 may, or may not, be collaterally recessed during the recess etch process. Generally, the insulating cap layer 70 can be vertically recessed selective to the plurality of arrays of memory opening fill structures 58. The vertical recess distance of the recess etch process may be in a range from 5 nm to 40 nm, such as from 10 nm to 20 nm, although lesser distances may be used.

Figure 8A:
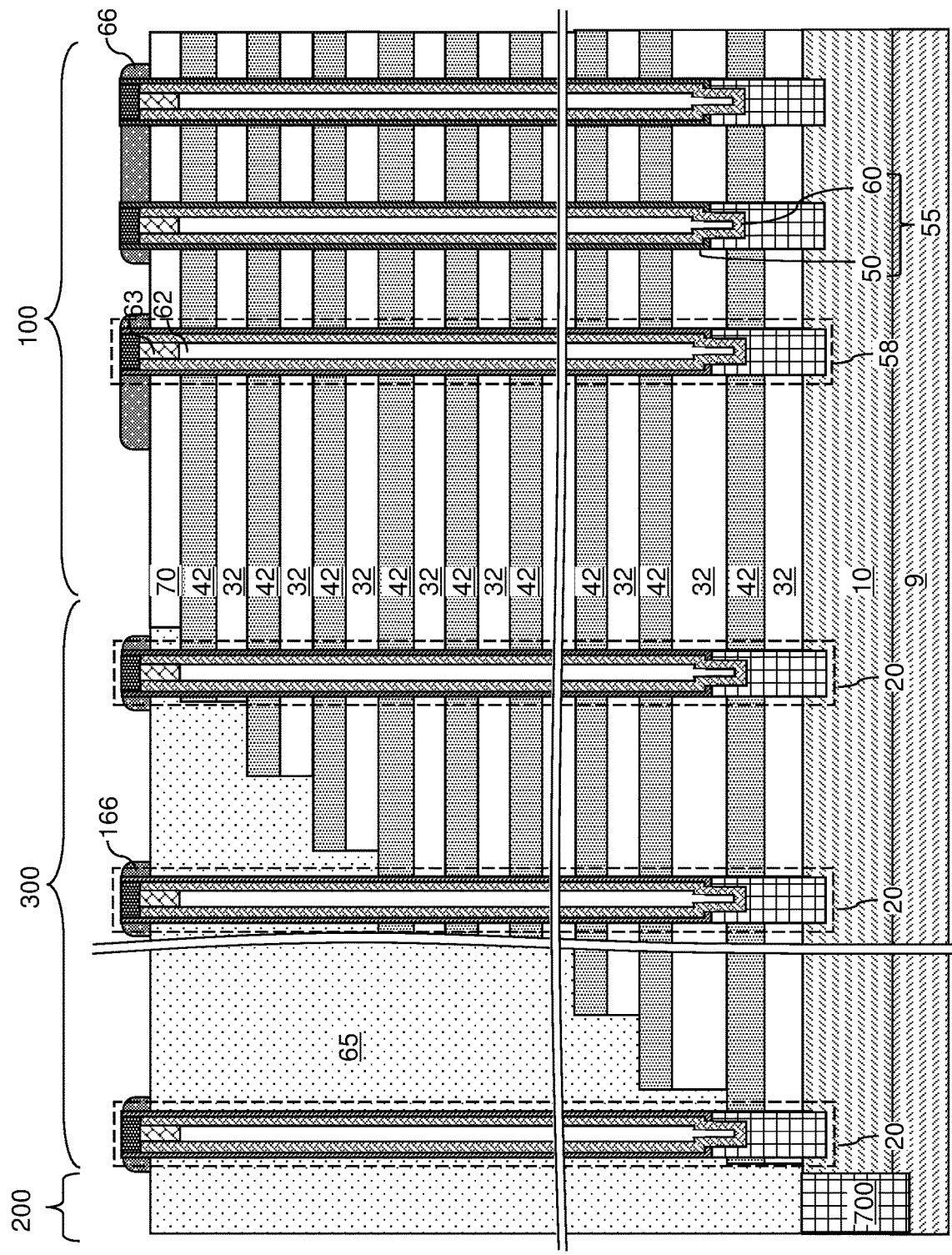
FIG. 8A is a schematic vertical cross-sectional view of the first exemplary structure after formation of dielectric plates and discrete annular dielectric spacers according to the first embodiment of the present disclosure.
Figure 8B:
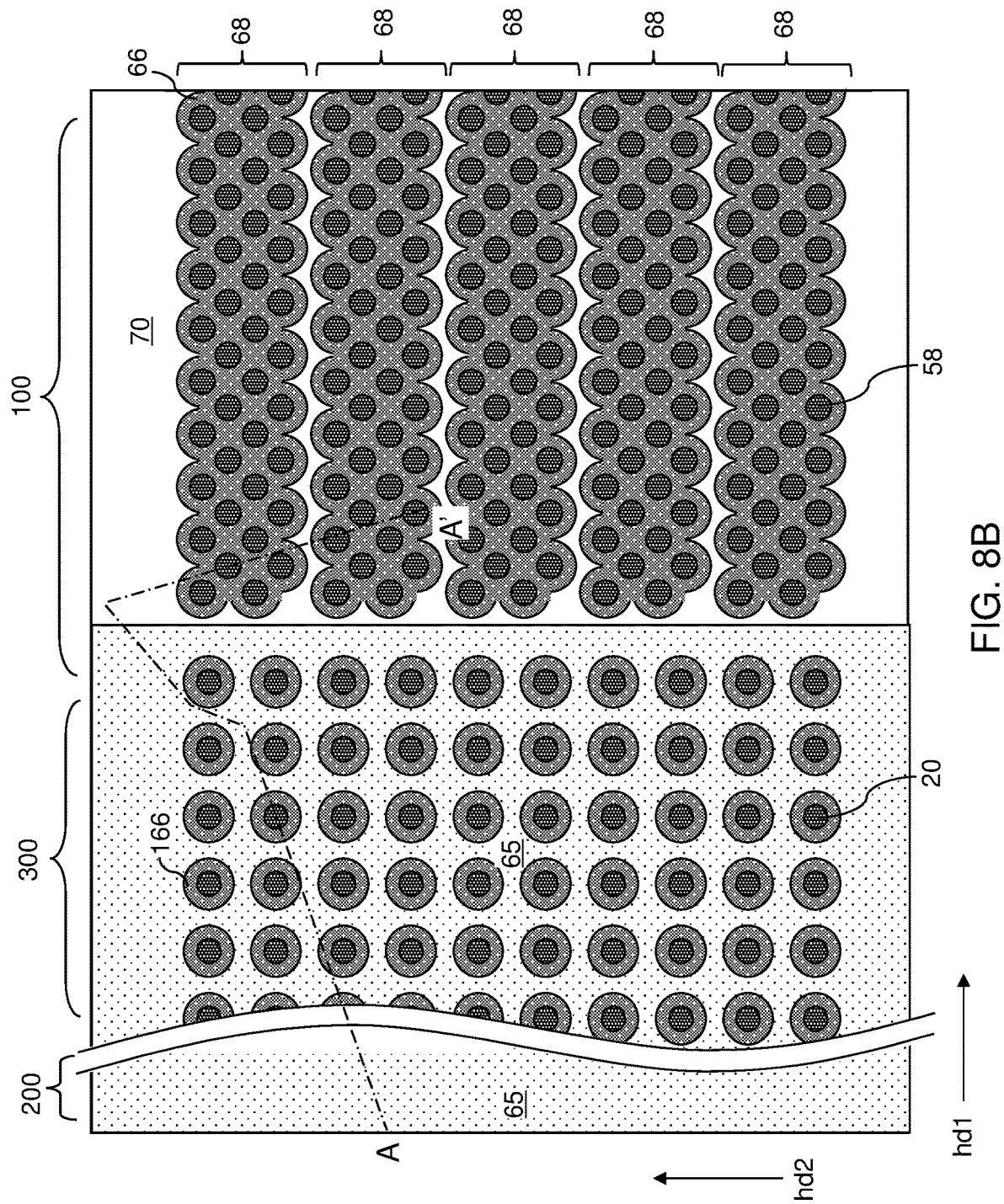
FIG. 8B is a top-down view of the first exemplary structure of FIG. 8A. The vertical plane A-A' is the plane of the cross-section for FIG. 8A.

Referring to FIGS. 8A and 8B, a dielectric material layer can be conformally deposited over the plurality of arrays of memory opening fill structures 58, over the support pillar structures 20, and over a recessed horizontal surface of the insulating cap layer 70. The dielectric material layer includes a dielectric material that is different from the material of the insulating cap layer 70. In one embodiment, the dielectric material layer can include a dielectric material such as silicon nitride or a dielectric metal oxide (e.g., aluminum oxide). The dielectric material may be the same as the material of the dielectric cap structures 64. The dielectric material layer can be deposited by a conformal deposition process such as a chemical deposition process. In one embodiment, the thickness of the dielectric material layer can be greater than one half of a lateral spacing between a neighboring pair of memory opening fill structures 58. In one embodiment, the thickness of the dielectric material layer can be selected such that an entire volume of gaps between neighboring rows of memory opening fill structures 58 can be filled by the dielectric material layer below a horizontal plane including the top surfaces of the memory opening fill structures 58.

The dielectric material layer can be anisotropically etched by performing an anisotropic etch process (i.e., a sidewall spacer etch process). The anisotropic etch process can have an etch chemistry that etches the material of the dielectric material layer selective to the material of the insulating cap layer 70. Horizontally-extending portions of the dielectric material layer that overlie the memory opening fill structures 58 or the support pillar structures 20, or are laterally spaced from the memory opening fill structures 58 or the support pillar structures 20 by a lateral distance that is greater than the thickness of the dielectric material layer can be removed by the anisotropic etch process. Remaining portions of the dielectric material layer comprise a plurality of dielectric plates (e.g., dielectric sidewall spacer plates) 66 that laterally surround top portions of a respective array of memory opening fill structures 58, and discrete annular dielectric spacers 166 that laterally surround a top portion of a respective one of the support pillar structures 20. The plurality of dielectric plates 66 can be formed on a recessed horizontal surface of the insulating cap layer 70 that are formed by the recess etch process described with reference to FIG. 7.

Generally, a plurality of dielectric plates 66 laterally surrounding and contacting a respective array of memory opening fill structures 58 can be formed. Each of the plurality of dielectric plates 66 can have an outer sidewall that is laterally spaced from a most proximal memory opening fill structure 58 within a respective array of memory opening fill structures 58 by a uniform lateral offset distance, which can be the same as the thickness of the dielectric material layer. The uniform lateral offset distance may be in a range from 5 nm to 60 nm, such as from 10 nm to 30 nm, although lesser and greater thicknesses may also be employed.

As shown in FIG. 8B, each dielectric plate 66 may comprise a pair of laterally-undulating sidewalls that generally extend along the first horizontal direction hd1 with a lateral undulation along the second horizontal direction hd2. Each laterally-undulating sidewall of the dielectric plates 66 that laterally extend along the first horizontal direction hd1 can have a respective set of sidewall segments. Each laterally-neighboring pair of dielectric plates 66 that are laterally spaced apart along the second horizontal direction hd2 may include a first lengthwise sidewall that comprises a contiguous set of multiple vertically straight and laterally convex sidewall segments of one of the respective neighboring pair of dielectric plates 66, and a second lengthwise sidewall that comprises a contiguous set of multiple vertically straight and laterally convex sidewall segments of another of the respective neighboring pair of dielectric plates 66.

In one embodiment shown in FIG. 8B, each of the plurality of dielectric plates 66 contacts and laterally surrounds each dielectric cap structure 64 located within a respective array 68 of memory opening fill structures 58 of the plurality of arrays 68 of memory opening fill structures 58. The total number of openings through each of the plurality of dielectric plates 66 can be the same as the total number of memory opening fill structures 58 within the respective array 68 of memory opening fill structures 58.

The discrete annular dielectric spacers 166 laterally surround a top end of a respective one of the support pillar structures 20. Each of the discrete annular dielectric spacers 166 comprises a same dielectric material as the plurality of dielectric plates 66, and has a uniform lateral distance between an outer sidewall and an inner sidewall that is the same as the uniform lateral offset distance between cylindrical openings in a dielectric plate 66 and a most proximal outer sidewall segment of the dielectric plate 66.

Figure 9:
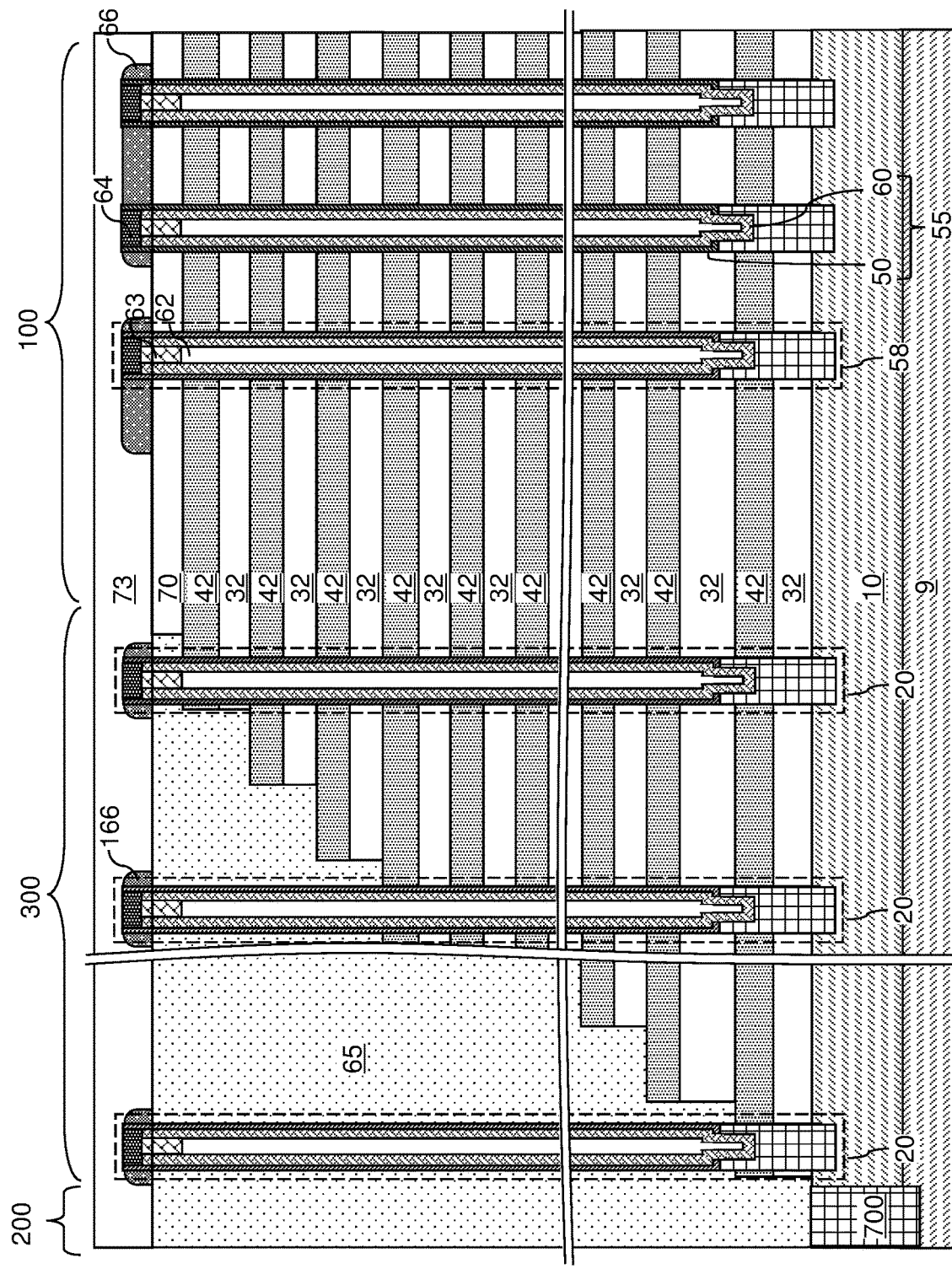
FIG. 9 is a schematic vertical cross-sectional view of the first exemplary structure after formation of a contact-level dielectric layer according to the first embodiment of the present disclosure.

Referring to FIG. 9, a contact-level dielectric layer 73 can be formed by deposition of a dielectric material such as silicon oxide. Optionally, the top surface of the contact-level dielectric layer 73 can be planarized employing a planarization process such as a chemical mechanical polishing (CMP) process. The thickness of the contact-level dielectric layer 73, as measured vertically between a top surface of a memory opening fill structure 58 and a top surface of the contact-level dielectric layer 73, can be in a range from 30 nm to 300 nm, although lesser and greater thicknesses may also be employed. The contact-level dielectric layer 73 overlies the plurality of dielectric plates 66. In one embodiment, bottom surfaces of the plurality of dielectric plates 66 are located within a same horizontal plane as a bottom surface of the contact-level dielectric layer 73.

Figure 10A:
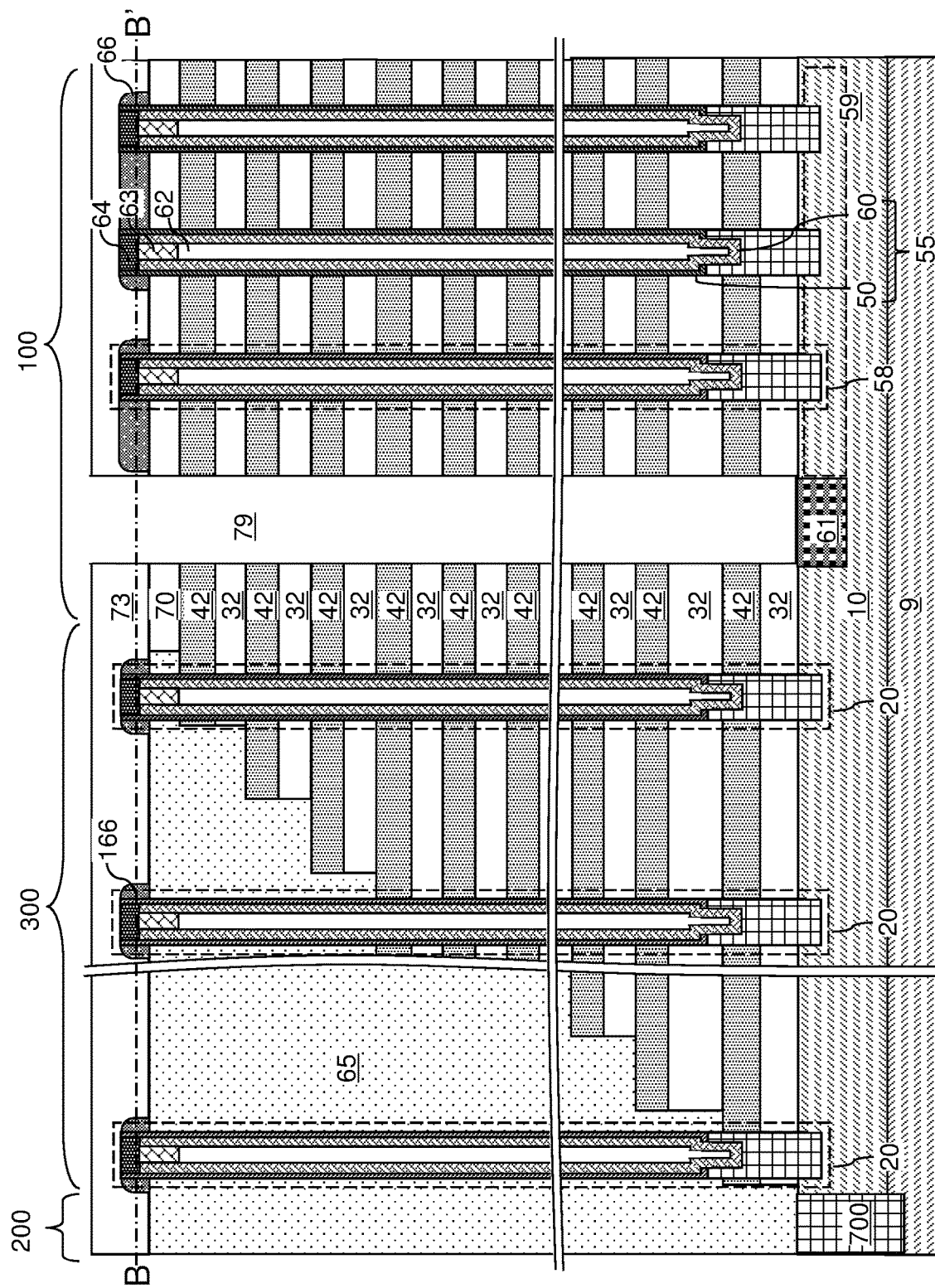
FIG. 10A is a schematic vertical cross-sectional view of the first exemplary structure after formation of backside trenches according to the first embodiment of the present disclosure.
Figure 10B:
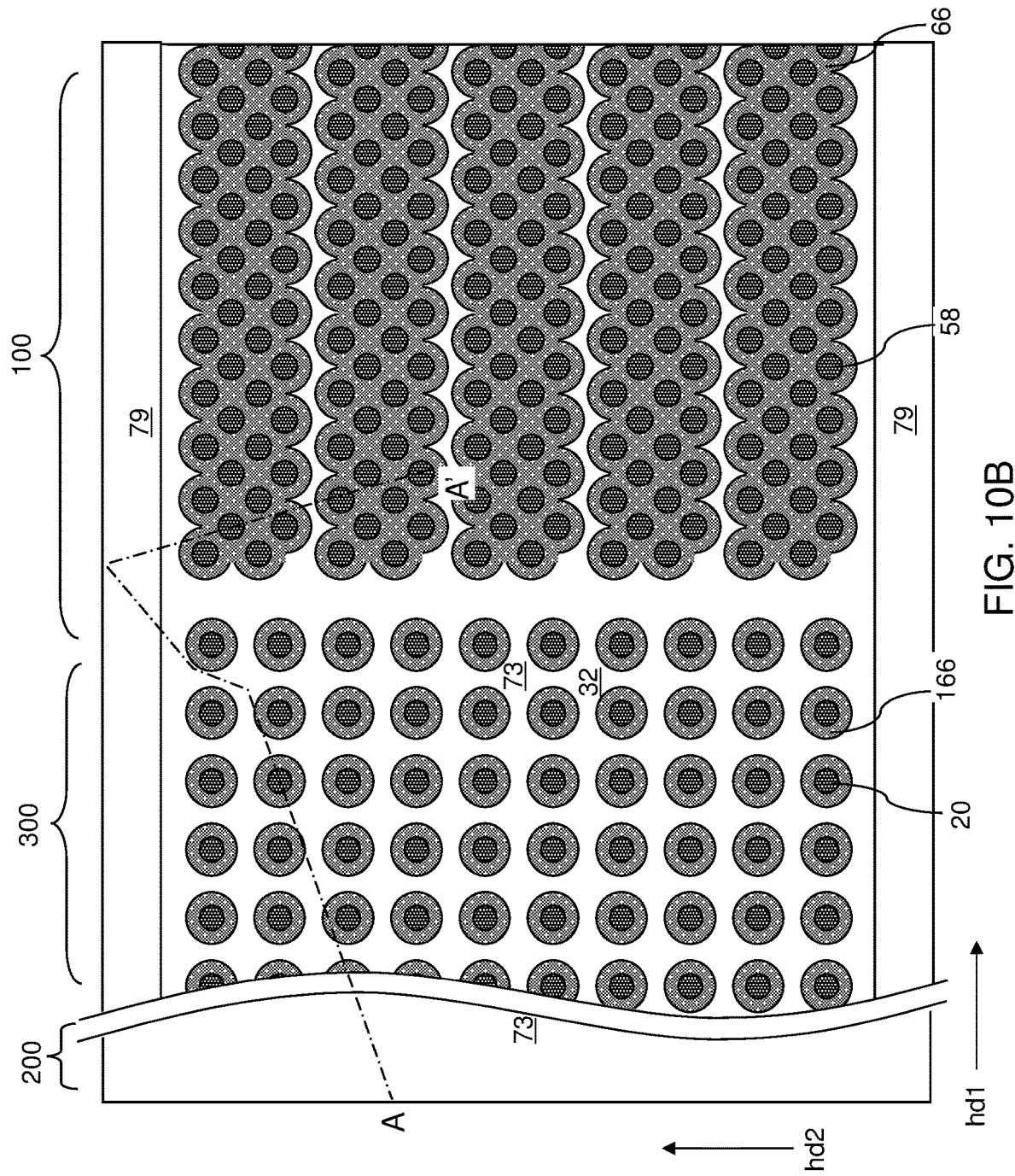
FIG. 10B is a horizontal cross-sectional view of the first exemplary structure along the vertical plane B-B' of FIG. 10A. The vertical plane A-A' is the plane of the schematic vertical cross-sectional view of FIG. 10A.
Figure 10C:
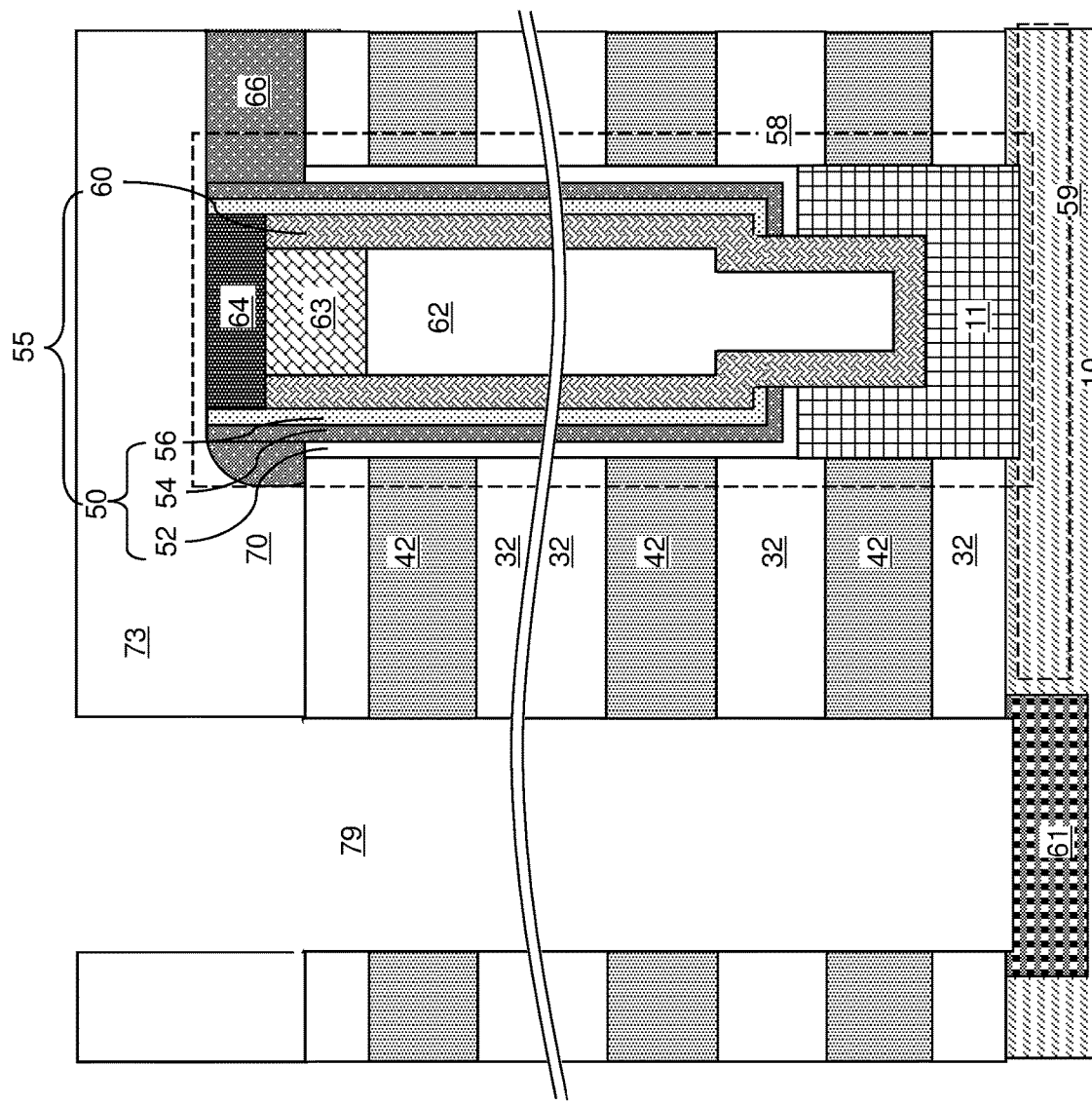
FIG. 10C is a magnified view of a region of FIG. 10A.

Referring to FIGS. 10A-10C, a photoresist layer (not shown) can be applied over the contact-level dielectric layer 73, and is lithographically patterned to form openings in areas between clusters (e.g., blocks) of memory opening fill structures 58 (which contain memory stack structures 55). The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart from each other along a second horizontal direction hd2 that is perpendicular to the first horizontal direction hd1. The backside trenches 79 can be formed between groups of arrays (e.g., blocks of arrays) of memory opening fill structures 58 in areas that are free of the memory opening fill structures 58. Each backside trench 79 can have a uniform width that is invariant along the lengthwise direction (i.e., along the first horizontal direction hd1). Multiple arrays of memory opening fill structures 58 can be located between a neighboring pair of backside trenches 79. Thus, multiple dielectric plates 66 may be present between a neighboring pair of backside trenches 79.

In one embodiment, the backside trenches 79 can include a source contact opening in which a source contact via structure can be subsequently formed. The photoresist layer can be removed, for example, by ashing. Generally, backside trenches 79 laterally extending along the first horizontal direction hd1 can be formed through the contact-level dielectric layer 73 and the alternating stack (32, 42). Layer stacks (32, 42, 70, 73) are formed, each of which includes a respective patterned portion of the contact-level dielectric layer 73 and a respective patterned portion of the alternating stack (32, 42) as formed at the processing steps of FIG. 2 and laterally spaced from each other by the backside trenches 79.

Dopants of the second conductivity type can be implanted into physically exposed surface portions of the substrate (9, 10) (which may be surface portions of the semiconductor material layer 10) that are located at the bottom of the backside trenches by an ion implantation process. A source region 61 can be formed at a surface portion of the semiconductor material layer 10 under each backside trench 79. Each source region 61 is formed in a surface portion of the substrate (9, 10) that underlies a respective backside trench 79. Due to the straggle of the implanted dopant atoms during the implantation process and lateral diffusion of the implanted dopant atoms during a subsequent activation anneal process, each source region 61 can have a lateral extent greater than the lateral extent of the lateral extent of the overlying backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. Each horizontal semiconductor channel 59 contacts a source region 61 and a plurality of pedestal channel portions 11.

Figure 11A:
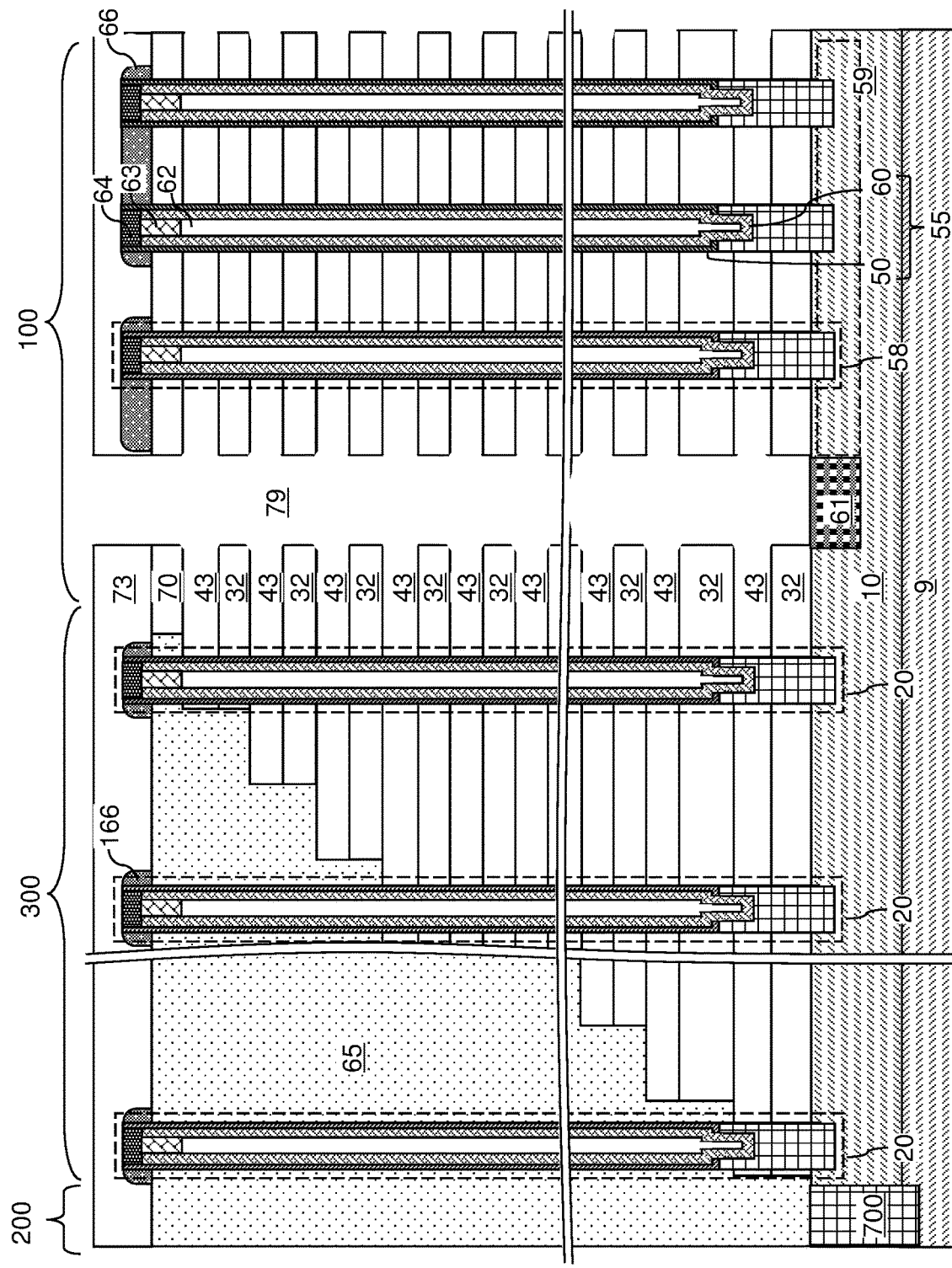
FIG. 11A is a schematic vertical cross-sectional view of the first exemplary structure after formation of backside recesses according to the first embodiment of the present disclosure.
Figure 11B:
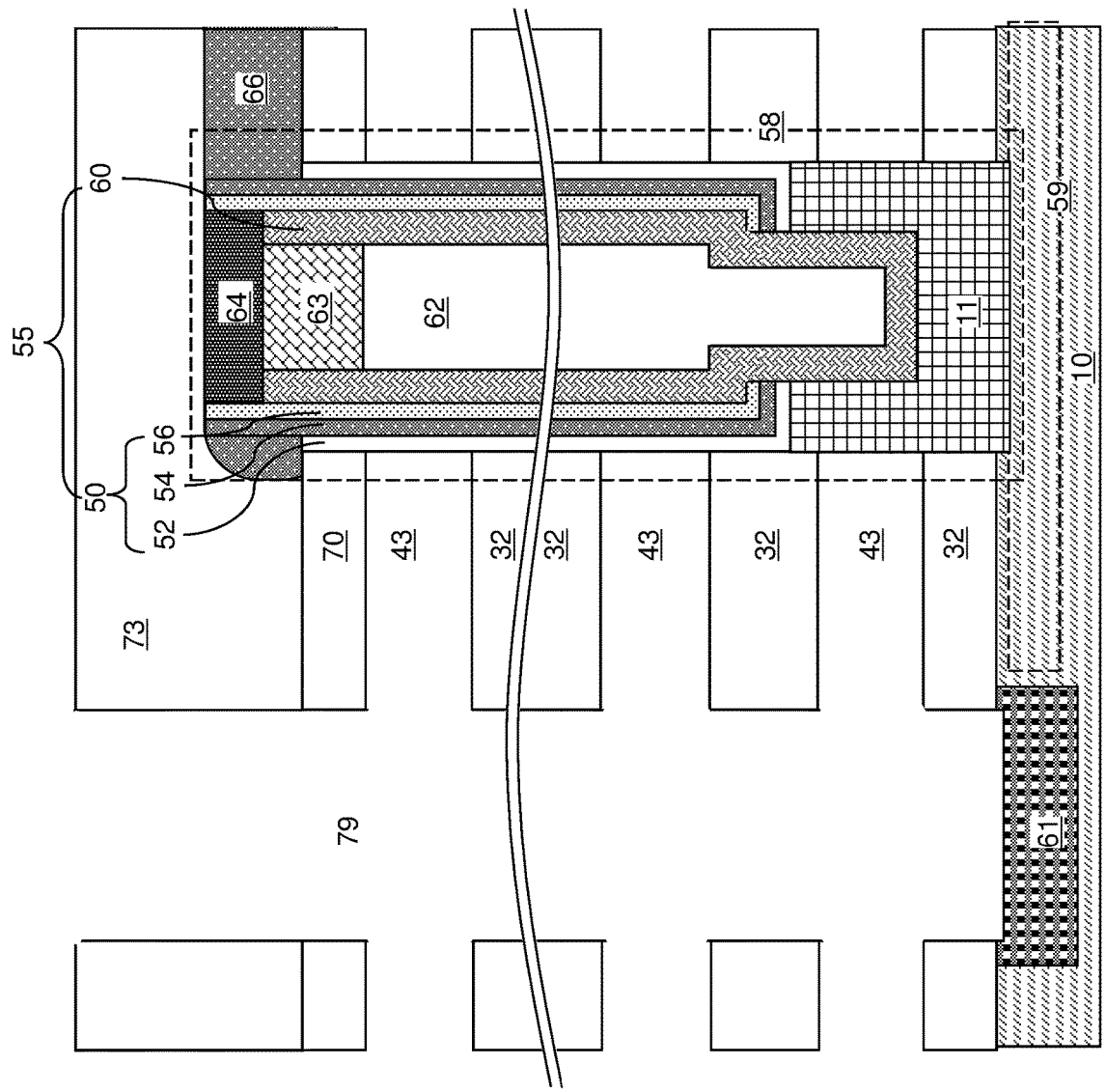
FIG. 11B is a magnified view of a region of FIG. 11A.

Referring to FIGS. 11A and 11B, an etchant that selectively etches the second material of the sacrificial material layers 42 with respect to the first material of the insulating layers 32 can be introduced into the backside cavities 79', for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Generally, the backside recesses 43 can be formed by removing the sacrificial material layers 42 (which are patterned portions of the sacrificial material layers as formed at the processing steps of FIG. 3) selective to the insulating layers 32 (which are patterned portions of the insulating layers 32 as formed at the processing steps of FIG. 3).

Figure 12A:
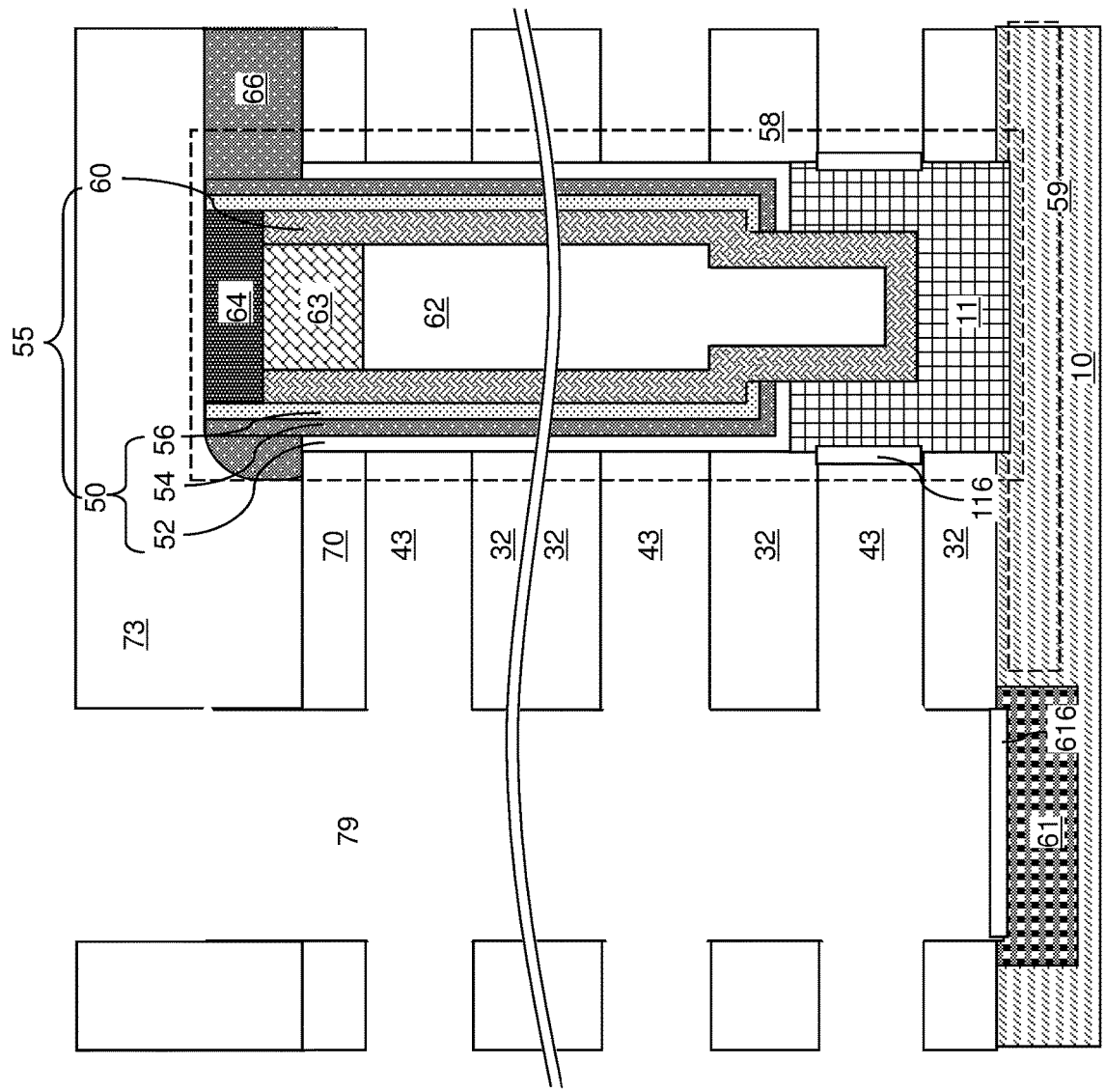
FIGS. 12A-12C are sequential vertical cross-sectional views of a region of the first exemplary structure during formation of electrically conductive layers according to the first embodiment of the present disclosure.

Referring to FIG. 12A, physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 12B:
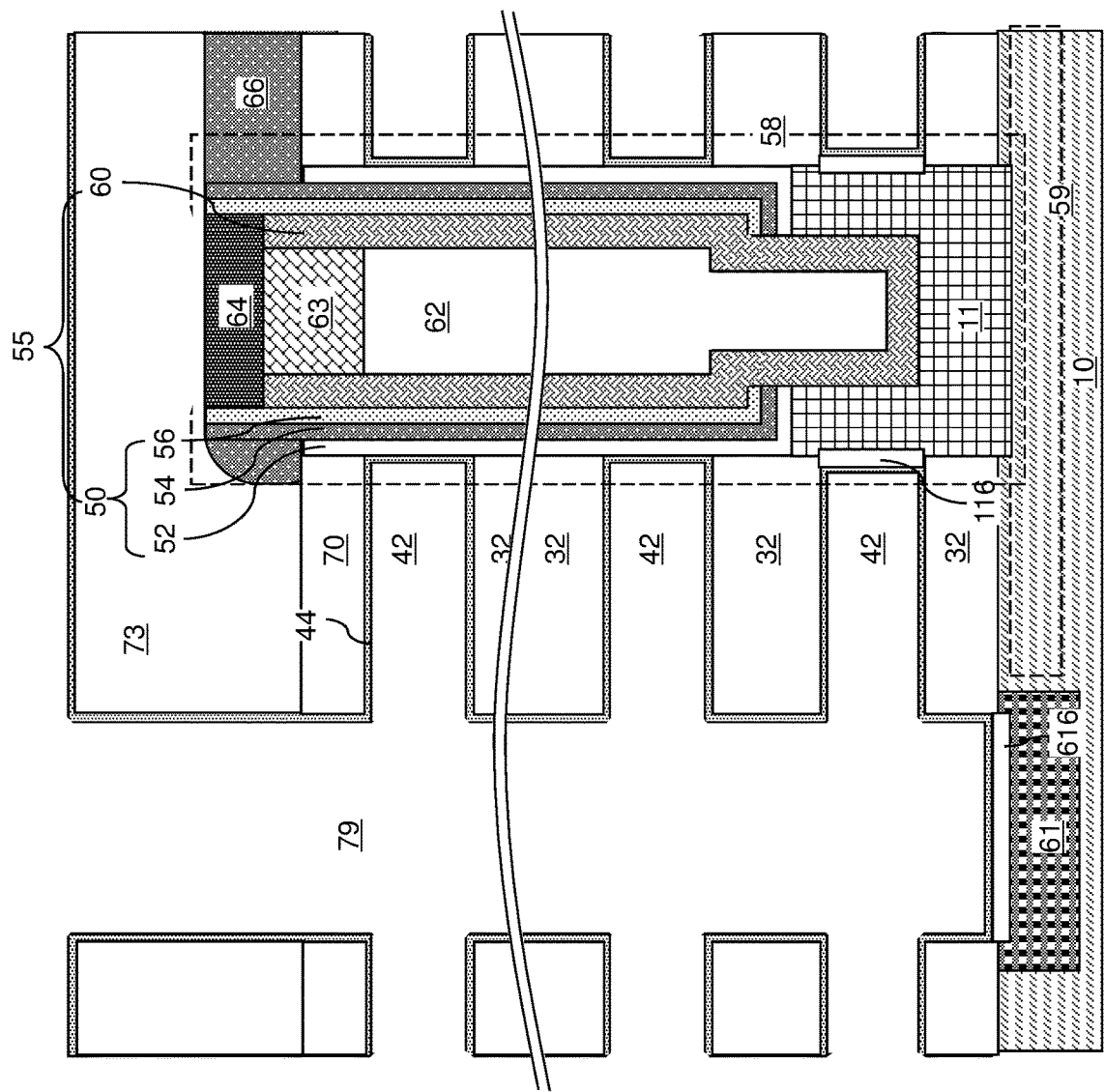

Referring to FIG. 12B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity is present within the portion of each backside trench 79 that is not filled with the backside blocking dielectric layer 44.

Figure 12C:
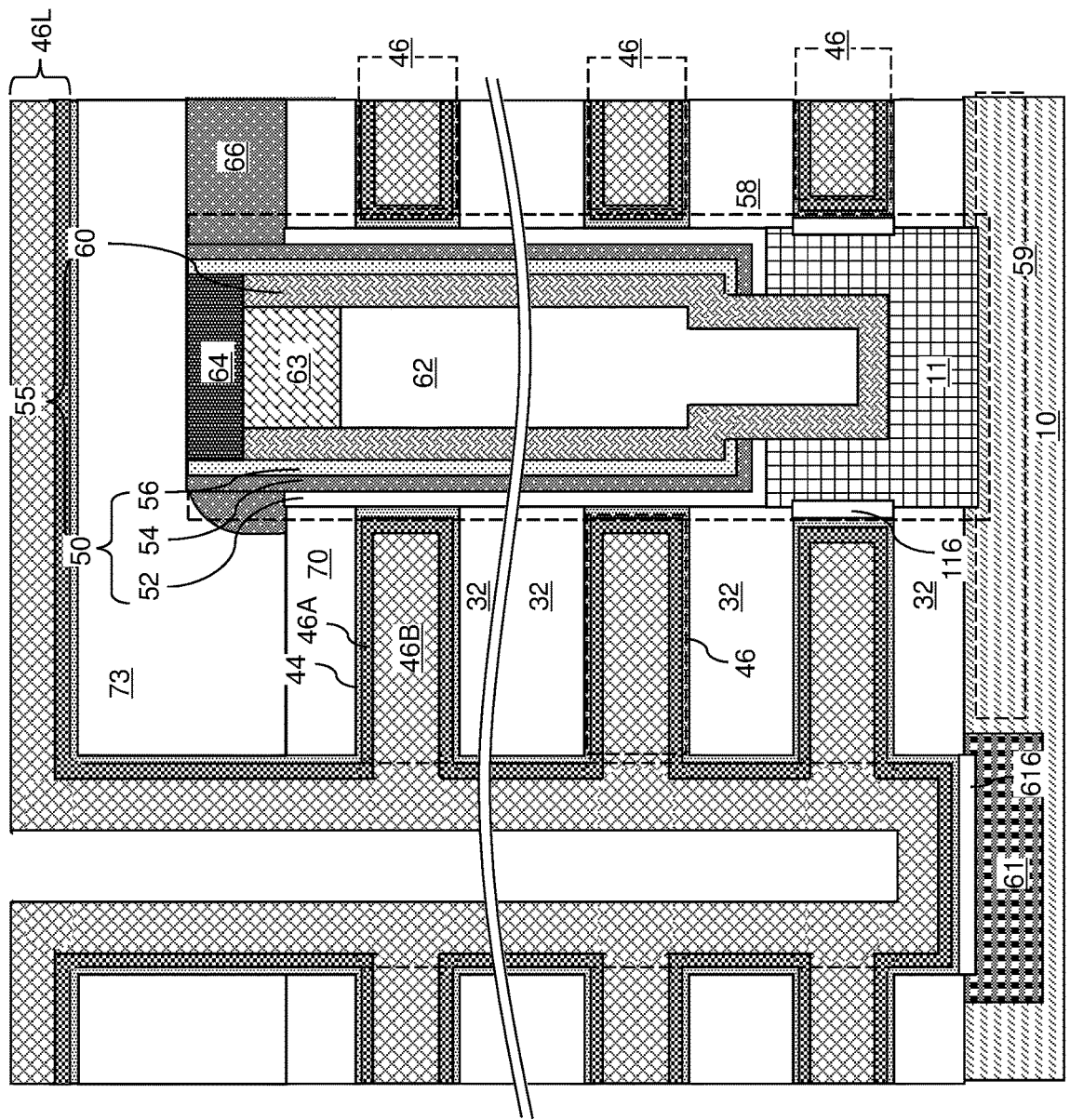

Referring to FIG. 12C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 13A:
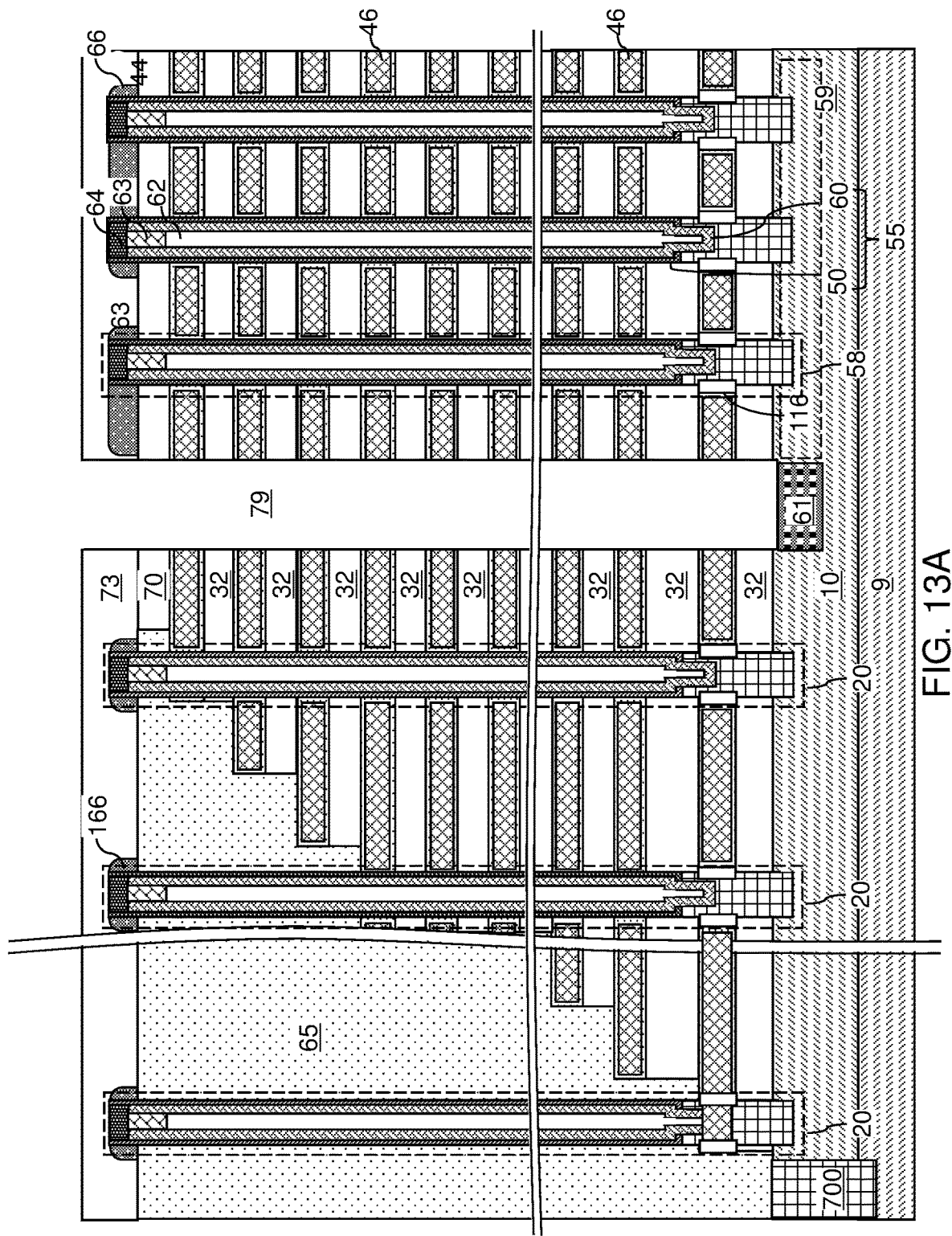
FIG. 13A is a schematic vertical cross-sectional view of the first exemplary structure after removal of a deposited conductive material from within the backside trench according to the first embodiment of the present disclosure.
Figure 13B:
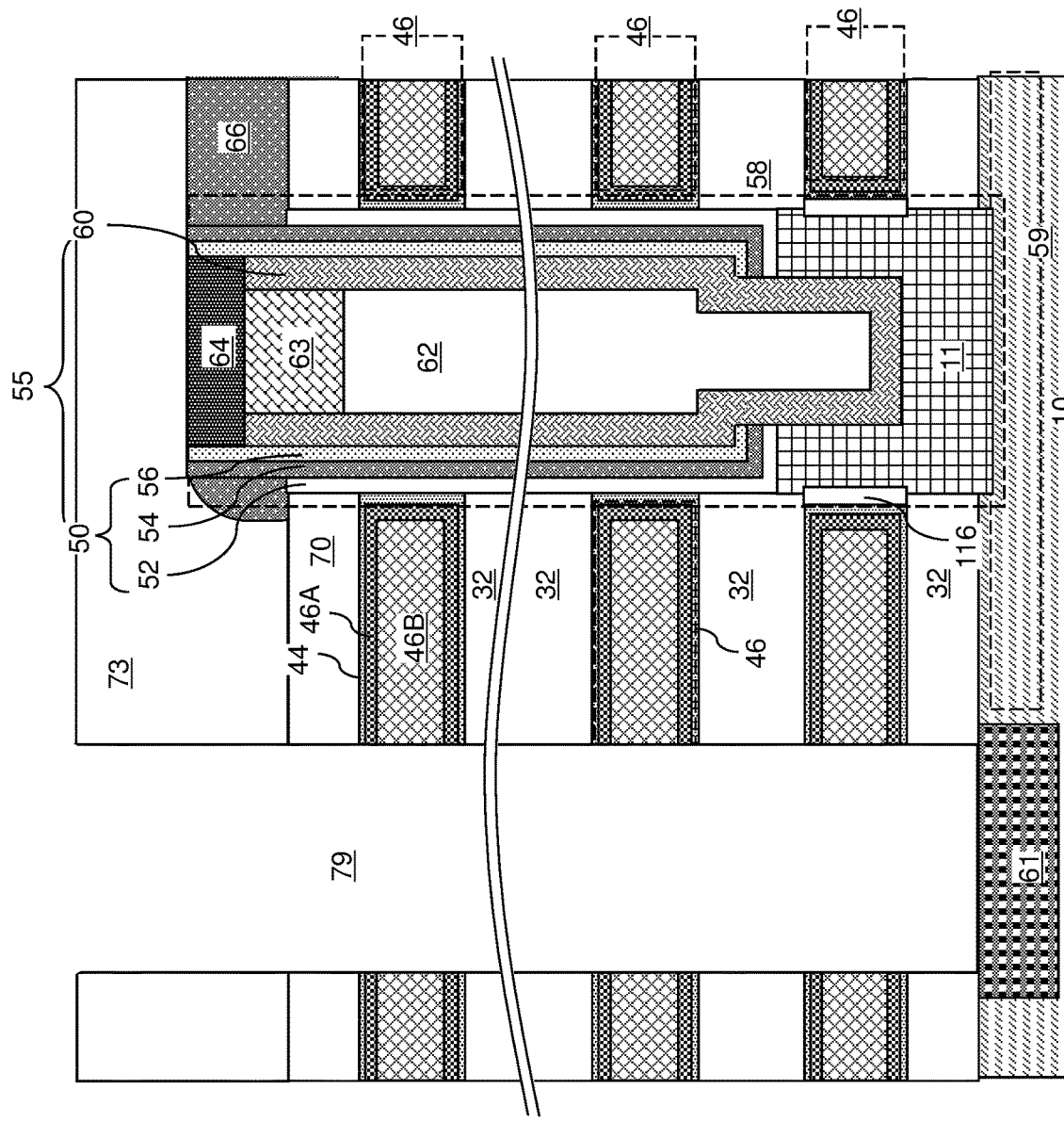
FIG. 13B is a magnified view of a region of FIG. 13A.

Referring to FIGS. 13A and 13B, the deposited metallic material of the continuous metallic material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous metallic material layer 46L can be selective to the material of the backside blocking dielectric layer 44. In this case, a horizontal portion of the backside blocking dielectric layer 44 can be present at the bottom of each backside trench 79. In another embodiment, the removal of the continuous metallic material layer 46L may not be selective to the material of the backside blocking dielectric layer 44 or, the backside blocking dielectric layer 44 may not be employed. The planar dielectric portions 616 can be removed during removal of the continuous metallic material layer 46L. A backside cavity is present within each backside trench 79.

Figure 14:
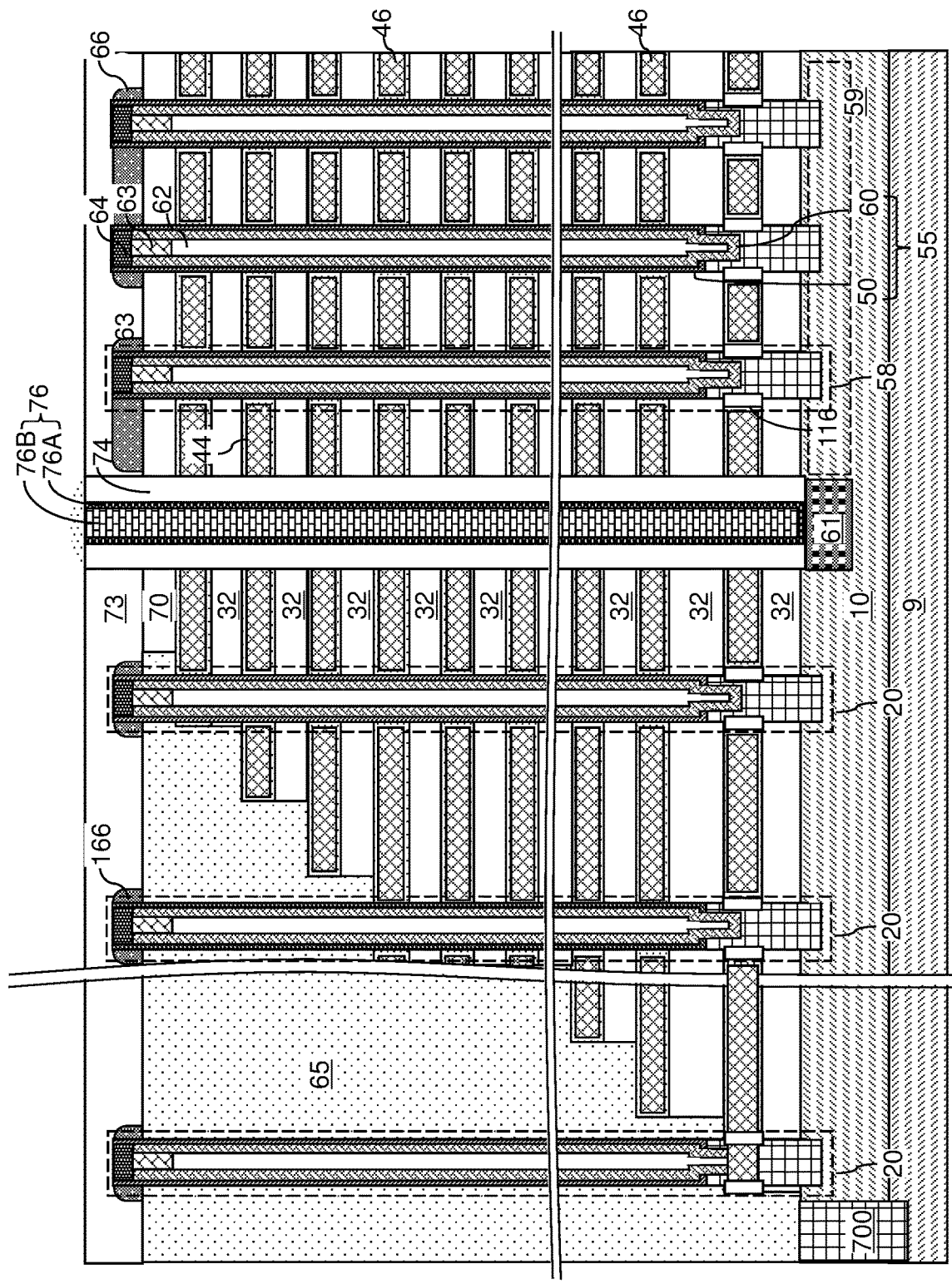
FIG. 14 is a schematic vertical cross-sectional view of the first exemplary structure after formation of an insulating spacer and a backside contact structure in each backside trench according to the first embodiment of the present disclosure.

Referring to FIG. 14, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44. Generally, a backside contact via structure 76 can be formed within each of the backside trenches 79 after formation of the insulating spacers 74 by depositing and planarizing at least one conductive material in volumes of the backside trenches 79 that are not filled with the insulating spacers 74.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact an side of the lower portion of the semiconductor channel 60.

Figure 15A:
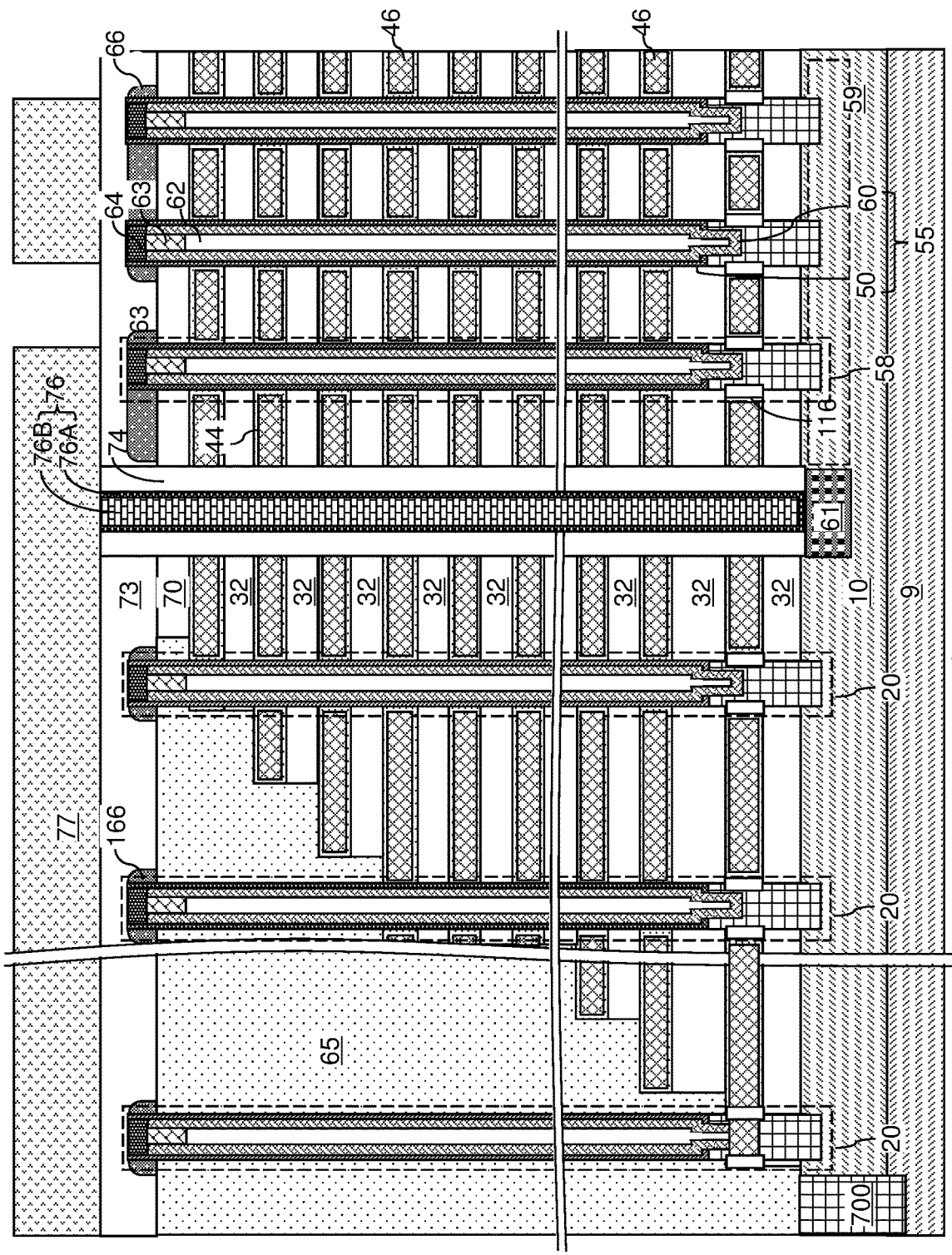
FIG. 15A is a schematic vertical cross-sectional view of the first exemplary structure after formation of a patterned photoresist layer over the contact-level dielectric layer according to the first embodiment of the present disclosure.
Figure 15B:
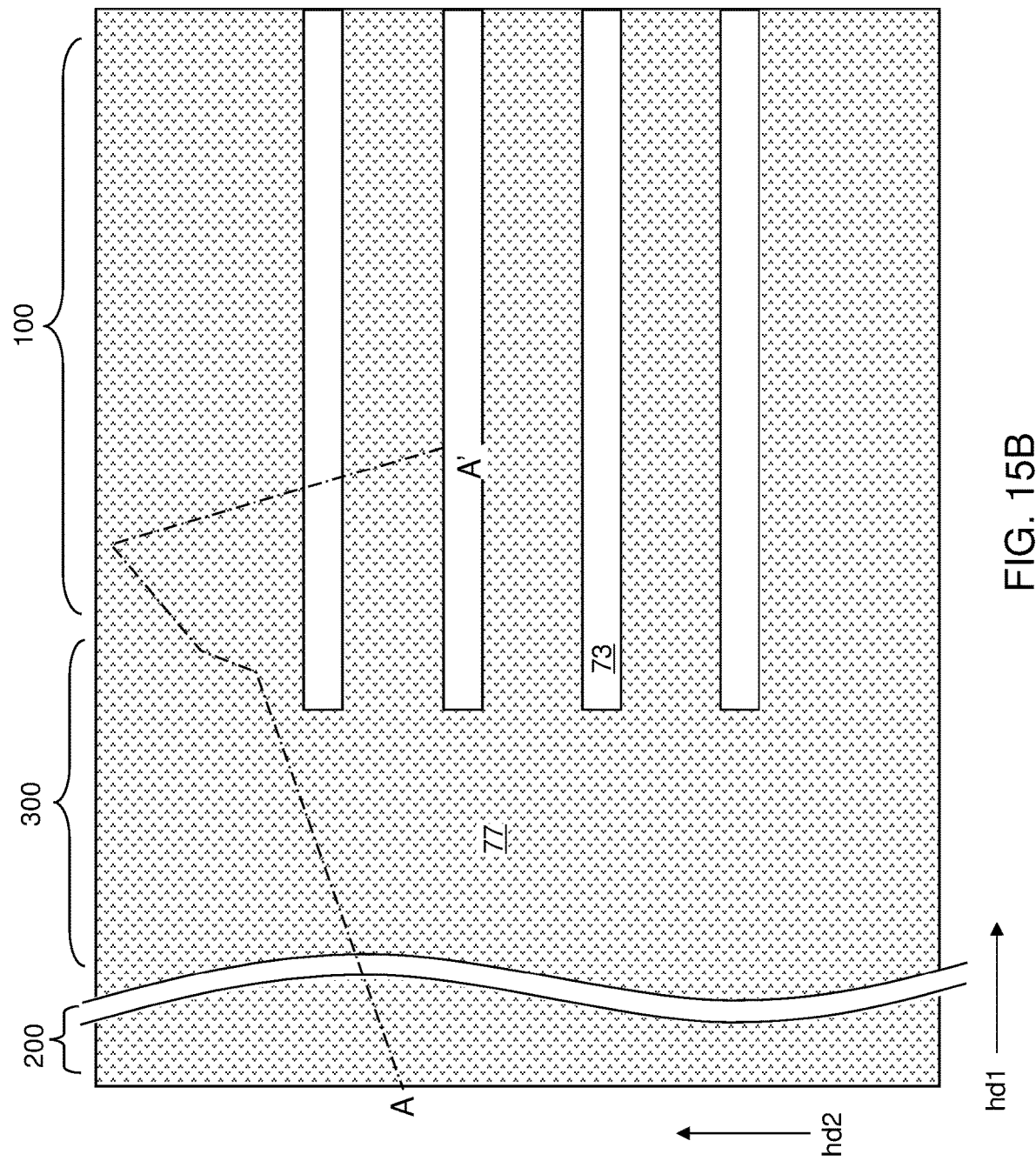
FIG. 15B is a top-down view of the first exemplary structure of FIG. 15A. The vertical plane A-A' is the plane of the cross-section for FIG. 15A.

Referring to FIGS. 15A and 15B, a patterned photoresist layer 77 can be formed over the contact-level dielectric layer by applying and lithographically patterning a photoresist material. The patterned photoresist layer 77 includes line-shaped openings that are formed over areas of gaps between neighboring pairs of the dielectric plates 66 of the plurality of dielectric plates 66. In one embodiment, the line-shaped openings in the patterned photoresist layer 77 can have a pair of straight lengthwise sidewalls that laterally extend along the first horizontal direction hd1. The line-shaped openings in the patterned photoresist layer 77 can have a uniform width along the second horizontal direction hd2. Each straight lengthwise sidewall of the patterned photoresist layer 77 may overlie a respective set of vertically straight and laterally convex sidewall segments of a laterally undulating lengthwise sidewall of a respective underlying dielectric plate 66.

Figure 16A:
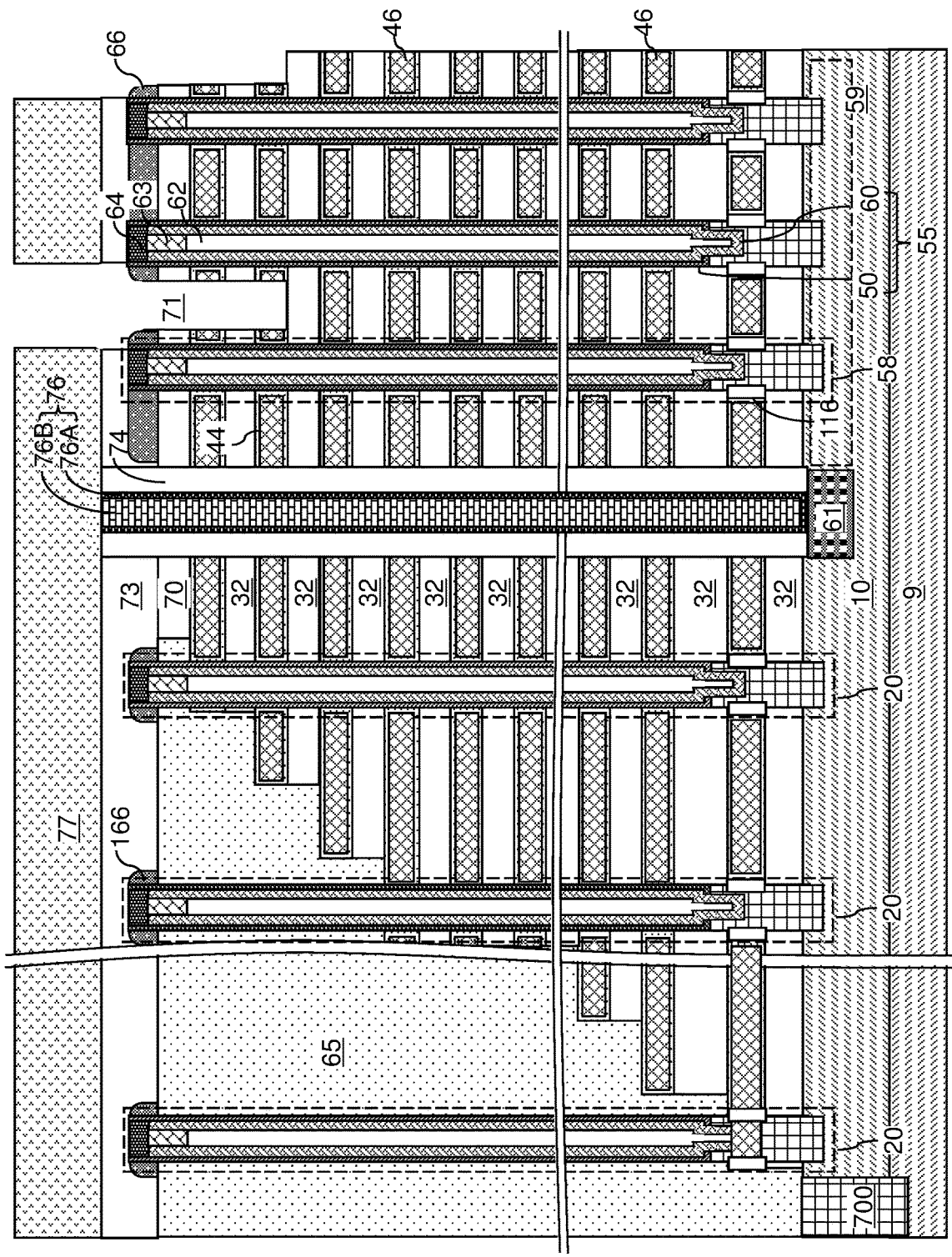
FIG. 16A is a schematic vertical cross-sectional view of the first exemplary structure after formation of drain-select-level isolation trenches according to the first embodiment of the present disclosure.
Figure 16B:
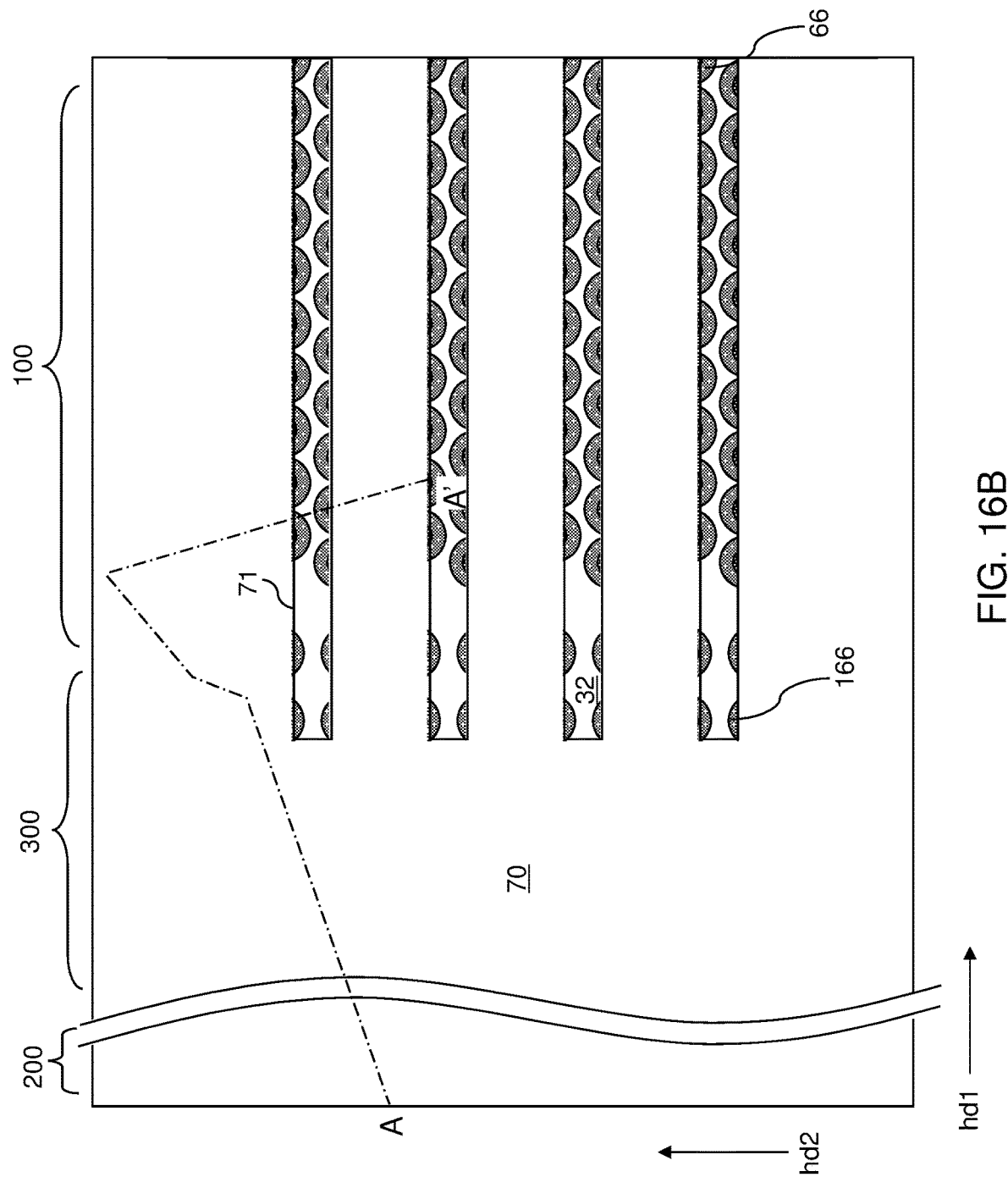
FIG. 16B is a top-down view of the first exemplary structure of FIG. 16A. The vertical plane A-A' is the plane of the cross-section for FIG. 16A.

Referring to FIGS. 16A and 16B, an anisotropic etch process can be performed to etch unmasked portions of the contact-level dielectric layer 73 and a subset of layers of the alternating stack (32, 46) employing a combination of the photoresist layer 77 and the plurality of dielectric plates 66 as an etch mask. The anisotropic etch process can have an etch chemistry that etches the materials of the contact-level dielectric layer 73, the insulating cap layer 70, the electrically conductive layers 46, and the insulating layers 32. Drain-select-level cavities 71 are formed within volumes from which materials of the contact-level dielectric layer 73, the insulating cap layer 70, the electrically conductive layers 46, and the insulating layers 32 are removed. The drain-select-level cavities 71 vertically extend through each drain select level, i.e., through each level of the electrically conductive layers 46 that are employed to activate or deactivate a group of memory stack structures 55 from the drain side. The total number of drain-select-level electrically conductive layers, i.e., the total number of electrically conductive layers 46 through which a single drain-select-level cavity 71 cuts through, can be in a range from 1 to 12, such as from 2 to 6. The photoresist layer 77 can be subsequently removed, for example, by ashing.

The dielectric plates 66 act as an etch mask to protect the drain regions 63 during the anisotropic etch process. Therefore, even if there is a misalignment between the openings in the photoresist layer 77 and the locations of the drain regions 63, the anisotropic etch process does not etch into or damage the drain regions 63. Therefore, potential short circuits and other drain region damage may be avoided by using the dielectric plates 66 as a mask. Thus, all drain regions 63 may have a fully cylindrical shape having a horizontal cross-sectional shape of a full circle. Furthermore, the anisotropic etch process proceeds at a faster speed by etching the electrically conductive layers 46 together with the silicon oxide insulating layers 32, rather than etching silicon nitride sacrificial layers 42 together with the silicon oxide insulating layers 32. Thus, the drain-select-level cavities 71 do not cut into any drain regions 63 or memory opening fill structures 58.

Figure 17A:
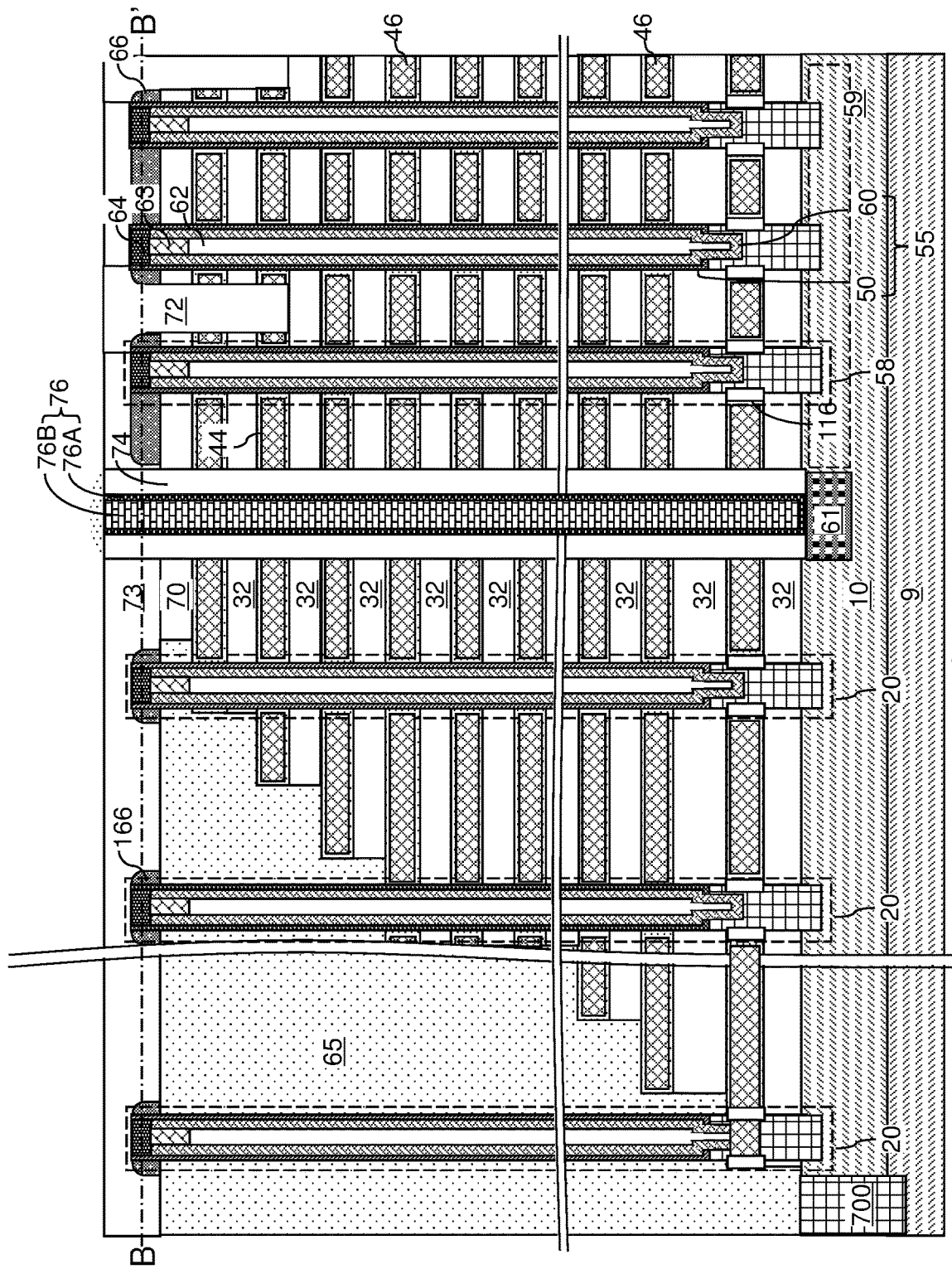
FIG. 17A is a schematic vertical cross-sectional view of the first exemplary structure after formation of drain-select-level isolation structures according to the first embodiment of the present disclosure.
Figure 17B:
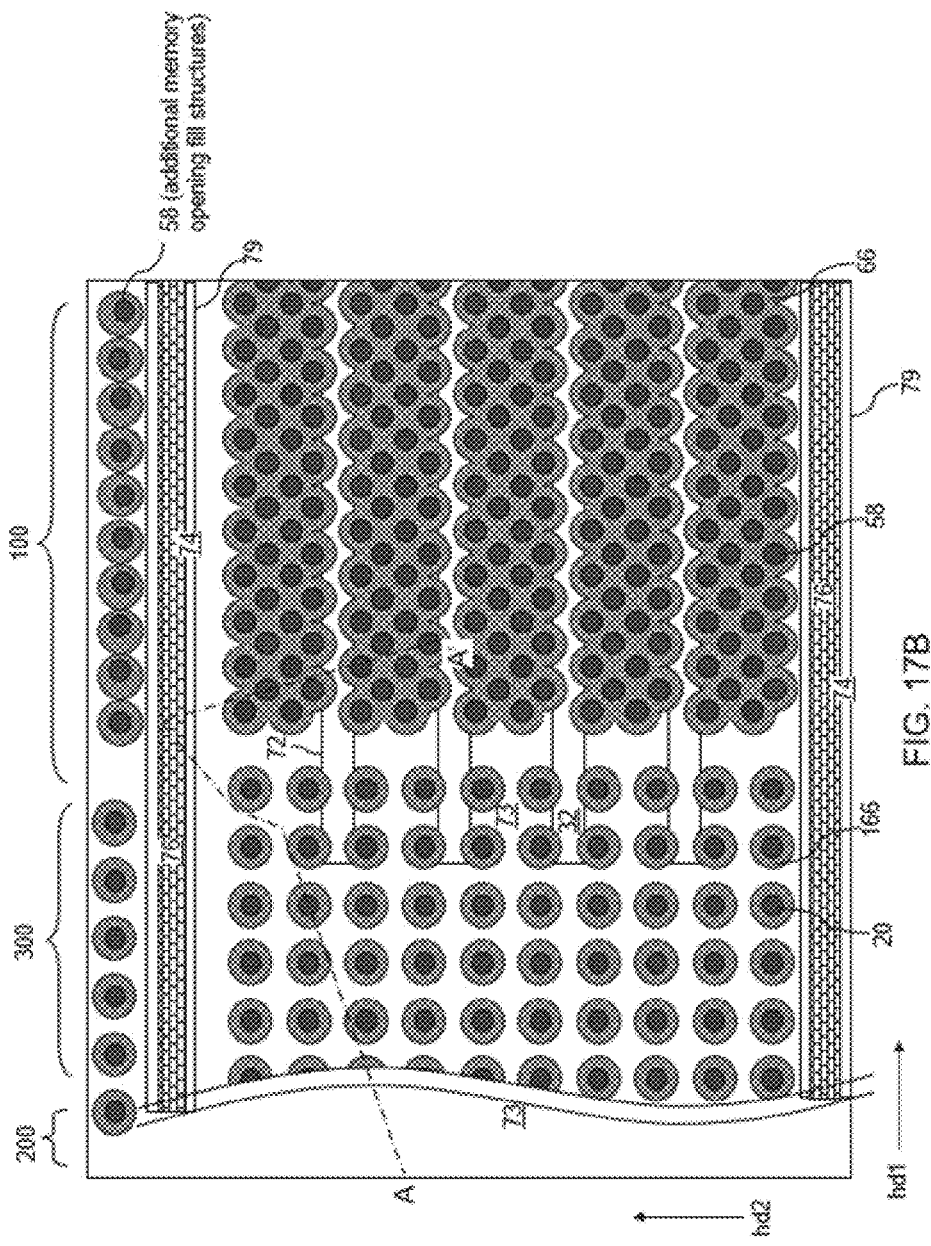
FIG. 17B is a horizontal cross-sectional view of the first exemplary structure along the horizontal plane B-B' of FIG. 17A. The vertical plane A-A' is the plane of the cross-section for FIG. 17A.

Referring to FIGS. 17A and 17B, a dielectric fill material can be deposited in the drain-select-level cavities 71 by a conformal deposition process. The dielectric fill material may comprise, for example, silicon oxide. Each portion of the dielectric fill material that fills a respective drain-select-level cavity 71 constitutes a drain-select-level isolation structure 72. Portions of the dielectric fill material that are deposited over the contact-level dielectric layer 73 may be removed by a planarization process such as a recess etch process, or may be incorporated into the contact-level dielectric layer 73. In case a horizontally-extending portion of the dielectric fill material is incorporated into the contact-level dielectric layer 73, the contact-level dielectric layer 73 may include a lower contact-level dielectric sublayer and an upper contact-level dielectric sublayer that includes the drain-select-level isolation structure 72 as downward-protruding material portions.

The drain-select-level isolation structures 72 are formed between a respective neighboring pair of arrays 68 of memory opening fill structures 58 through gaps between neighboring pairs of the dielectric plates 66 into a subset of layers within the alternating stack of insulating layers 32 and electrically conductive layers 46. Preferably, dummy memory opening fill structures are not located under the drain-select-level isolation structures 72. A dummy memory opening fill structure is an electrically inactive structure which is not electrically connected to any bit line. As shown in FIG. 17B, each of the drain-select-level isolation structures 72 comprises a respective pair of lengthwise laterally-undulating sidewalls that underlie, and are vertically coincident with, a subset of sidewall segments of a respective neighboring pair of dielectric plates 66 of the plurality of dielectric plates 66. Thus, the drain-select-level isolation structures 72 do not cut into any drain regions 63 or memory opening fill structures 58.

In one embodiment, top surfaces of the drain-select-level isolation structures 72 can be located within a same horizontal plane as a top surface of the contact-level dielectric layer 73. In one embodiment shown in FIG. 17A, each of the drain-select-level isolation structures 72 comprises a pair of straight sidewalls that laterally extend along the first horizontal direction hd1 and overlying the top surface of a respective dielectric plate 66. Each straight sidewall in the pair of straight sidewalls contacts a top surface of a respective one of the plurality of dielectric plates 66.

In one embodiment, each of the drain-select-level isolation structures 72 vertically extends through a first subset of the electrically conductive layers 46 that is located at drain select levels (which function as drain side select gate electrodes) and does not extend into a second subset of the electrically conductive layers 46 (which function as word lines) that is located at word line levels that underlie the drain select levels. In one embodiment, the drain-select-level cavities 71 have laterally undulating sidewalls because the dielectric plates 66 having undulating sidewalls being used as an etch mask to etch the drain-select-level cavities 71. Therefore, each of the drain-select-level isolation structures 72 which fills the respective drain-select-level cavity 71 comprises a respective pair of laterally undulating lengthwise sidewalls including a respective contiguous set of vertically straight and laterally concave sidewall segments that are adjoined to each other, and contacting laterally undulating lengthwise sidewalls of the insulating layers 32 and electrically conductive layers 46 located at the drain select levels.

In one embodiment, each of the respective pair of laterally undulating lengthwise sidewalls of a drain-select-level isolation structure 72 comprises: an upper surface portion contacting a laterally-undulating lengthwise sidewall of one of the plurality of dielectric plates 66; and a lower surface portion contacting at least one laterally-undulating lengthwise sidewall of one or more of the insulating layers 32. Each of the at least one laterally-undulating lengthwise sidewall of one or more of the insulating layers 32 comprises a respective contiguous set of vertically straight and laterally concave sidewall segments of a respective insulating layer 32 that are adjoined to each other.

Figure 18A:
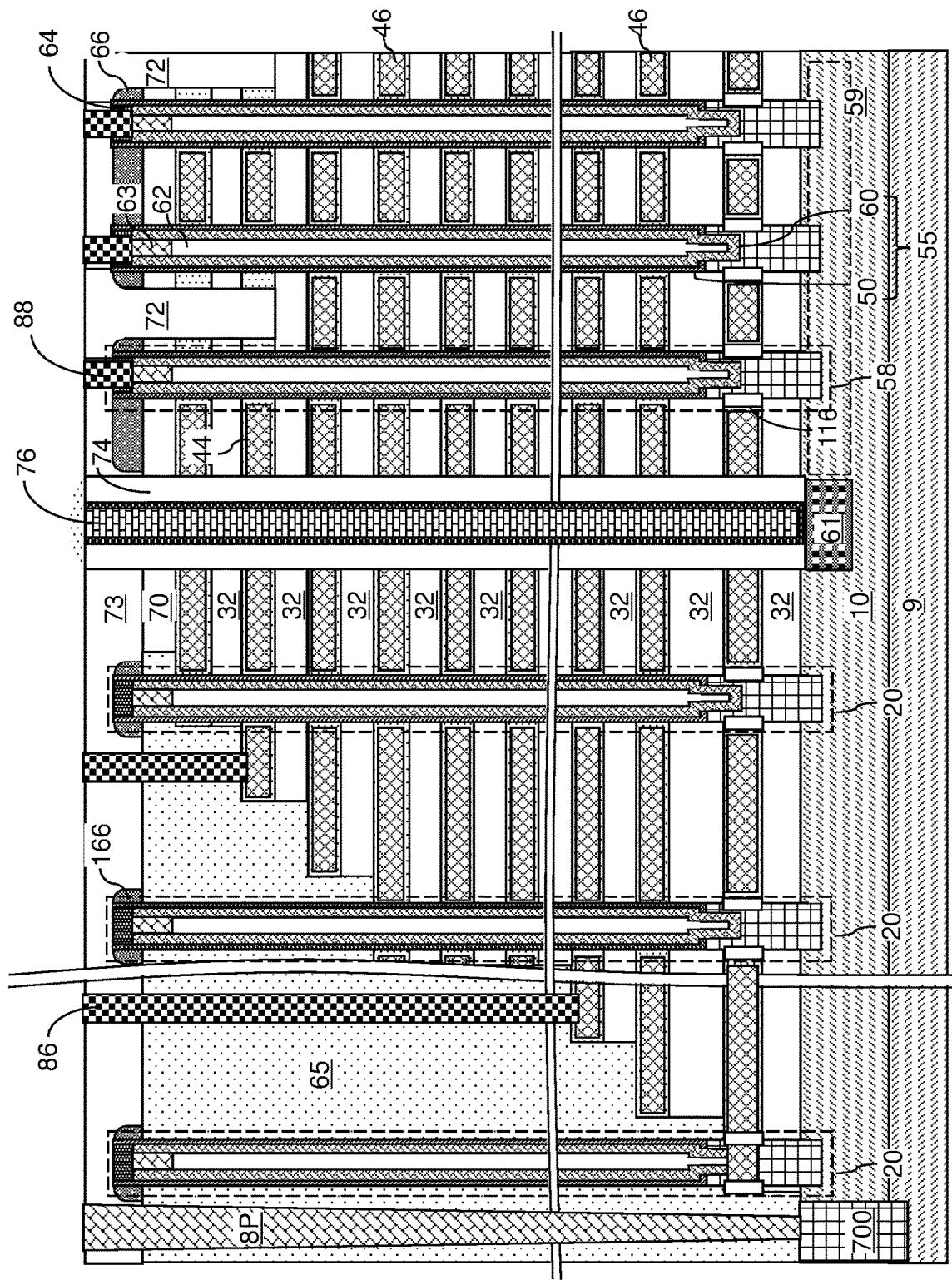
FIG. 18A is a schematic vertical cross-sectional view of the first exemplary structure after formation of additional contact via structures according to the first embodiment of the present disclosure.
Figure 18B:
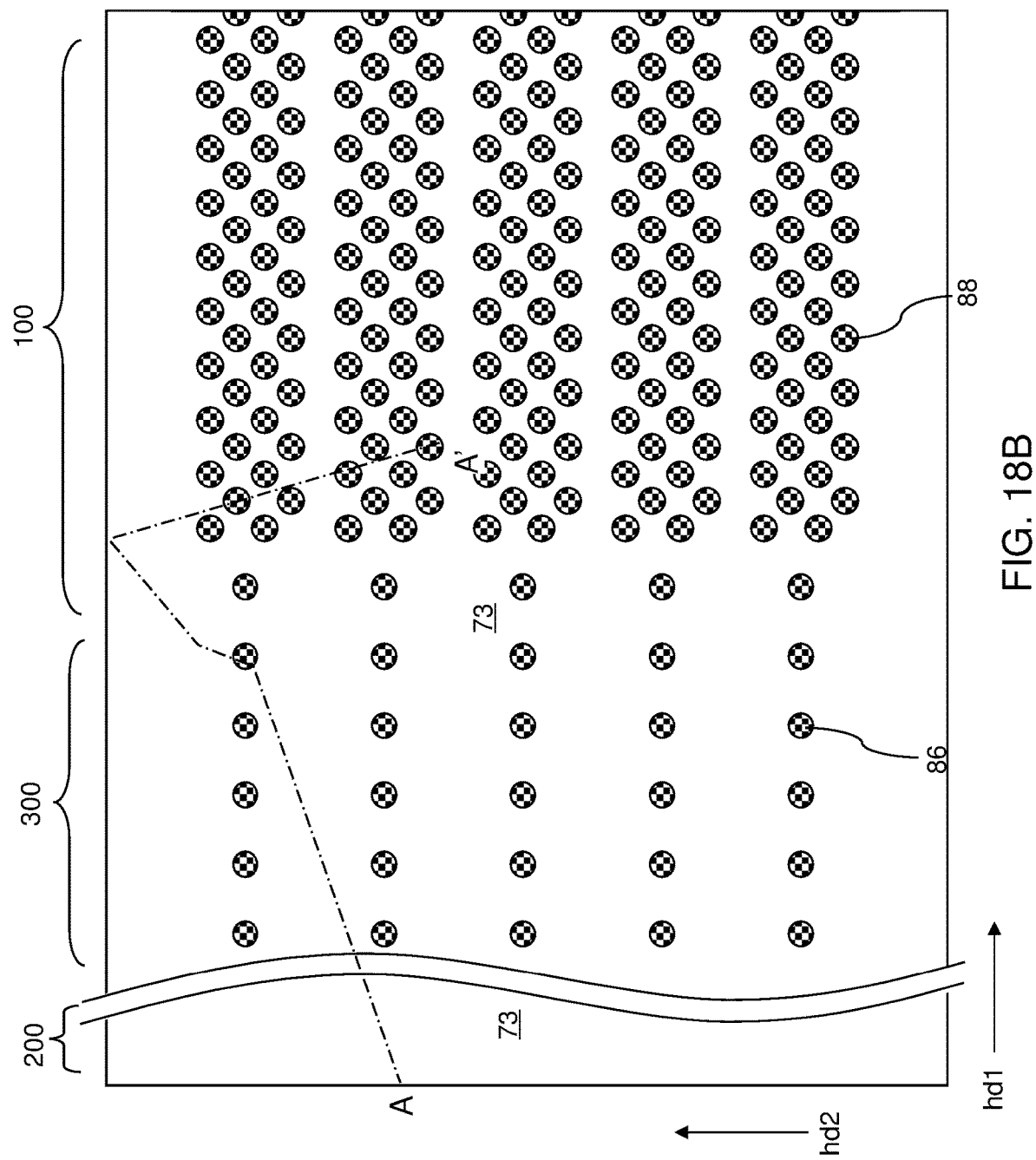
FIG. 18B is a top-down view of the first exemplary structure of FIG. 18A. The vertical plane A-A' is the plane of the schematic vertical cross-sectional view of FIG. 18A.

Referring to FIGS. 18A and 18B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Figure 19A:
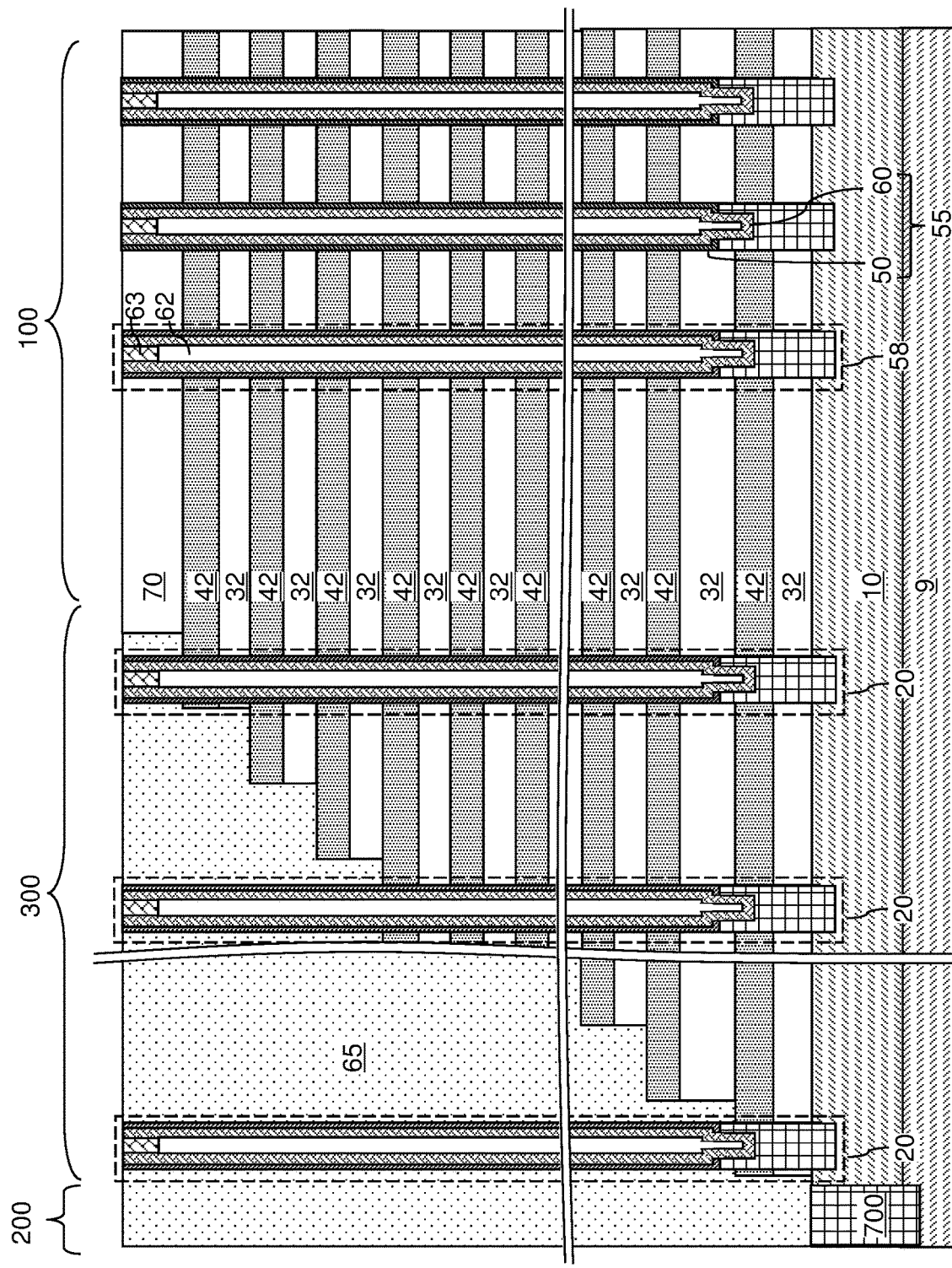
FIG. 19A is a schematic vertical cross-sectional view of a second exemplary structure after formation of memory stack structures and support pillar structures according to the second embodiment of the present disclosure.
Figure 19B:
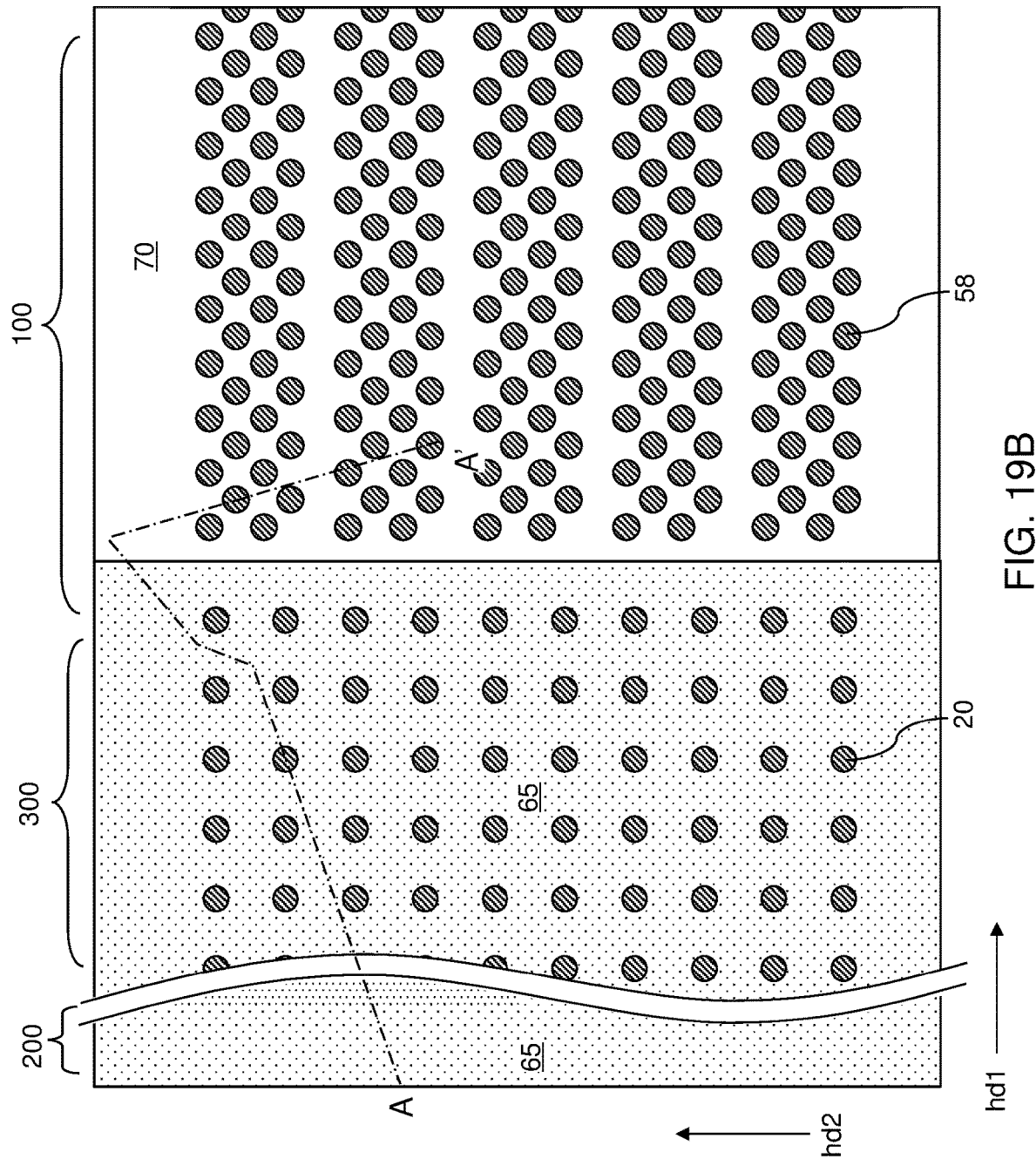
FIG. 19B is a top-down view of the second exemplary structure of FIG. 19A. The vertical plane A-A' is the plane of the cross-section for FIG. 19A.

Referring to FIGS. 19A and 19B, a second exemplary structure according to a second embodiment of the present disclosure can be derived from the first exemplary structure of FIGS. 6A and 6B by omitting the processing steps of FIGS. 5I-5K. Thus, each memory opening fill structure 58 includes a drain region 63 having a top surface within a same horizontal plane as the top surface of the insulating cap layer 70. In other words, the dielectric cap structures 64 of the first exemplary structure are omitted in the second exemplary structure.

Figure 20:
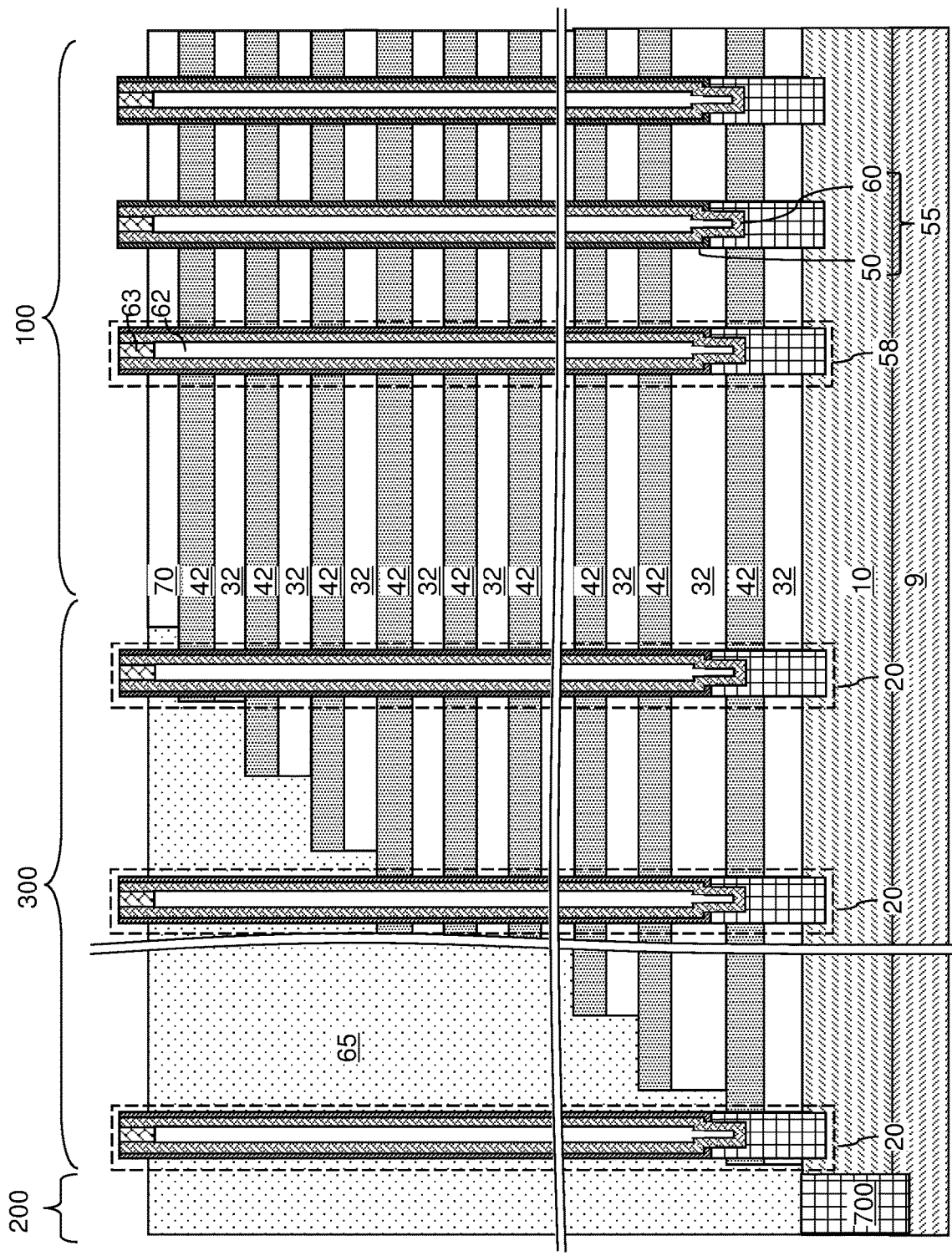
FIG. 20 is a schematic vertical cross-sectional view of the second exemplary structure after vertically recessing the insulating cap layer and the retro-stepped dielectric material portion according to the second embodiment of the present disclosure.
Figure 21A:
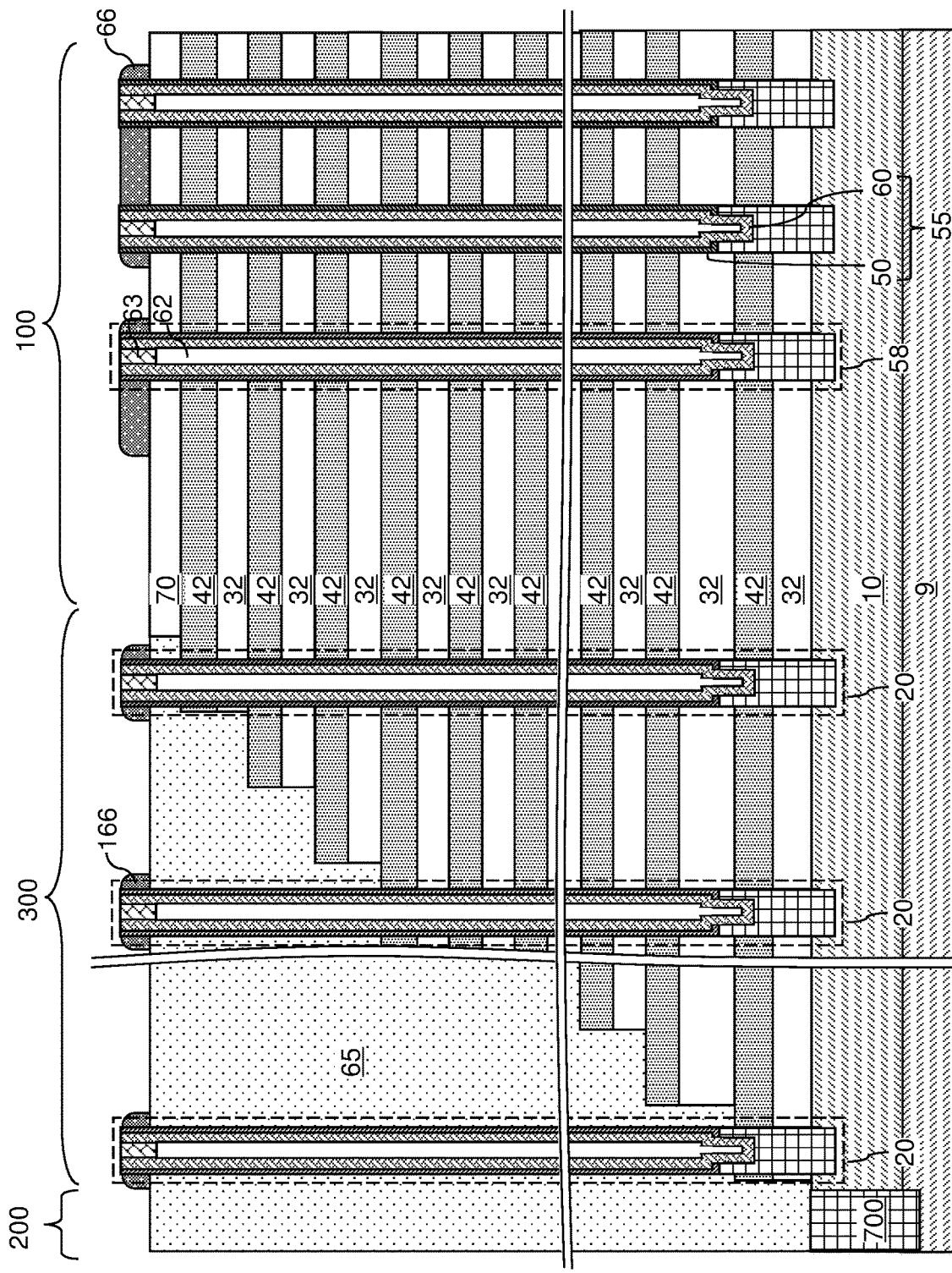
FIG. 21A is a schematic vertical cross-sectional view of the second exemplary structure after formation of dielectric plates and discrete annular dielectric spacers according to the second embodiment of the present disclosure.
Figure 21B:
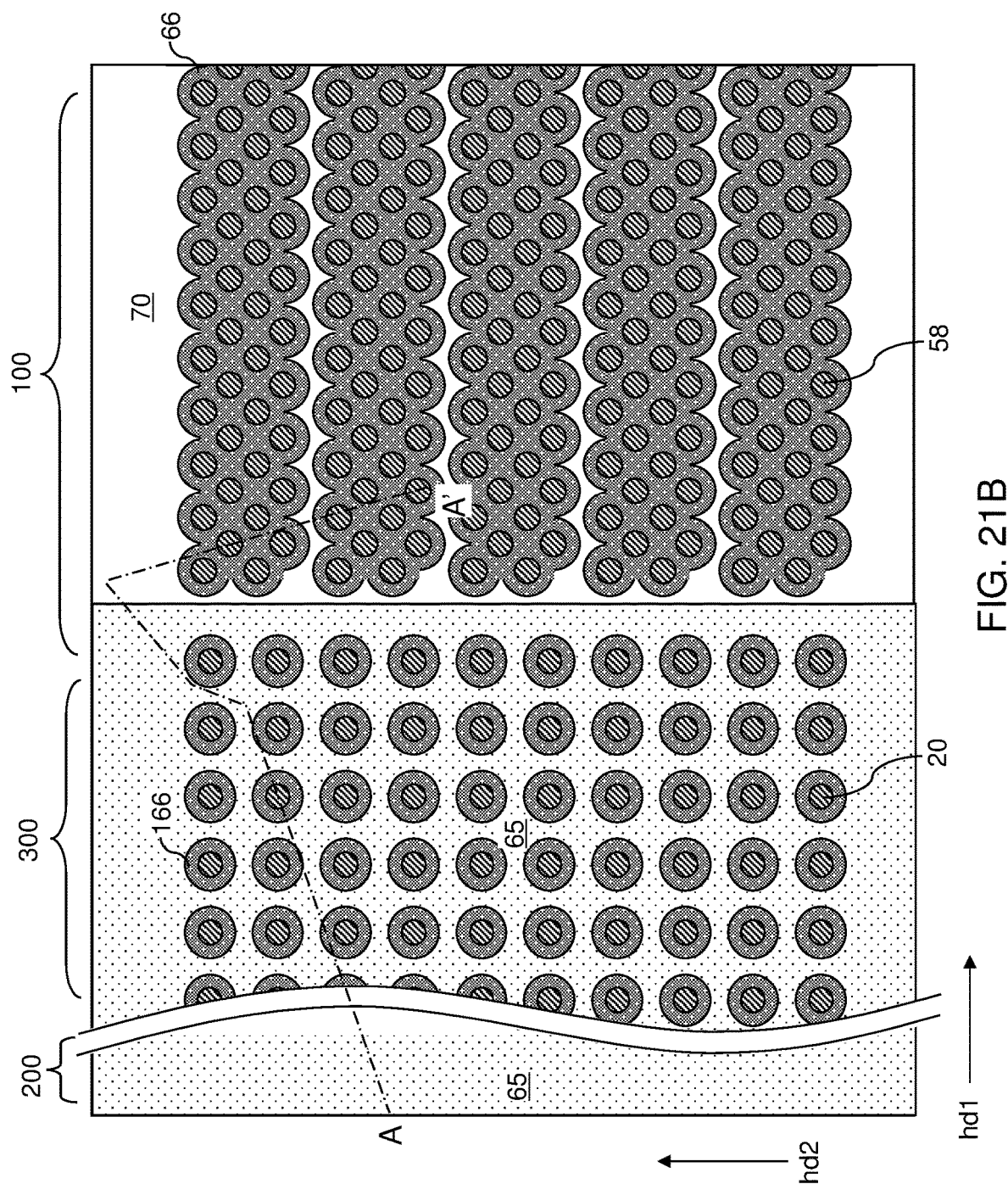
FIG. 21B is a top-down view of the second exemplary structure of FIG. 21A. The vertical plane A-A' is the plane of the cross-section for FIG. 21A.

Referring to FIG. 20, the top surface of the insulating cap layer 70 can be vertically recessed selective to the semiconductor material of the drain regions 63 and optionally selective to one or more of the dielectric materials within the memory films 50. The top surface of the retro-stepped dielectric material portion 65 can be collaterally vertically recessed. The drain regions 63 and top portions of the memory films 50 can vertically protrude above the horizontal plane including the recessed top surface of the insulating cap layer 70. For example, if the insulating cap layer 70 includes silicon oxide, a wet etch process employing dilute hydrofluoric acid can be employed. The vertical recess distance of the recess etch process may be in a range from 5 nm to 40 nm, such as from 10 nm to 20 nm, although lesser Referring to FIGS. 21A and 21B, the processing steps of FIGS. 8A and 8B can be performed to form dielectric plates 66 and discrete annular dielectric spacers 166. In one embodiment, the chemistry of the anisotropic etch process that etches the dielectric material layer may be selected to minimize collateral etching of the drain regions 63.

Figure 21C:
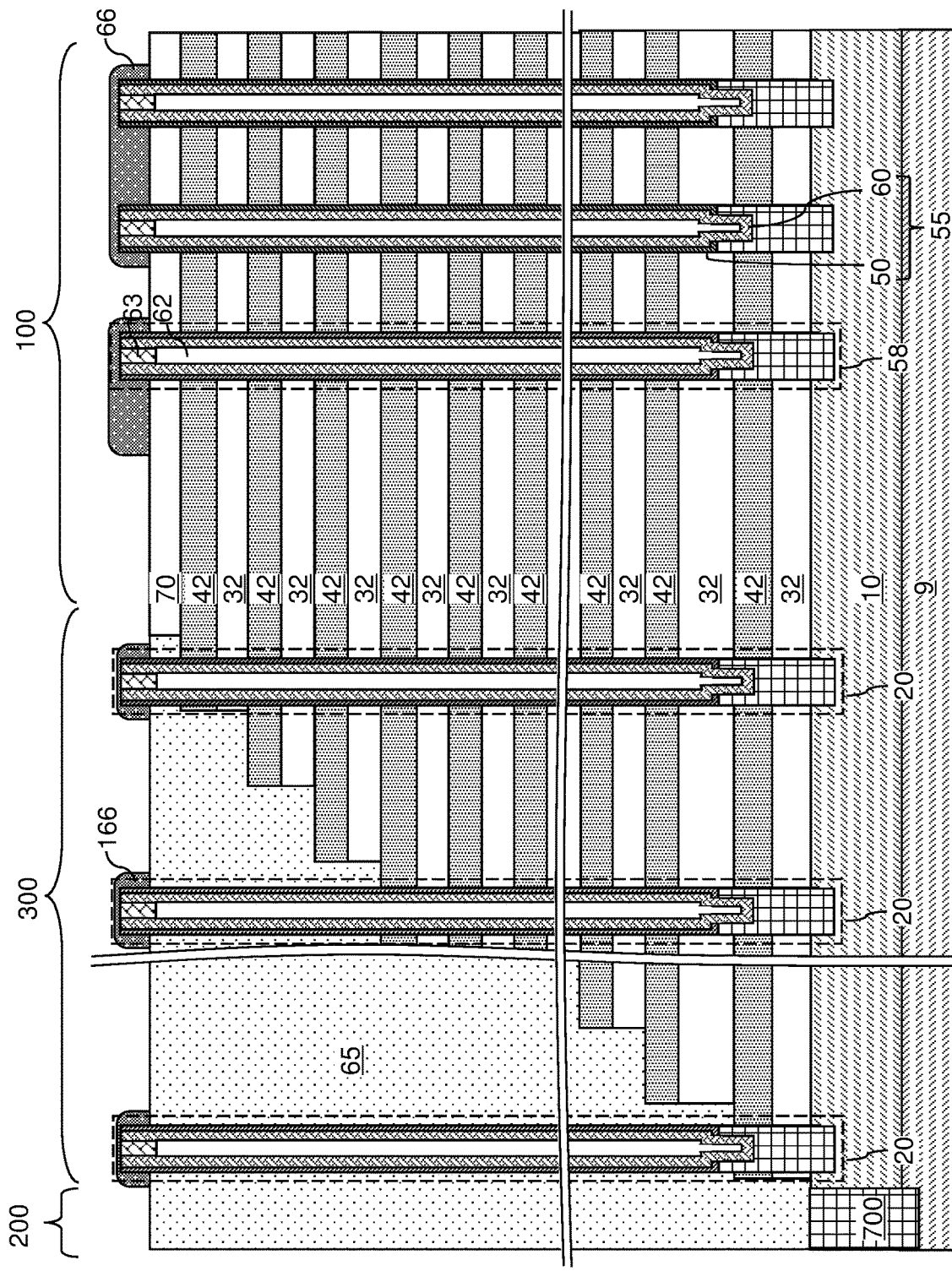
FIG. 21C is a schematic vertical cross-sectional view of an alternative configuration of the second exemplary structure after formation of dielectric plates and discrete annular dielectric spacers according to an alternative aspect of the second embodiment of the present disclosure.

In an alternative embodiment shown in FIG. 21C, a portion of the dielectric material layer (e.g., silicon nitride layer) may be left on top of the drain regions 63 after the anisotropic etching step. In this alternative embodiment, the dielectric plates 66 are also located on top of the drain regions 63.

Figure 22:
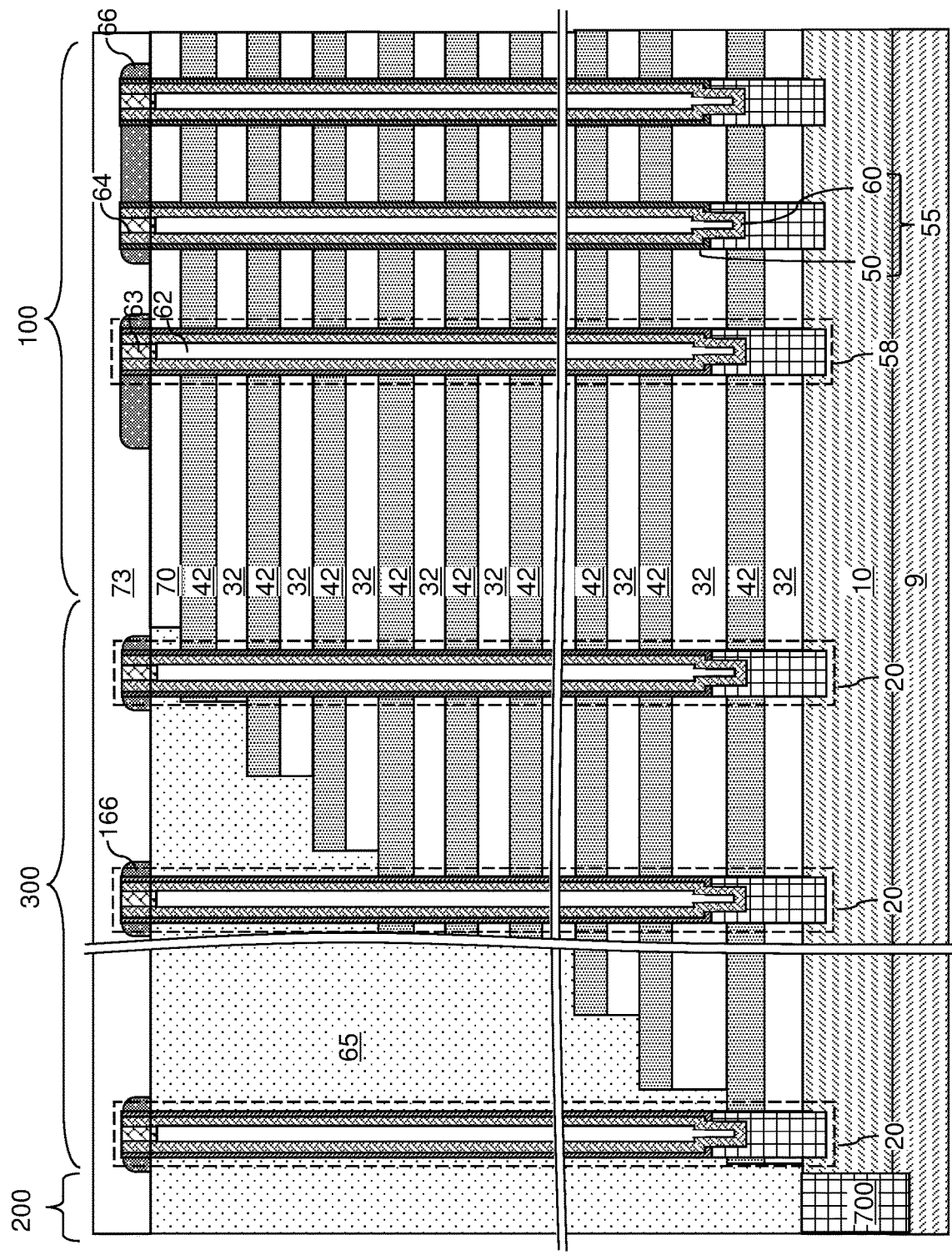
FIG. 22 is a schematic vertical cross-sectional view of the second exemplary structure after formation of a contact-level dielectric layer according to the second embodiment of the present disclosure.

Referring to FIG. 22, a contact-level dielectric layer can be formed by performing the processing steps of FIG. 9.

Figure 23:
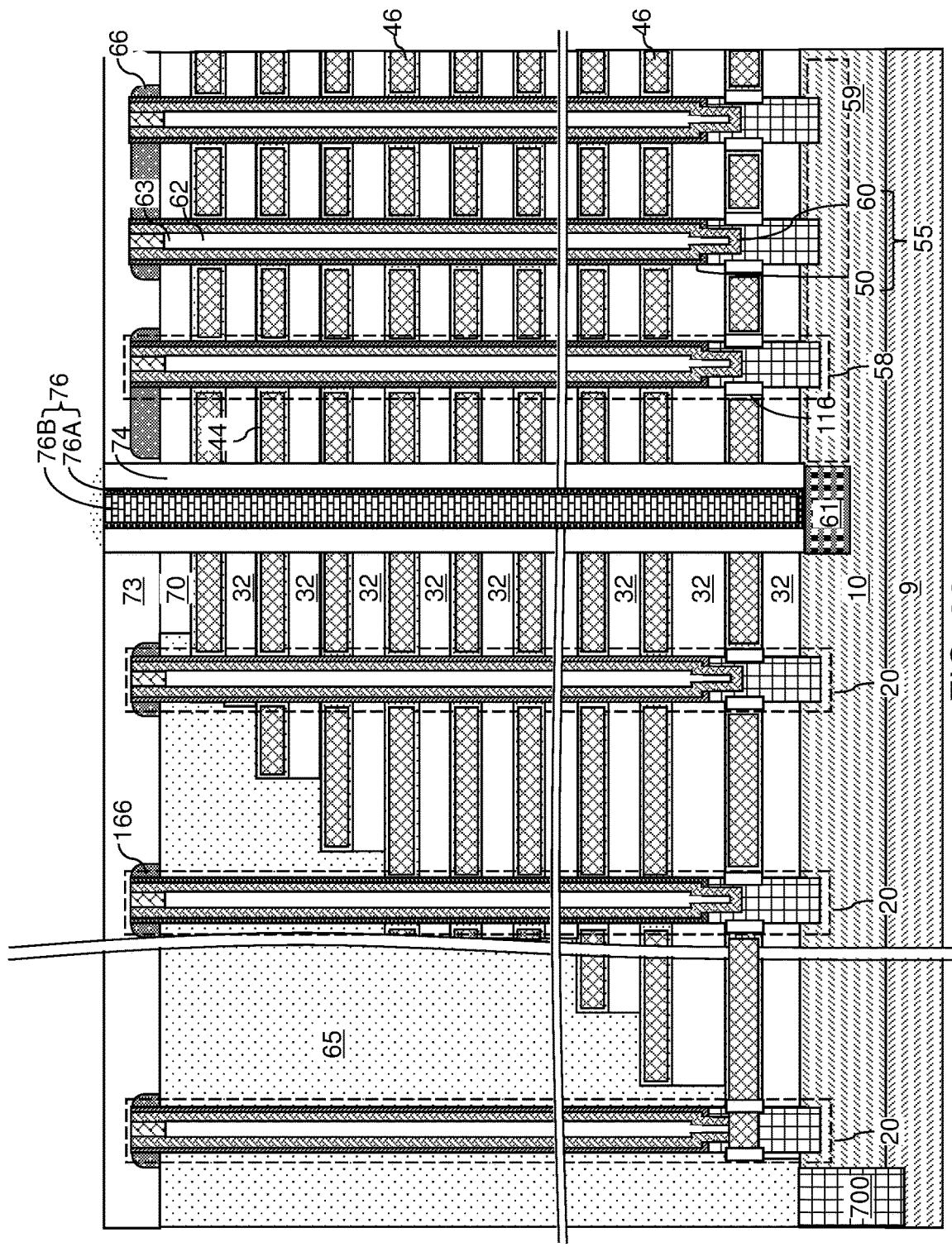
FIG. 23 is a schematic vertical cross-sectional view of the second exemplary structure after formation of an insulating spacer and a backside contact structure in each backside trench according to the second embodiment of the present disclosure.

Referring to FIGS. 23A and 23B, the processing steps of FIGS. 10A-10C, 11A and 11B, 12A-12C, 13A and 13B, and 14 can be performed to form backside trenches 79, to form source regions 61, to replace the sacrificial material layers 42 with electrically conductive layers 46, and to form an insulating spacer 74 and a backside contact via structure 76 within each backside trench 79.

Figure 24A:
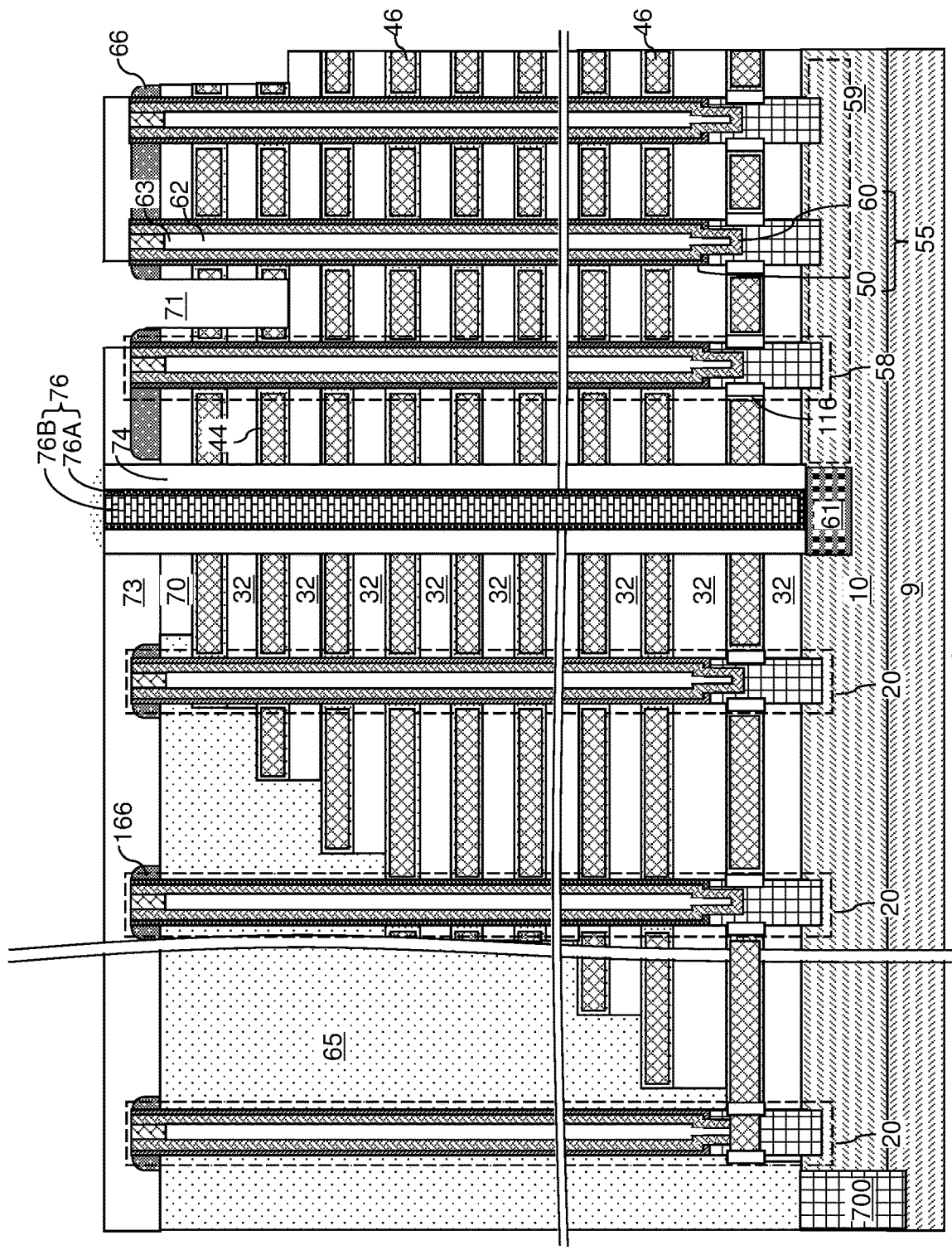
FIG. 24A is a schematic vertical cross-sectional view of the second exemplary structure after formation of drain-select-level isolation trenches according to the second embodiment of the present disclosure.
Figure 24B:
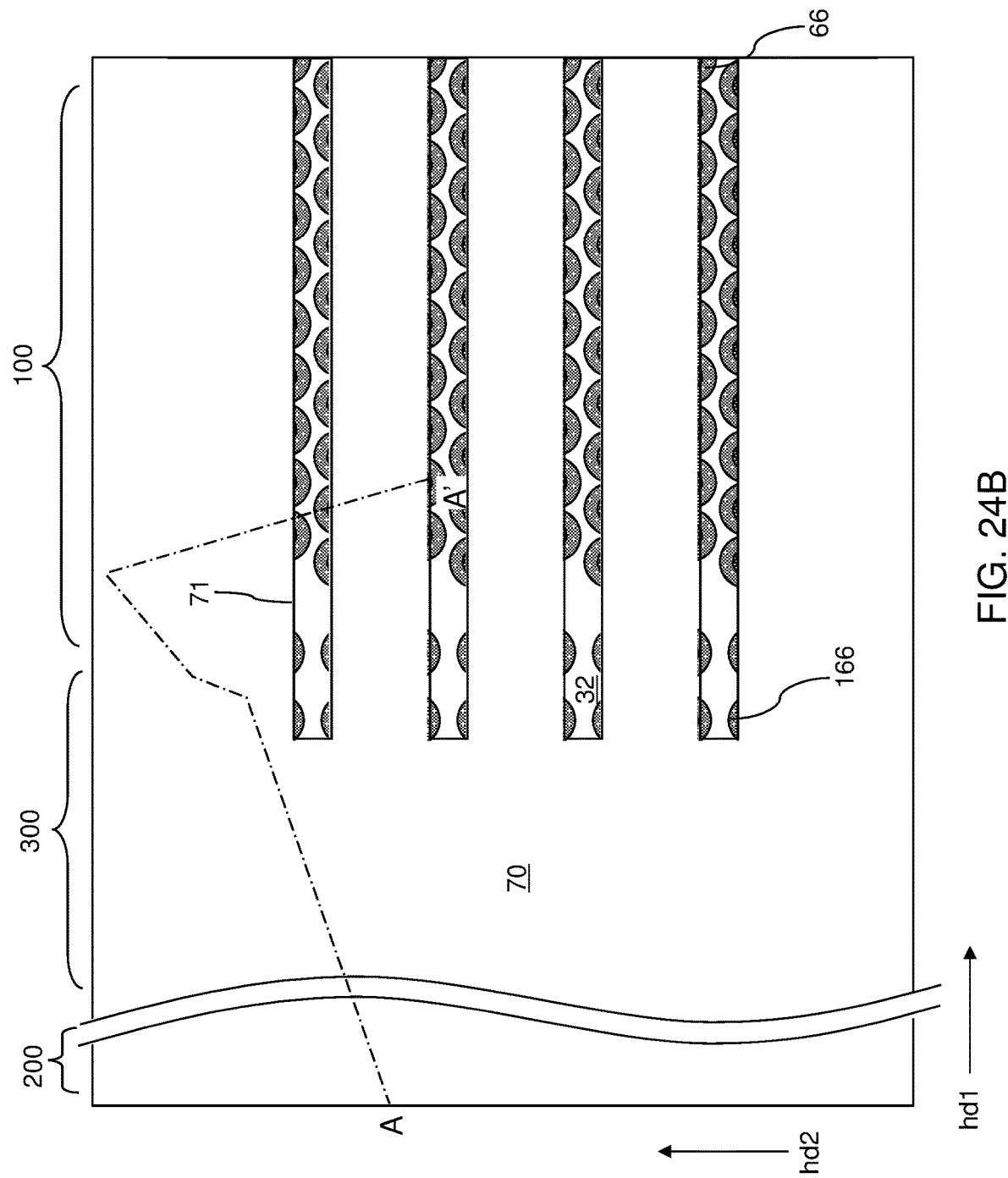
FIG. 24B is a top-down view of the second exemplary structure of FIG. 24A. The vertical plane A-A' is the plane of the cross-section for FIG. 24A.

Referring to FIGS. 24A and 24B, the processing steps of FIGS. 15A and 15B and the processing steps FIGS. 16A and 16B can be performed to form drain-select-level cavities 71, which can have the same geometrical features as in the first exemplary structure.

Figure 25A:
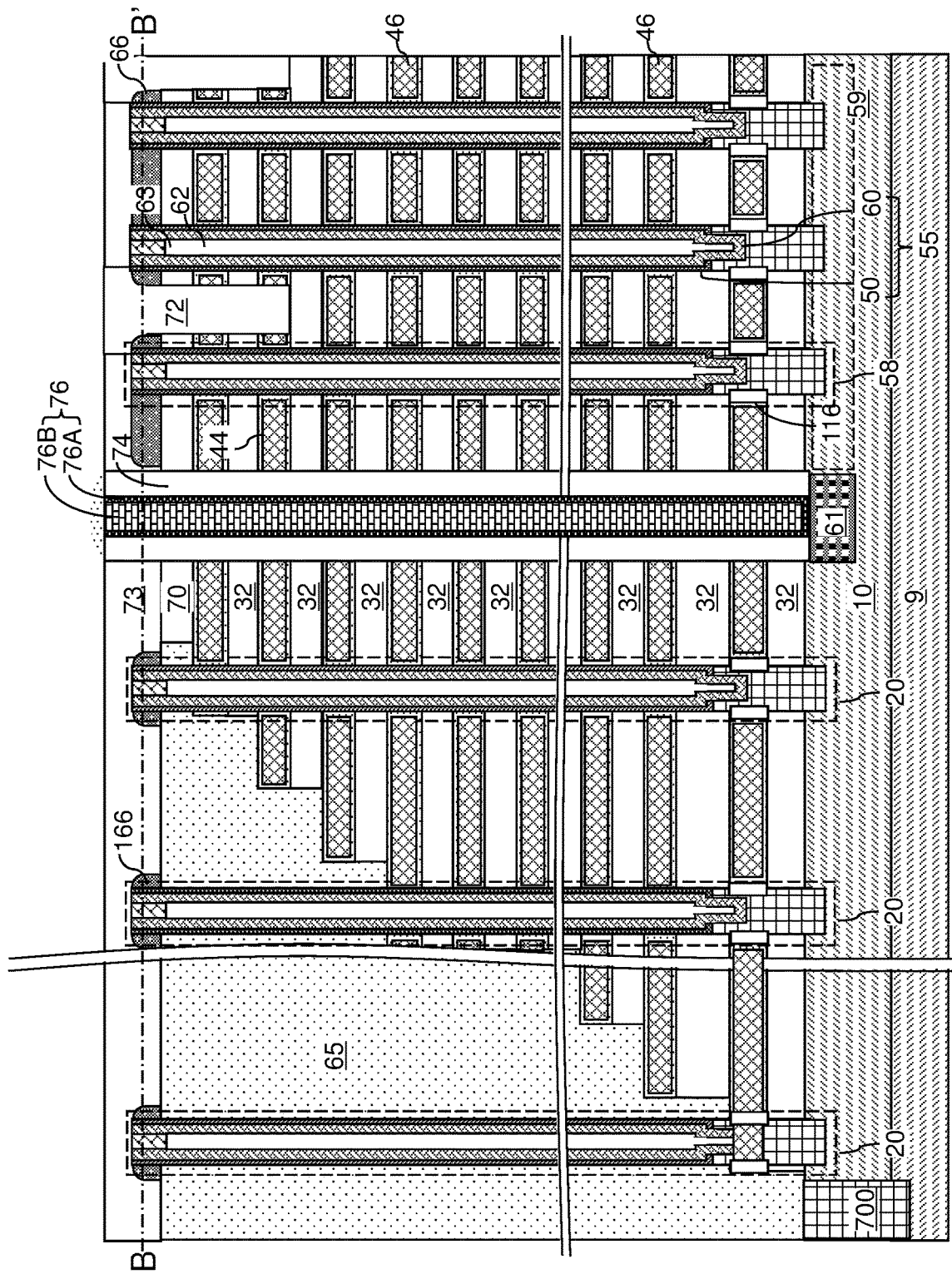
FIG. 25A is a schematic vertical cross-sectional view of the second exemplary structure after formation of drain-select-level isolation structures according to the second embodiment of the present disclosure.
Figure 25B:
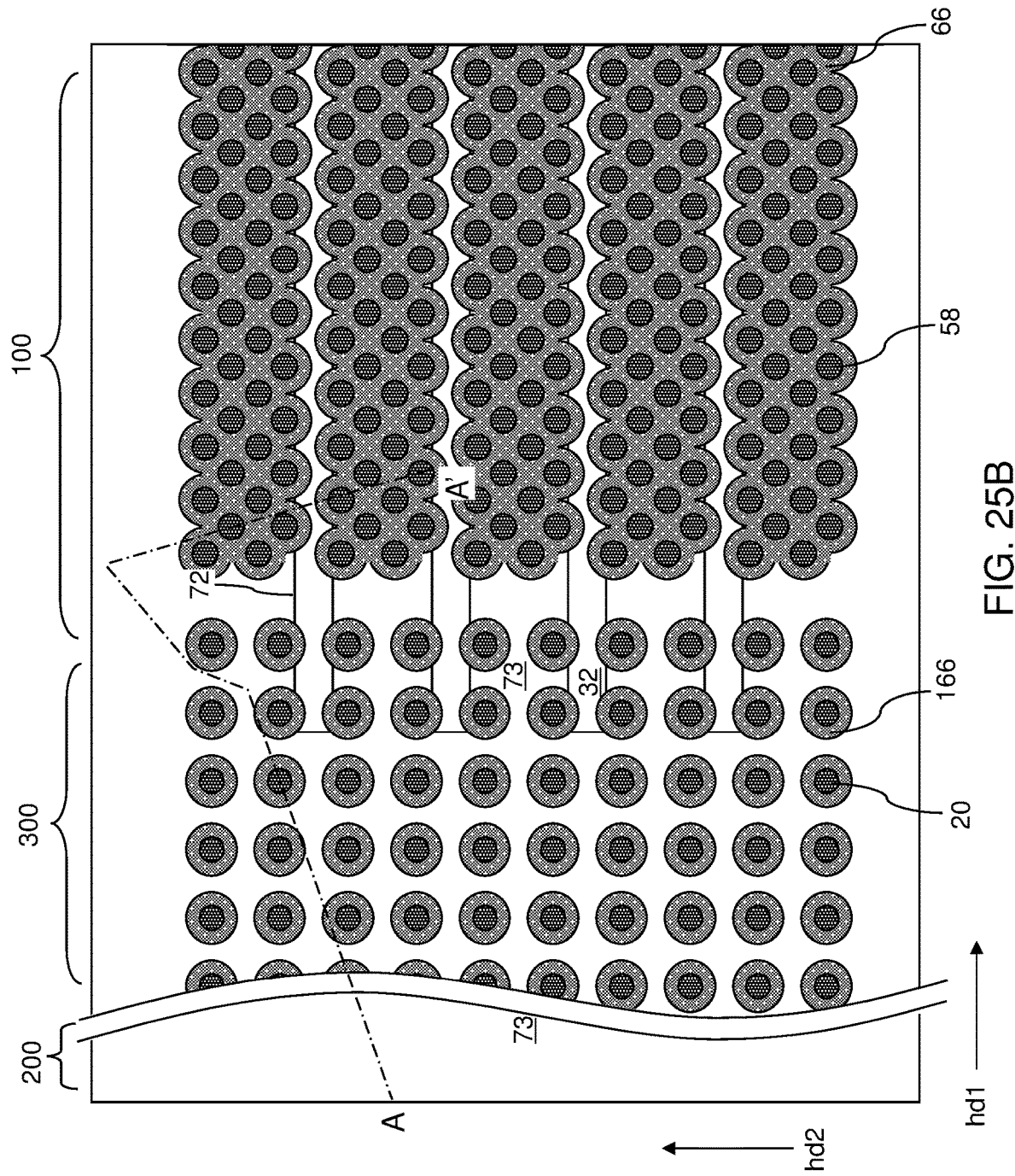
FIG. 25B is a horizontal cross-sectional view of the second exemplary structure along the horizontal plane B-B' of FIG. 25A. The vertical plane A-A' is the plane of the cross-section for FIG. 25A.

Referring to FIGS. 25A and 25B, the processing steps of FIGS. 17A and 17B can be performed to form drain-select-level isolation structures 72.

Figure 26:
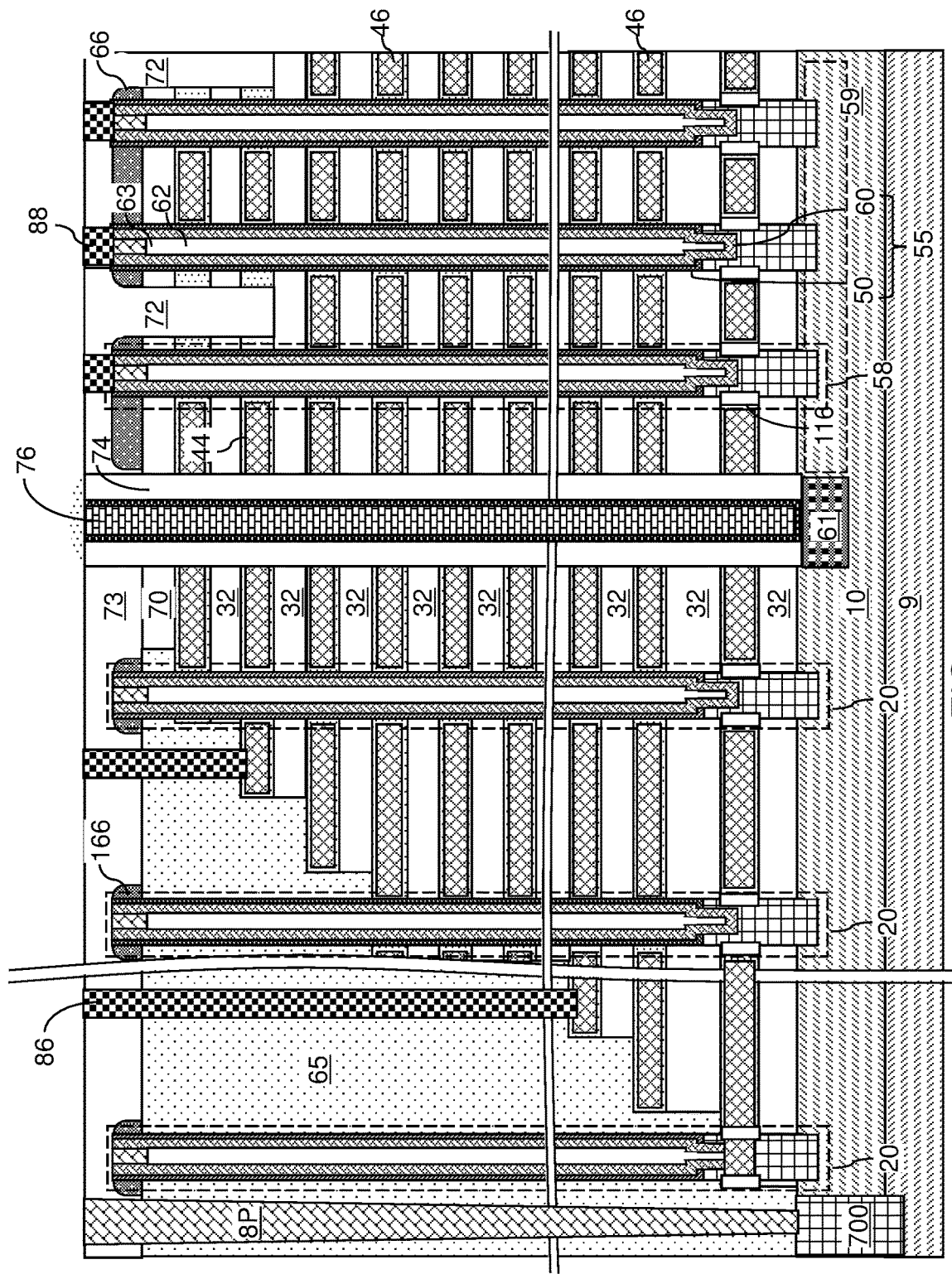
FIG. 26 is a schematic vertical cross-sectional view of the second exemplary structure after formation of additional contact via structures according to the second embodiment of the present disclosure.

Referring to FIG. 26, the processing steps of FIGS. 18A and 18B can be performed to form additional contact via structures (86, 88, 8P).

Referring to all drawings and according to various embodiments of the present disclosure, a three-dimensional memory device is provided, which comprises: an alternating stack of insulating layers 32 and electrically conductive layers 46; a plurality of arrays of memory openings 49 vertically extending through the alternating stack (32, 46); a plurality of arrays 68 of memory opening fill structures 58 located in the plurality of arrays of memory openings 49, wherein each of the memory opening fill structures 58 comprises a respective vertical stack of memory elements (such as portions of a memory material layer 54 located at levels of the electrically conductive layers 46), and each array of memory opening fill structures 58 comprises a respective set of rows of memory opening fill structures 58 that are arranged along a first horizontal direction hd1, and the plurality of arrays of memory opening fill structures 58 is laterally spaced apart from each other along a second horizontal direction hd2; a plurality of dielectric plates 66 laterally surrounding a respective array of memory opening fill structures 58, wherein each of the plurality of dielectric plates 66 has an outer sidewall that is laterally spaced from a most proximal memory opening fill structure 58 within a respective array of memory opening fill structures 58 by a lateral offset distance; and drain-select-level isolation structures 72 located between a respective neighboring pair of arrays of memory opening fill structures 58.

In one embodiment, the lateral offset distance comprises a uniform lateral offset distance, and each of the drain-select-level isolation structures 72 comprises a respective pair of lengthwise sidewalls that are vertically coincident with a subset of sidewall segments of a respective neighboring pair of dielectric plates 66 of the plurality of dielectric plates 66.

In one embodiment, each of the drain-select-level isolation structures 72 comprises a pair of straight sidewalls that laterally extend along the first horizontal direction hd1; and each straight sidewall in the pair of straight sidewalls contacts a top surface of a respective one of the plurality of dielectric plates 66.

In one embodiment, the three-dimensional memory device comprises a contact-level dielectric layer 73 overlying the plurality of dielectric plates 66, wherein top surfaces of the drain-select-level isolation structures 72 are located within a same horizontal plane as a top surface of the contact-level dielectric layer 73.

In one embodiment, bottom surfaces of the plurality of dielectric plates 66 are located within a same horizontal plane as a bottom surface of the contact-level dielectric layer 73.

In one embodiment, each of the memory opening fill structures 58 comprises a memory film 50 having an outer sidewall in contact with a respective one of the dielectric plates 66, a respective vertical semiconductor channel 60 and a respective drain region 63 located over the respective vertical semiconductor channel.

In one embodiment, each of the drain-select-level isolation structures 72 vertically extends through a first subset of the electrically conductive layers 46 (e.g., drain-select-level electrically conductive layers that function as drain side select gate electrodes) that is located at drain select levels and does not extend into a second subset of the electrically conductive layers 46 that function as word lines and that is located at word line levels that underlie the drain select levels.

In one embodiment, the subset of sidewall segments of the respective neighboring pair of dielectric plates 66 of the plurality of dielectric plates 66 comprises: a first lengthwise sidewall that comprises a contiguous set of multiple vertically straight and laterally convex sidewall segments of one of the respective neighboring pair of dielectric plates 66; and a second lengthwise sidewall that comprises a contiguous set of multiple vertically straight and laterally convex sidewall segments of another of the respective neighboring pair of dielectric plates 66.

In one embodiment, each of the drain-select-level isolation structures 72 comprises a respective pair of laterally undulating lengthwise sidewalls including a respective contiguous set of vertically straight and laterally concave sidewall segments that are adjoined to each other.

In one embodiment, each of the respective pair of laterally undulating lengthwise sidewalls comprises: an upper surface portion contacting a laterally-undulating lengthwise sidewall of one of the plurality of dielectric plates 66; and a lower surface portion contacting at least one laterally-undulating lengthwise sidewall of one or more of the insulating layers 32. The upper surface portion and the lower surface portion can be vertically coincident with each other, i.e., can be located within a same vertical plane that follows the lateral undulation of each laterally undulating lengthwise sidewall in a plan view, i.e., a view along a vertical direction such as a top-down view.

In one embodiment, each of the at least one laterally-undulating lengthwise sidewall of one or more of the insulating layers 32 comprises a respective contiguous set of vertically straight and laterally concave sidewall segments of a respective insulating layer that are adjoined to each other another. Each laterally-undulating lengthwise sidewall of one or more of the electrically conductive layers 46 that contacts a drain-select-level isolation structure 72 can comprise a respective contiguous set of vertically straight and laterally concave sidewall segments of a respective insulating layer that are adjoined to each other.

In one embodiment, each of the memory opening fill structures 58 comprises a respective dielectric cap structure 64 overlying the respective vertical stack of memory elements and contacting a top surface of a respective drain region 63. One or more of the dielectric cap structures 64 may have a tubular configuration in which an inner cylindrical sidewall is laterally spaced from an outer cylindrical sidewall. In one embodiment, each of the plurality of dielectric plates 66 contacts, and laterally surrounds, each dielectric cap structure 64 located within a respective array of memory opening fill structures 58 of the plurality of arrays of memory opening fill structures 58. In one embodiment, a total number of openings through each of the plurality of dielectric plates 66 can be the same as a total number of memory opening fill structures 58 within the respective array of memory opening fill structures 58.

In one embodiment, the three-dimensional memory device comprises: support pillar structures 20 vertically extending through a subset of layers within the alternating stack (32, 46); and discrete annular dielectric spacers 166 laterally surrounding a top end of a respective one of the support pillar structures 20, comprising a same dielectric material as the plurality of dielectric plates 55, and having a uniform lateral distance between an outer sidewall and an inner sidewall that is the same as the uniform lateral offset distance.

In one embodiment shown in FIG. 6B, each array 68 of the memory opening fill structures 58 comprises the respective set of rows of memory opening fill structures that are spaced apart from each other along the second horizontal direction hd2 by a first distance d1, and the plurality of arrays 68 of memory opening fill structures are laterally spaced apart from each other along the second horizontal direction hd2 by a second distance d2 greater than the first distance d1. In one embodiment, dummy memory opening fill structures are not located under the drain-select-level isolation structures 72.

In one embodiment, the three-dimensional memory device comprises: additional alternating stacks (32, 46) of additional insulating layers 32 and additional electrically conductive layers 46 that are laterally spaced apart from the alternating stack (32, 46) by a pair of line trenches (such as backside trenches 79) that laterally extend along the first horizontal direction hd1; and a pair of line trench fill structures (74, 76) comprising a respective dielectric material portion (such as an insulating spacer 74) contacting a sidewall of the alternating stack (32, 46) and a sidewall of one of the additional alternating stacks (32, 46). Additional memory opening fill structures 58 vertically extend through the additional alternating stacks (32, 46).

The drain-select-level isolation structures 72 of the embodiments of the present disclosure are self-aligned to a pair of adjacent row of memory opening fill structures 58 such that the lateral distance between the laterally-undulating lengthwise sidewalls of the drain-select-level isolation structures 72 are equidistant from the sidewalls of the pair of adjacent row of memory opening fill structures 58. Further, an upper portion of the drain-select-level isolation structures 72 comprise a pair of straight sidewalls that overlie a pair of dielectric plates 66 and adjoined to a lower portion of the drain-select-level isolation structures 72 that has the laterally-undulating lengthwise sidewalls. The drain-select-level isolation structures 72 of embodiments of the present disclosure can provide effective electrical isolation between drain-select-level electrically conductive layers 46 that are laterally spaced apart by the drain-select-level isolation structures 72. The self-alignment feature of the drain-select-level isolation structures 72 provide compact and effective electrical isolation at the drain select levels (i.e., by preventing short circuits between the drain side select gate electrodes and the drain contact via structures 88) while minimizing the total area employed to provide electrical isolation.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
    an alternating stack of insulating layers and electrically conductive layers;
    a plurality of arrays of memory openings vertically extending through the alternating stack;
    a plurality of arrays of memory opening fill structures located in the plurality of arrays of memory openings, wherein each of the memory opening fill structures comprises a respective vertical stack of memory elements, and each array of memory opening fill structures comprises a respective set of rows of memory opening fill structures that are arranged along a first horizontal direction, and the plurality of arrays of memory opening fill structures are laterally spaced apart from each other along a second horizontal direction;
    a plurality of dielectric plates laterally surrounding a respective array of memory opening fill structures, wherein each of the plurality of dielectric plates has an outer sidewall that is laterally spaced from a most proximal memory opening fill structure within a respective array of memory opening fill structures by a lateral offset distance;
    drain-select-level isolation structures located between a respective neighboring pair of arrays of memory opening fill structures; and
    a contact-level dielectric layer overlying the plurality of dielectric plates, wherein top surfaces of the drain-select-level isolation structures are located within a same horizontal plane as a top surface of the contact-level dielectric layer,
    wherein:
        the lateral offset distance comprises a uniform lateral offset distance;
        each of the drain-select-level isolation structures comprises a respective pair of lengthwise sidewalls that are vertically coincident with a subset of sidewall segments of a respective neighboring pair of dielectric plates of the plurality of dielectric plates;

each of the drain-select-level isolation structures comprises a pair of straight sidewalls that laterally extend along the first horizontal direction; and each straight sidewall in the pair of straight sidewalls contacts a top surface of a respective one of the plurality of dielectric plates.

2. The three-dimensional memory device of claim 1, wherein:

bottom surfaces of the plurality of dielectric plates are located within a same horizontal plane as a bottom surface of the contact-level dielectric layer; and each of the memory opening fill structures comprises a memory film having an outer sidewall in contact with a respective one of the dielectric plates, a respective vertical semiconductor channel and a respective drain region located over the respective vertical semiconductor channel.

3. A three-dimensional memory device, comprising:

an alternating stack of insulating layers and electrically conductive layers;

a plurality of arrays of memory openings vertically extending through the alternating stack;

a plurality of arrays of memory opening fill structures located in the plurality of arrays of memory openings, wherein each of the memory opening fill structures comprises a respective vertical stack of memory elements, and each array of memory opening fill structures comprises a respective set of rows of memory opening fill structures that are arranged along a first horizontal direction, and the plurality of arrays of memory opening fill structures are laterally spaced apart from each other along a second horizontal direction;

a plurality of dielectric plates laterally surrounding a respective array of memory opening fill structures, wherein each of the plurality of dielectric plates has an outer sidewall that is laterally spaced from a most proximal memory opening fill structure within a respective array of memory opening fill structures by a lateral offset distance; and drain-select-level isolation structures located between a respective neighboring pair of arrays of memory opening fill structures, wherein:

the lateral offset distance comprises a uniform lateral offset distance;

each of the drain-select-level isolation structures comprises a respective pair of lengthwise sidewalls that are vertically coincident with a subset of sidewall segments of a respective neighboring pair of dielectric plates of the plurality of dielectric plates; and the subset of sidewall segments of the respective neighboring pair of dielectric plates of the plurality of dielectric plates comprises:

a first lengthwise sidewall that comprises a contiguous set of multiple vertically straight and laterally convex sidewall segments of one of the respective neighboring pair of dielectric plates; and a second lengthwise sidewall that comprises a contiguous set of multiple vertically straight and laterally convex sidewall segments of another of the respective neighboring pair of dielectric plates.

4. A three-dimensional memory device, comprising:

an alternating stack of insulating layers and electrically conductive layers;

a plurality of arrays of memory openings vertically extending through the alternating stack;

a plurality of arrays of memory opening fill structures located in the plurality of arrays of memory openings, wherein each of the memory opening fill structures comprises a respective vertical stack of memory elements, and each array of memory opening fill structures comprises a respective set of rows of memory opening fill structures that are arranged along a first horizontal direction, and the plurality of arrays of memory opening fill structures are laterally spaced apart from each other along a second horizontal direction;

a plurality of dielectric plates laterally surrounding a respective array of memory opening fill structures, wherein each of the plurality of dielectric plates has an outer sidewall that is laterally spaced from a most proximal memory opening fill structure within a respective array of memory opening fill structures by a lateral offset distance; and drain-select-level isolation structures located between a respective neighboring pair of arrays of memory opening fill structures, wherein each of the drain-select-level isolation structures comprises a respective pair of laterally undulating lengthwise sidewalls including a respective contiguous set of vertically straight and laterally concave sidewall segments that are adjoined to each other.

5. The three-dimensional memory device of claim 4, wherein each of the respective pair of laterally undulating lengthwise sidewalls comprises:

an upper surface portion contacting a laterally-undulating lengthwise sidewall of one of the plurality of dielectric plates; and a lower surface portion contacting at least one laterally-undulating lengthwise sidewall of one or more of the insulating layers.

6. The three-dimensional memory device of claim 4, wherein each of the at least one laterally-undulating lengthwise sidewall of one or more of the insulating layers comprises a respective contiguous set of vertically straight and laterally concave sidewall segments of a respective insulating layer that are adjoined to each other.

7. A three-dimensional memory device, comprising:

an alternating stack of insulating layers and electrically conductive layers;

a plurality of arrays of memory openings vertically extending through the alternating stack;

a plurality of arrays of memory opening fill structures located in the plurality of arrays of memory openings, wherein each of the memory opening fill structures comprises a respective vertical stack of memory elements, and each array of memory opening fill structures comprises a respective set of rows of memory opening fill structures that are arranged along a first horizontal direction, and the plurality of arrays of memory opening fill structures are laterally spaced apart from each other along a second horizontal direction;

a plurality of dielectric plates laterally surrounding a respective array of memory opening fill structures, wherein each of the plurality of dielectric plates has an outer sidewall that is laterally spaced from a most proximal memory opening fill structure within a respective array of memory opening fill structures by a lateral offset distance; and drain-select-level isolation structures located between a respective neighboring pair of arrays of memory opening fill structures, wherein:
each of the memory opening fill structures comprises a respective dielectric cap structure overlying the respective vertical stack of memory elements;
each of the plurality of dielectric plates contacts and laterally surrounds each dielectric cap structure located within a respective array of memory opening fill structures of the plurality of arrays of memory opening fill structures; and
a total number of openings through each of the plurality of dielectric plates is the same as a total number of memory opening fill structures within the respective array of memory opening fill structures.

8. A three-dimensional memory device, comprising:
an alternating stack of insulating layers and electrically conductive layers;
a plurality of arrays of memory openings vertically extending through the alternating stack;
a plurality of arrays of memory opening fill structures located in the plurality of arrays of memory openings, wherein each of the memory opening fill structures comprises a respective vertical stack of memory elements, and each array of memory opening fill structures comprises a respective set of rows of memory opening fill structures that are arranged along a first horizontal direction, and the plurality of arrays of memory opening fill structures are laterally spaced apart from each other along a second horizontal direction;
a plurality of dielectric plates laterally surrounding a respective arra of memory opening fill structures, wherein each of the plurality of dielectric plates has an outer sidewall that is laterally spaced from a most proximal memory opening fill structure within a respective array of memory opening fill structures by a lateral offset distance;
drain-select-level isolation structures located between a respective neighboring pair of arrays of memory opening fill structures;
support pillar structures vertically extending through a subset of layers within the alternating stack; and
discrete annular dielectric spacers laterally surrounding a top end of a respective one of the support pillar structures, comprising a same dielectric material as the plurality of dielectric plates, and having a uniform lateral distance between an outer sidewall and an inner sidewall that is the same as the uniform lateral offset distance.

9. A three-dimensional memory device, comprising:
an alternating stack of insulating layers and electrically conductive layers;
a plurality of arrays of memory openings vertically extending through the alternating stack;
a plurality of arrays of memory opening fill structures located in the plurality of arrays of memory openings, wherein each of the memory opening fill structures comprises a respective vertical stack of memory elements, and each array of memory opening fill structures comprises a respective set of rows of memory opening fill structures that are arranged along a first horizontal direction, and the plurality of arrays of memory opening fill structures are laterally spaced apart from each other along a second horizontal direction;
a plurality of dielectric plates laterally surrounding a respective array of memory opening fill structures, wherein each of the plurality of dielectric plates has an outer sidewall that is laterally spaced from a most proximal memory opening fill structure within a respective array of memory opening fill structures bar a lateral offset distance;
drain-select-level isolation structures located between a respective neighboring pair of arrays of memory opening fill structures;
additional alternating stacks of additional insulating layers and additional electrically conductive layers that are laterally spaced apart from the alternating stack by a pair of line trenches that laterally extend along the first horizontal direction; and
a pair of line trench fill structures comprising a respective dielectric material portion contacting a sidewall of the alternating stack and a sidewall of one of the additional alternating stacks,
wherein additional memory opening fill structures vertically extend through the additional alternating stacks.

* * * * *